US012198767B2

(12) United States Patent
Sugahara et al.

(10) Patent No.: US 12,198,767 B2
(45) Date of Patent: Jan. 14, 2025

(54) SEMICONDUCTOR MEMORY DEVICE

(71) Applicant: Kioxia Corporation, Tokyo (JP)

(72) Inventors: Akio Sugahara, Yokohama Kanagawa (JP); Akihiro Imamoto, Kawasaki Kanagawa (JP); Toshifumi Watanabe, Yokohama Kanagawa (JP); Mami Kakoi, Yokohama Kanagawa (JP); Kohei Masuda, Yokohama Kanagawa (JP); Masahiro Yoshihara, Yokohama Kanagawa (JP); Naofumi Abiko, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/243,258

(22) Filed: Sep. 7, 2023

(65) Prior Publication Data
US 2023/0420054 A1  Dec. 28, 2023

Related U.S. Application Data

(63) Continuation of application No. 17/973,549, filed on Oct. 26, 2022, now Pat. No. 11,783,899, which is a
(Continued)

(51) Int. Cl.
*G11C 16/14* (2006.01)
*G11C 16/26* (2006.01)
(Continued)

(52) U.S. Cl.
CPC .............. *G11C 16/14* (2013.01); *G11C 16/26* (2013.01); *G11C 16/30* (2013.01); *G11C 16/3445* (2013.01)

(58) Field of Classification Search
CPC ......... G11C 16/14; G11C 16/26; G11C 16/30; G11C 16/3445
(Continued)

(56) References Cited

U.S. PATENT DOCUMENTS 5,822,244 A    10/1998   Hansen et al.
7,009,892 B2    3/2006   Morikawa et al.
(Continued)

FOREIGN PATENT DOCUMENTS

JP    H11175391 A    7/1999
JP    2003233992 A    8/2003
(Continued)

OTHER PUBLICATIONS

International Search Report (ISR) (and English translation thereof) dated Jan. 22, 2019 issued in International Application No. PCT/JP2018/041195.

*Primary Examiner* — Huan Hoang
(74) *Attorney, Agent, or Firm* — Holtz, Holtz & Volek PC

(57) ABSTRACT

A semiconductor memory device according to an embodiment includes a plurality of planes each including a plurality of blocks each including a memory cell, an input/output circuit configured to receive a command set from an external controller, and a sequencer configured to execute an operation in response to the command set. Upon receiving a first command set that instructs execution of a first operation, the sequencer executes the first operation. Upon receiving a second command set that instructs execution of a second operation during execution of the first operation, the sequencer executes the second operation in parallel with the first operation. Upon receiving a third command set that instructs execution of a third operation during execution of the first operation, the sequencer suspends the first operation, executes the third operation, and resumes the first operation upon completion of the third operation.

15 Claims, 38 Drawing Sheets

Related U.S. Application Data continuation of application No. 17/200,996, filed on Mar. 15, 2021, now Pat. No. 11,532,363, which is a continuation of application No. PCT/JP2018/041195, filed on Nov. 6, 2018.

(51) Int. Cl.
  *G11C 16/30* (2006.01)
  *G11C 16/34* (2006.01)

(58) Field of Classification Search
  USPC .................................................. 365/185.29
  See application file for complete search history.

(56) References Cited

U.S. PATENT DOCUMENTS

| | | | |
|---|---|---|---|
| 7,099,226 | B2 | 8/2006 | Yuan et al. |
| 8,068,365 | B2 | 11/2011 | Kim |
| 10,249,377 | B2 | 4/2019 | Kasai et al. |
| 10,379,738 | B2 | 8/2019 | Rajwade et al. |
| 10,803,946 | B2 | 10/2020 | Imamoto |
| 10,860,250 | B2 | 12/2020 | Sugahara et al. |
| 11,532,363 | B2 | 12/2022 | Sugahara et al. |
| 11,783,899 | B2 * | 10/2023 | Sugahara ............... G11C 16/16 365/185.29 |
| 2003/0169630 | A1 | 9/2003 | Hosono et al. |
| 2005/0099857 | A1 | 5/2005 | Yuan et al. |
| 2007/0239926 | A1 | 10/2007 | Gyl et al. |
| 2009/0034334 | A1 | 2/2009 | Furuyama et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0019477 | A1 | 1/2011 | Hashimoto et al. |
| 2011/0284946 | A1 | 11/2011 | Kiyotoshi |
| 2012/0044764 | A1 | 2/2012 | Nakai et al. |
| 2012/0069663 | A1 | 3/2012 | Itagaki et al. |
| 2012/0092930 | A1 | 4/2012 | Yamamura et al. |
| 2013/0128675 | A1 | 5/2013 | Kim et al. |
| 2013/0286752 | A1 | 10/2013 | Michioka et al. |
| 2017/0262229 | A1 | 9/2017 | Ochi et al. |
| 2017/0285969 | A1 | 10/2017 | Madraswala et al. |
| 2018/0129445 | A1 | 5/2018 | Shin et al. |
| 2018/0137920 | A1 | 5/2018 | Song et al. |
| 2020/0202958 | A1 | 6/2020 | Sugahara et al. |
| 2021/0055887 | A1 | 2/2021 | Sugahara et al. |
| 2021/0158879 | A1 | 5/2021 | Sugahara et al. |
| 2021/0335398 | A1 | 10/2021 | Sugahara |

FOREIGN PATENT DOCUMENTS

| | | |
|---|---|---|
| JP | 2004348788 A | 12/2004 |
| JP | 2006286048 A | 10/2006 |
| JP | 2009032324 A | 2/2009 |
| JP | 2012043496 A | 3/2012 |
| JP | 2013109823 A | 6/2013 |
| JP | 5579621 B2 | 7/2014 |
| JP | 2017168160 A | 9/2017 |
| JP | 2018514892 A | 6/2018 |

* cited by examiner

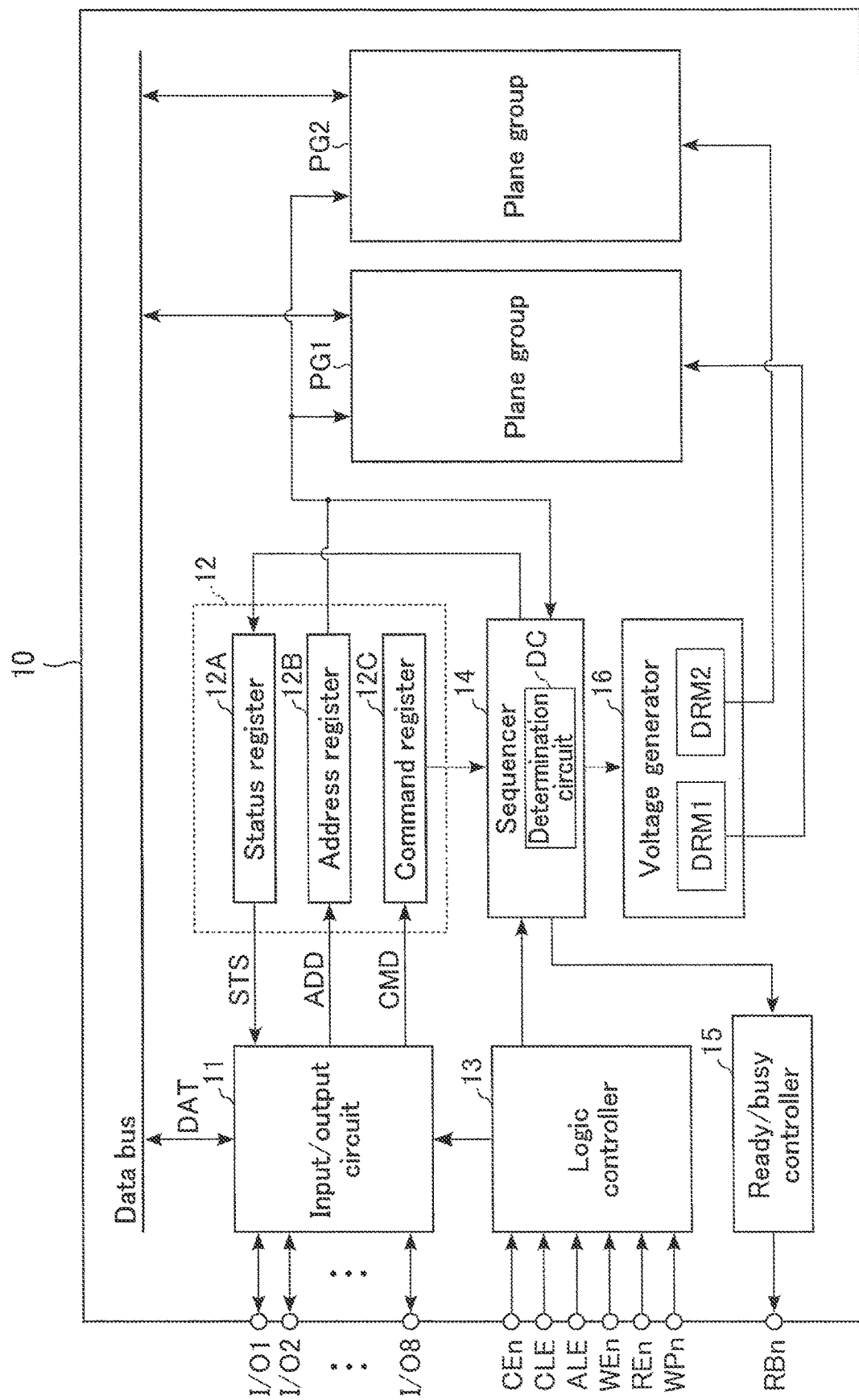
F I G. 1

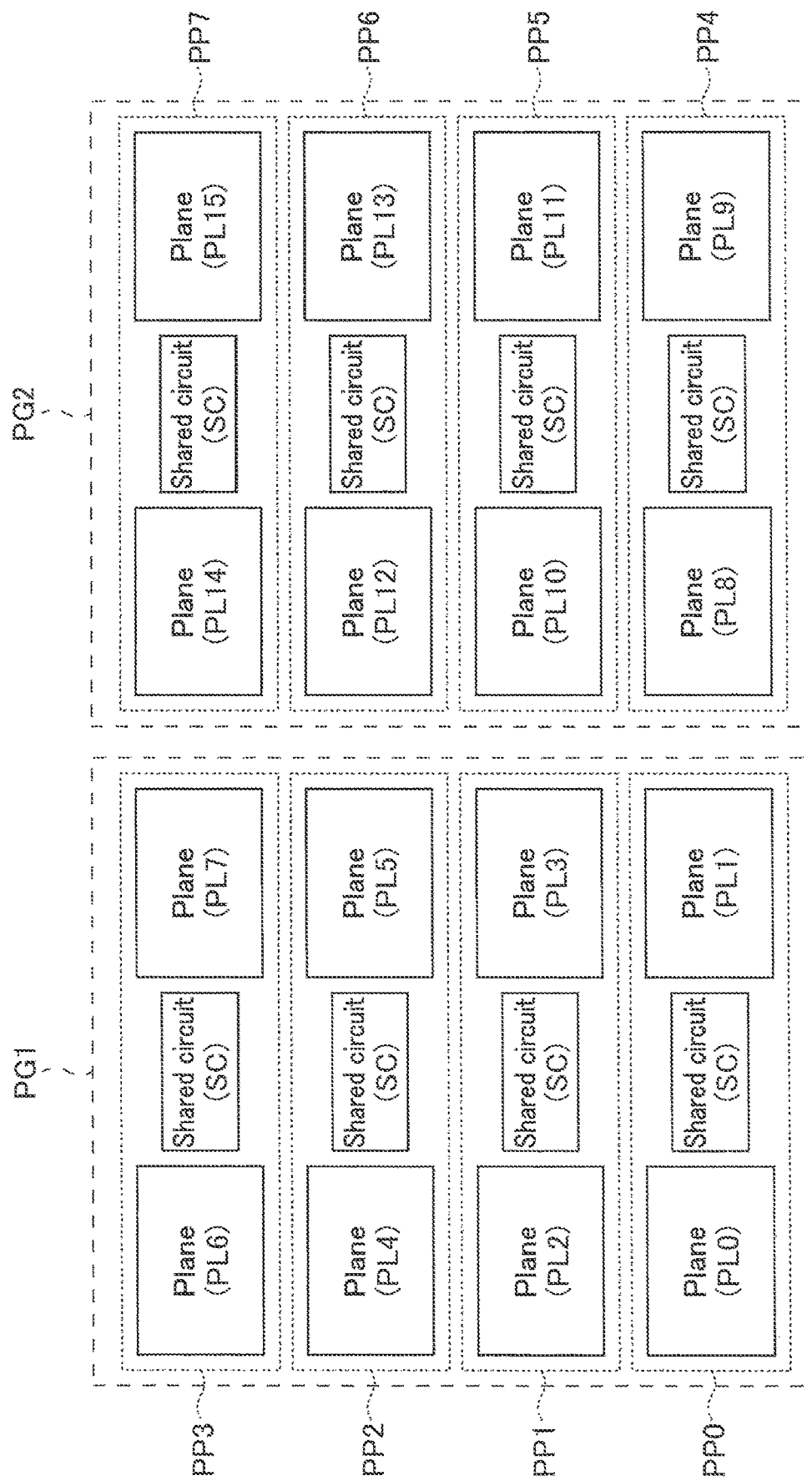
F I G. 2

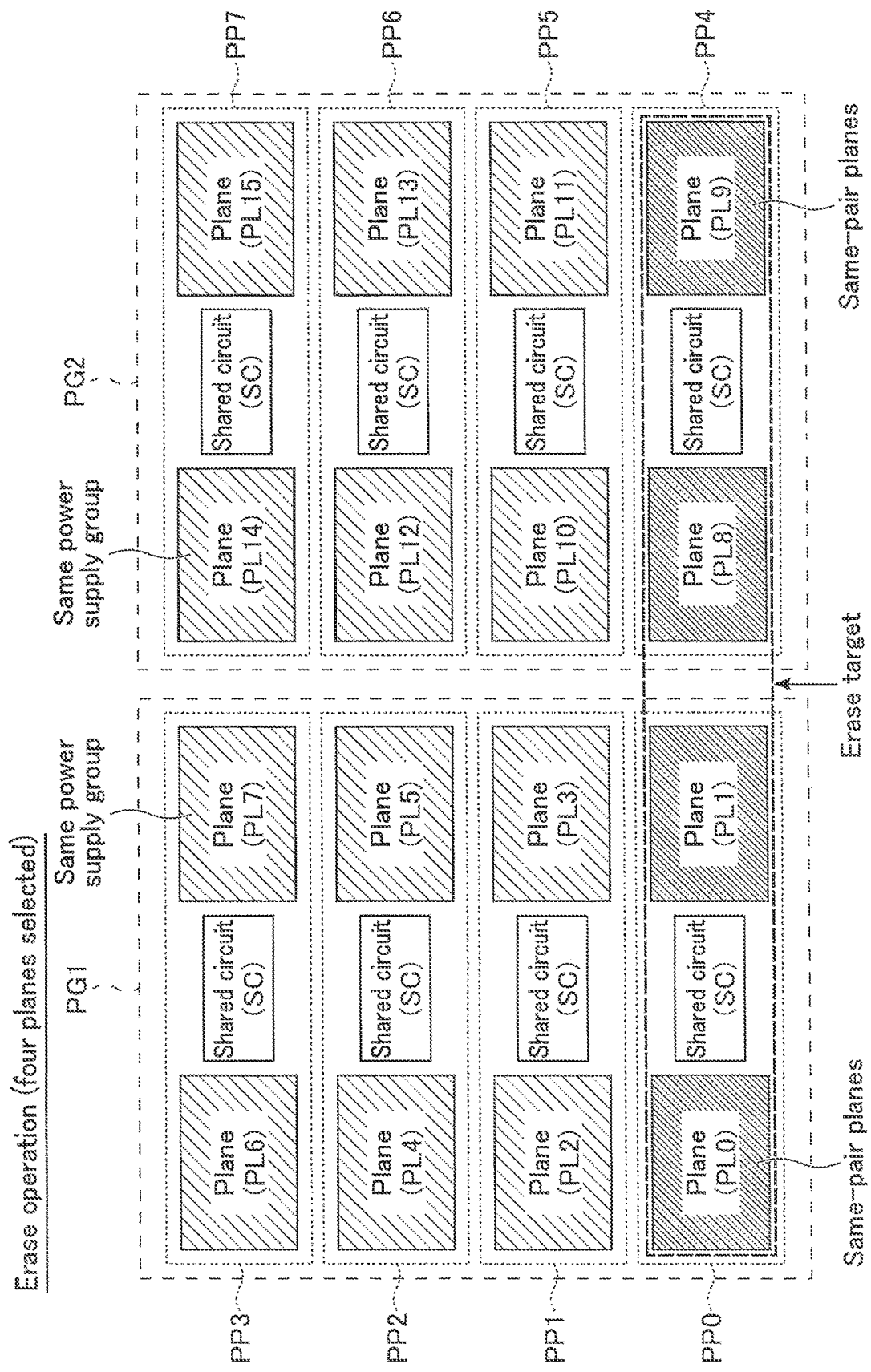
F I G. 15

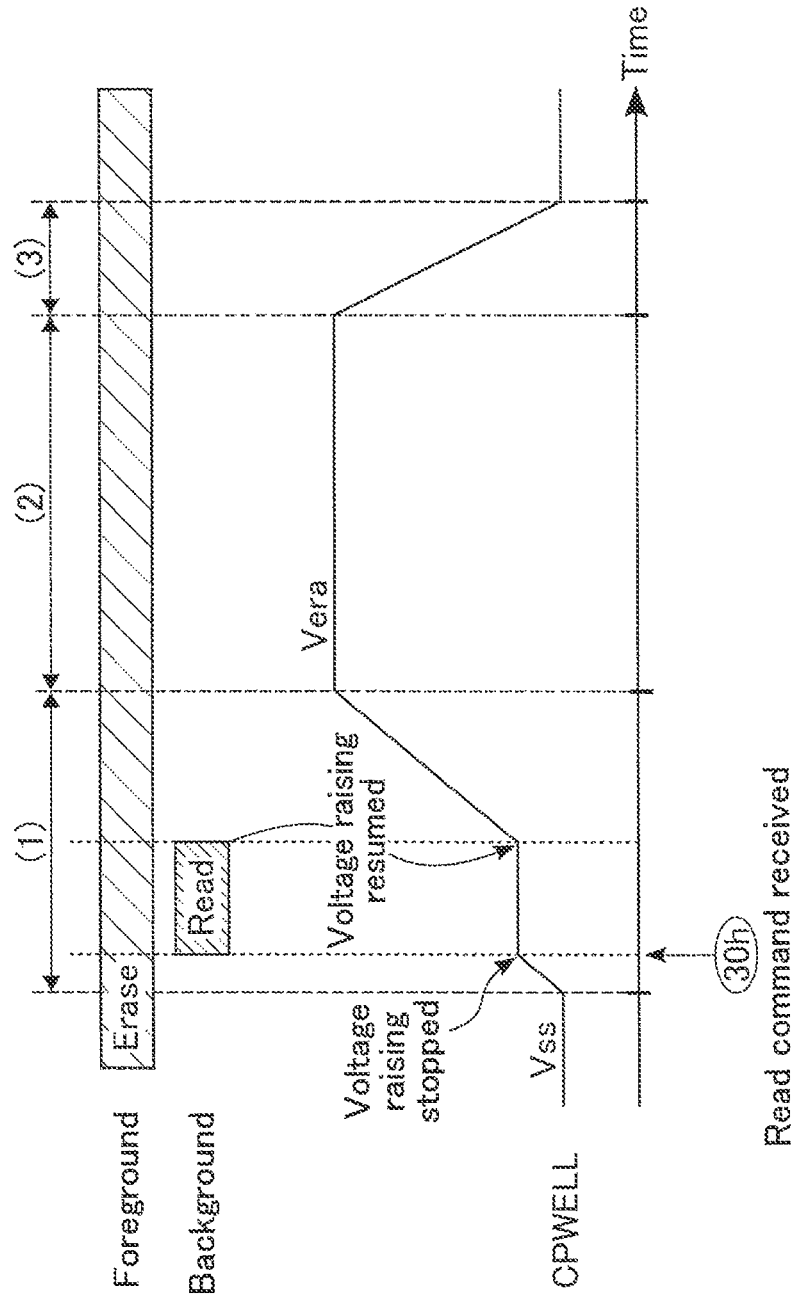
F I G. 18

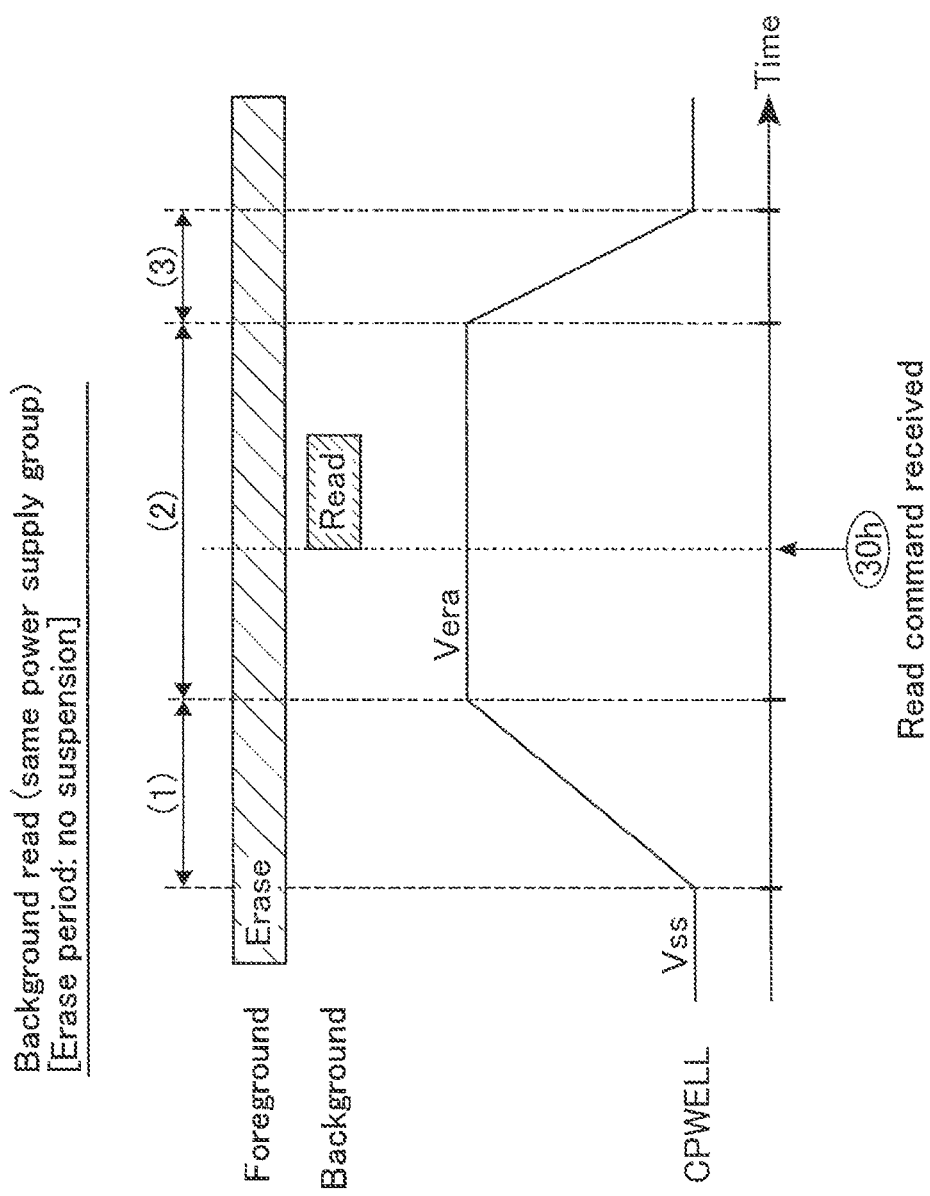
F I G. 20

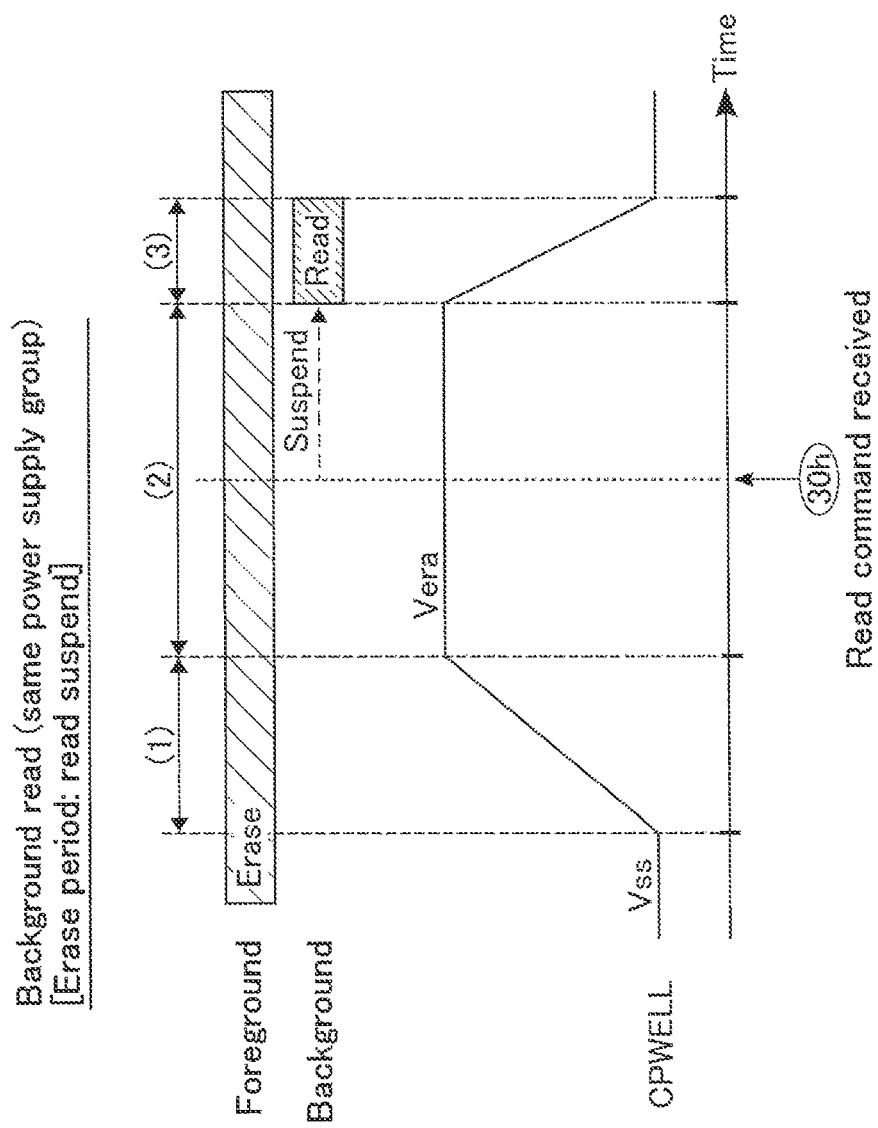
F I G. 21

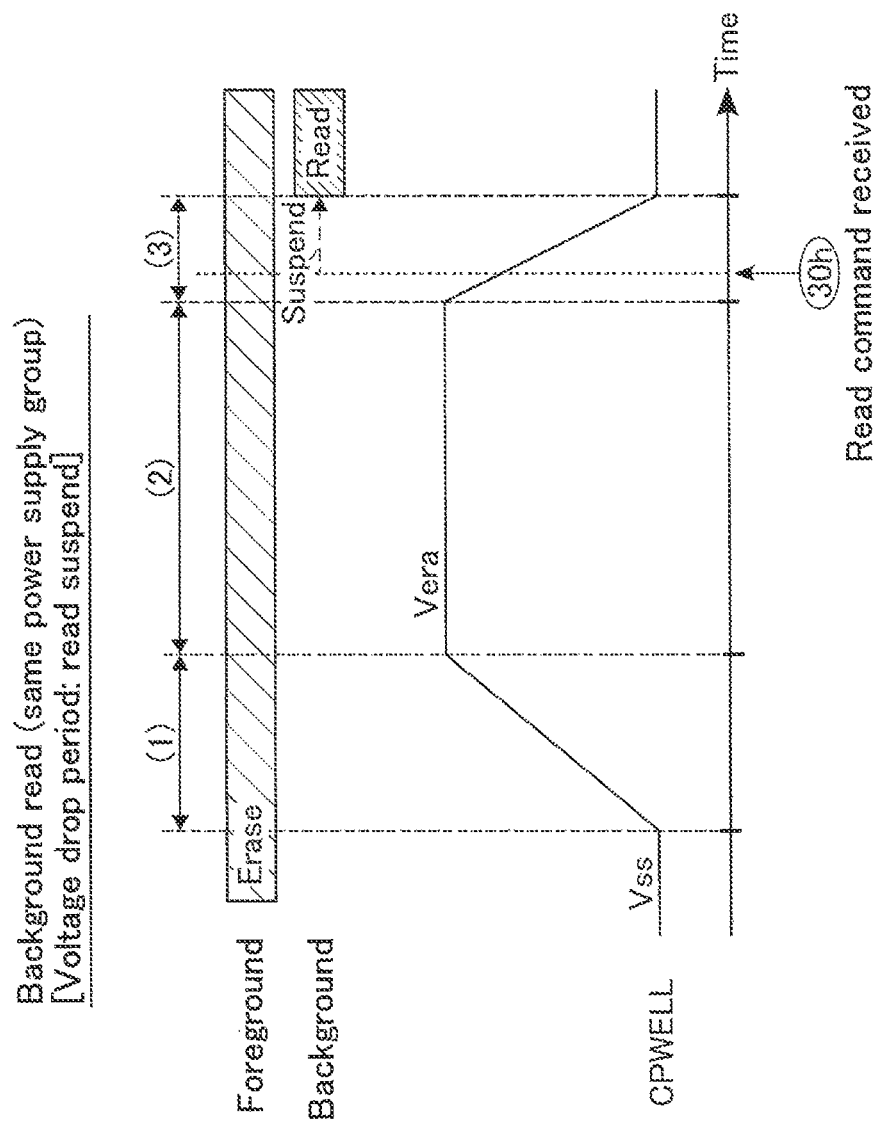
F I G. 23

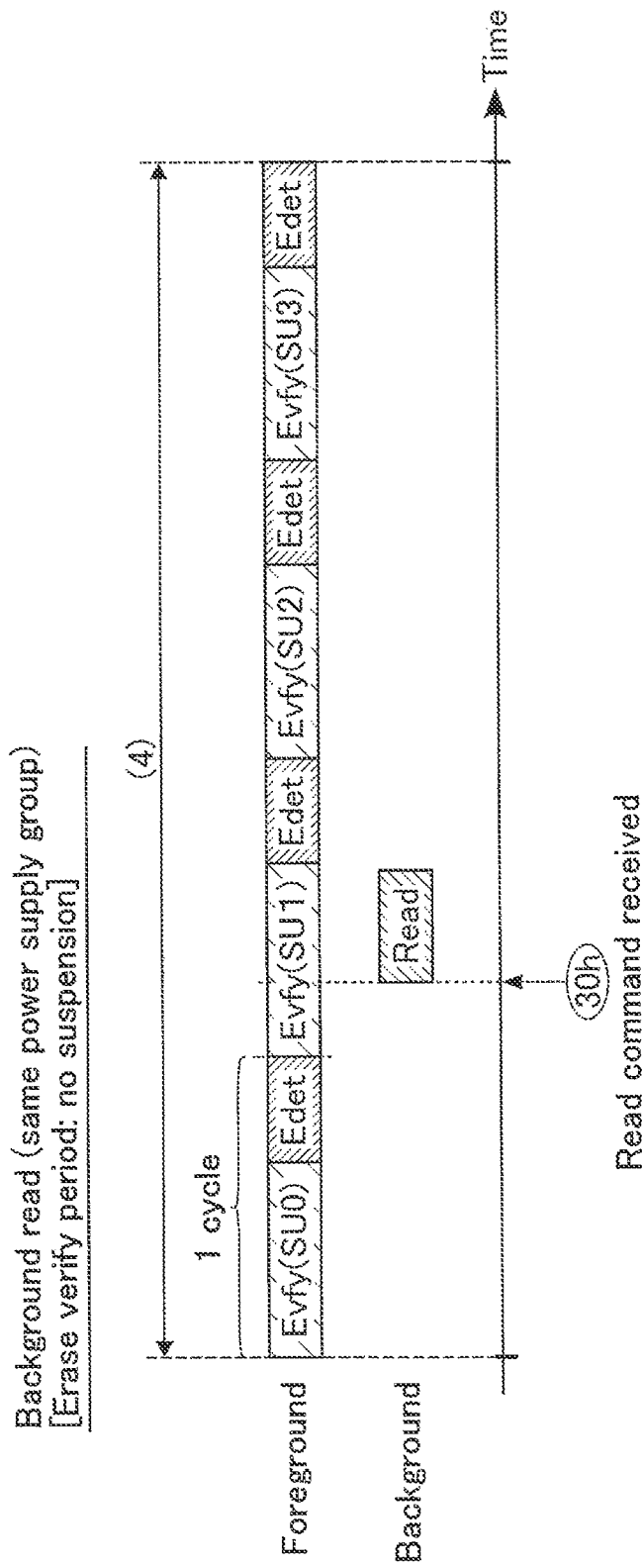
F I G. 24

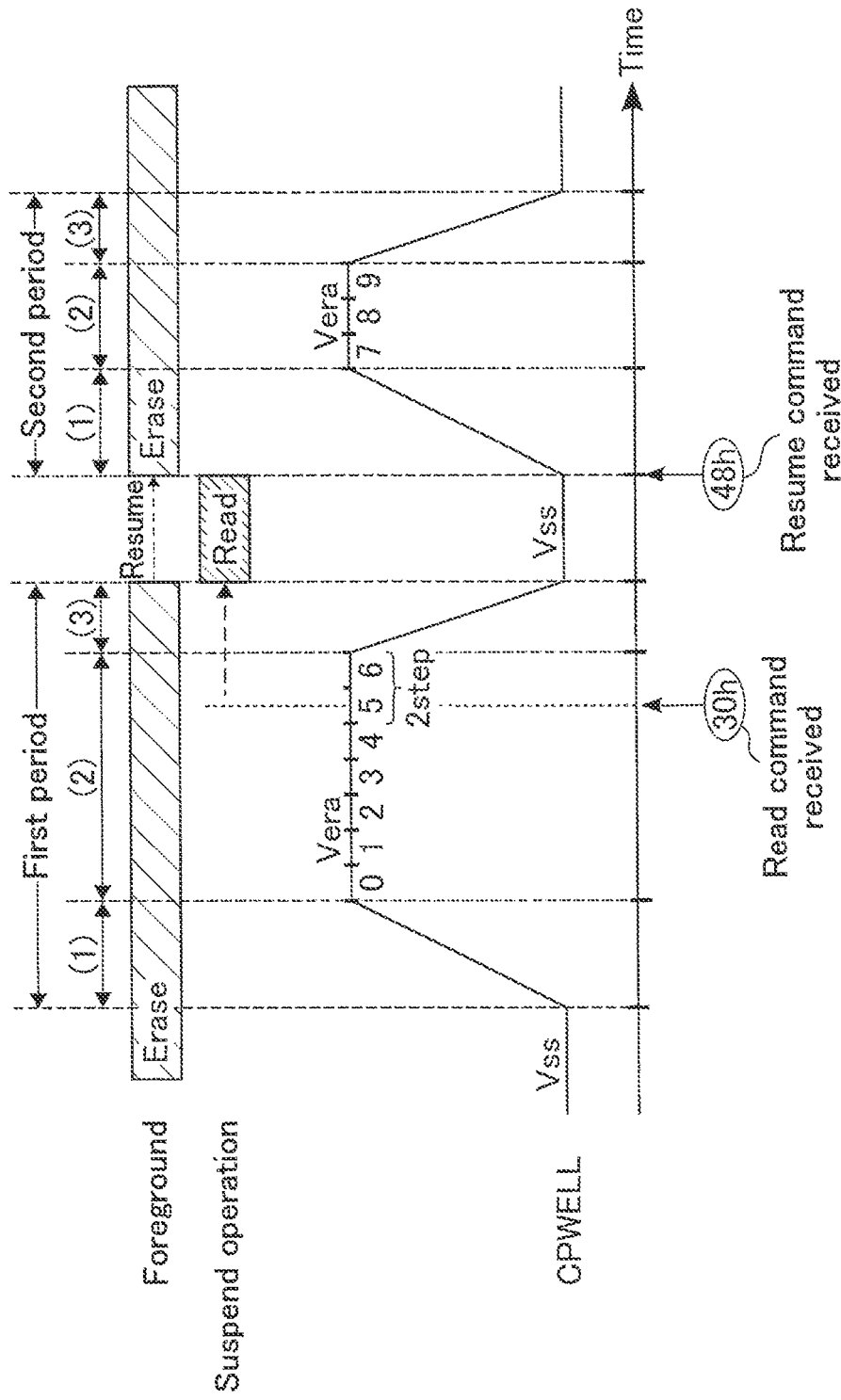
F I G. 31

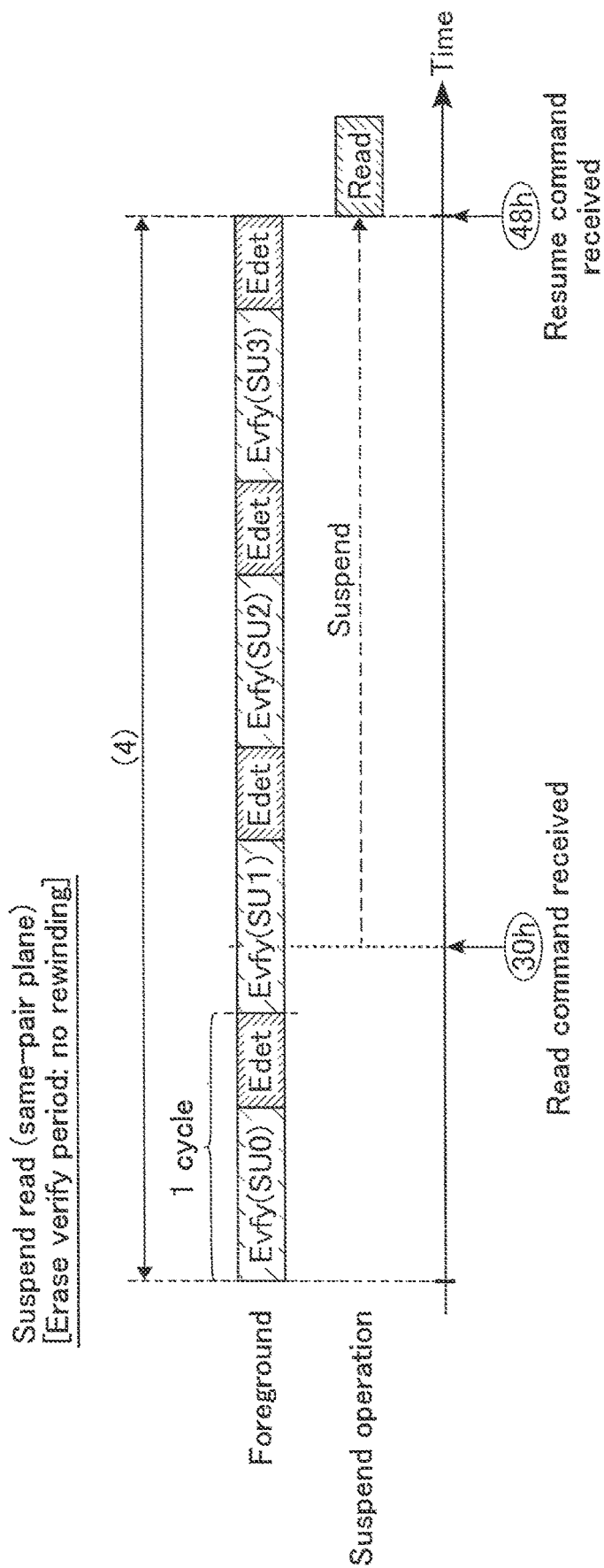
F I G. 32

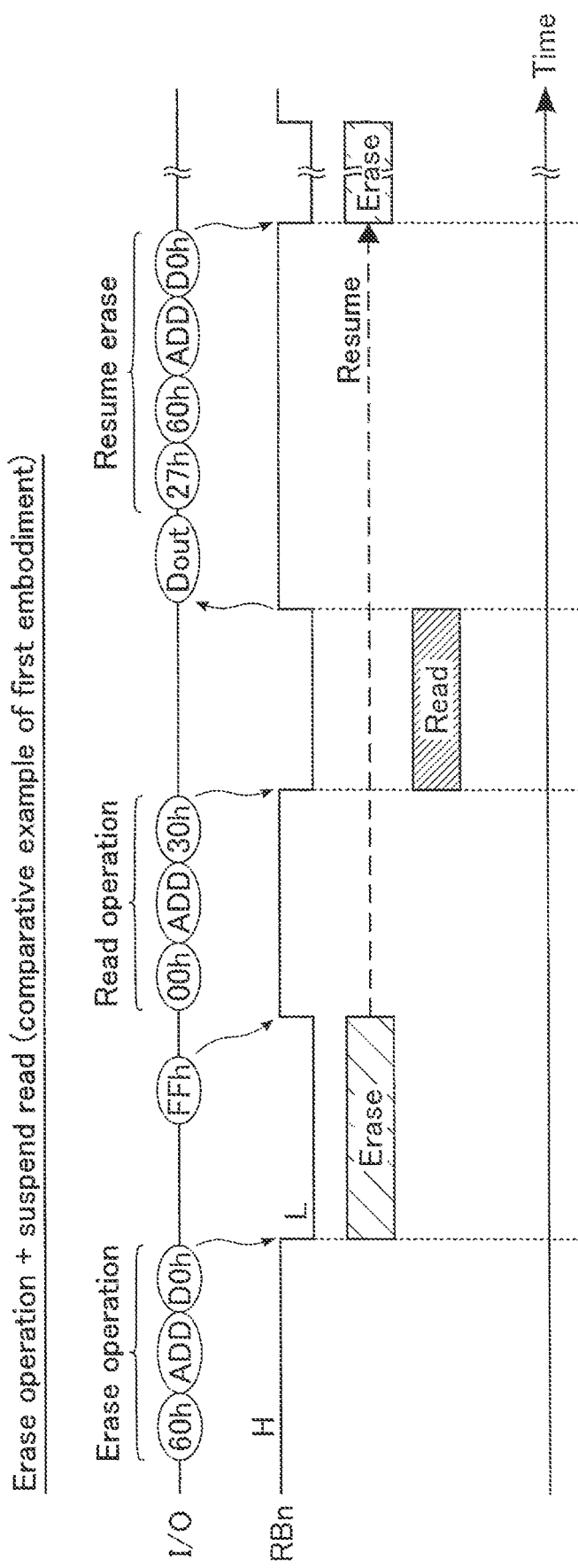
F I G. 34

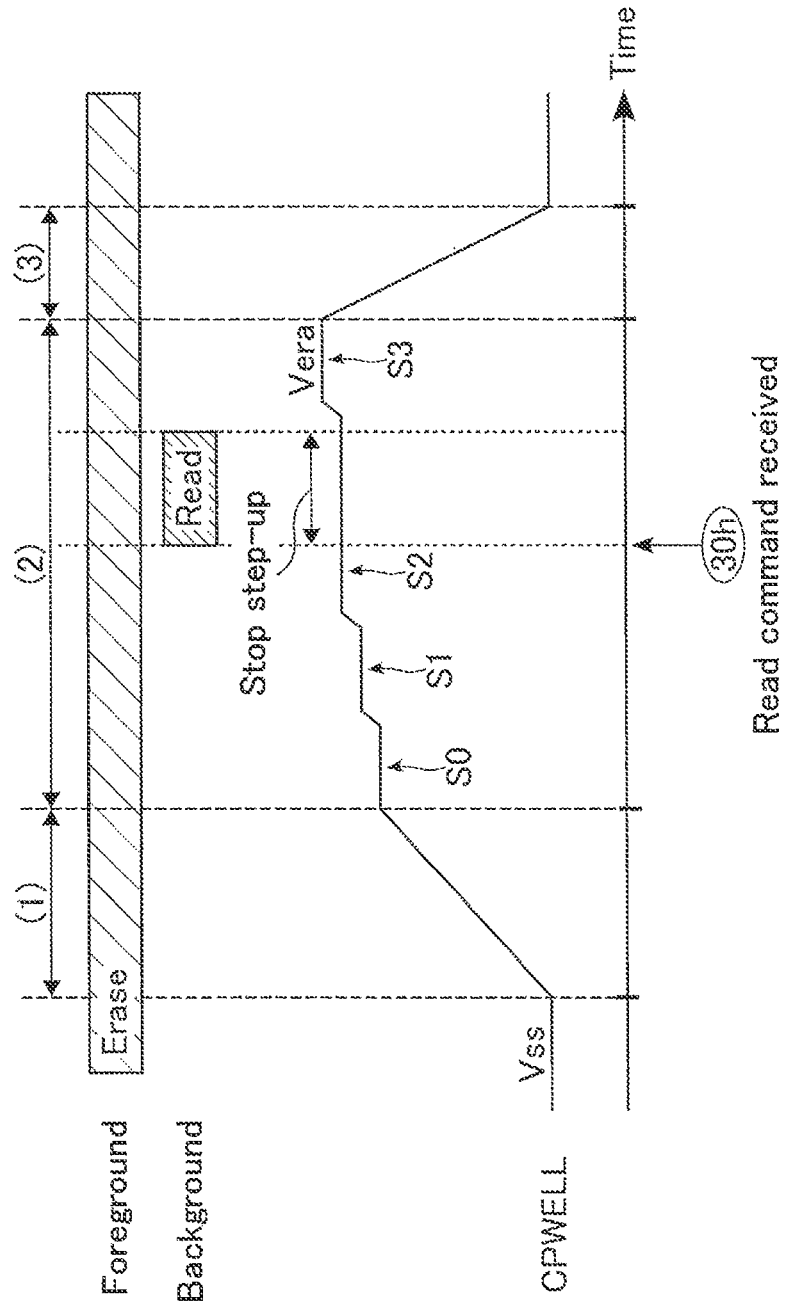
F I G. 36

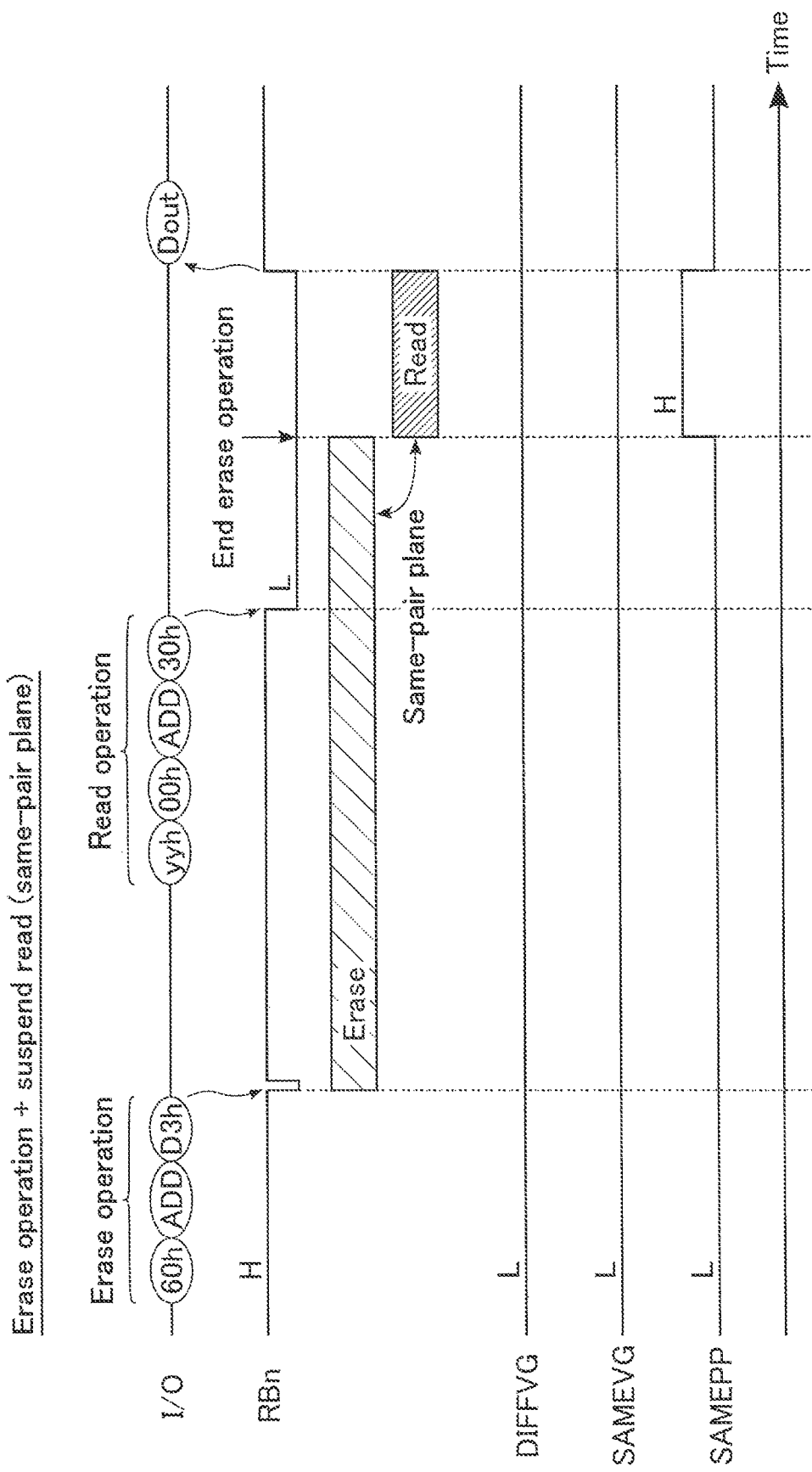
F I G. 38

SEMICONDUCTOR MEMORY DEVICE

CROSS-REFERENCE TO RELATED APPLICATIONS

This application is a Continuation Application of U.S. application Ser. No. 17/973,549, filed Oct. 26, 2022, and issued as U.S. Pat. No. 11,783,899 on Oct. 10, 2023, which is a Continuation Application of U.S. application Ser. No. 17/200,996, filed Mar. 15, 2021, and issued as U.S. Pat. No. 11,532,363 on Dec. 20, 2022, which is a Continuation Application of PCT Application No. PCT/JP2018/041195, filed Nov. 6, 2018, the entire contents of all of which are incorporated herein by reference.

FIELD

Embodiments described herein relate generally to a semiconductor memory device.

BACKGROUND

A NAND flash memory, capable of storing data in a non-volatile manner, is known.

BRIEF DESCRIPTION OF THE DRAWINGS

FIG. 1 is a block diagram showing a configuration example of a semiconductor memory device according to a first embodiment.

FIG. 2 is a block diagram showing a configuration example of plane groups included in the semiconductor memory device according to the first embodiment.

FIGS. 13, 14 and 15 are block diagrams showing an example of a relationship between a selected plane and other planes in an erase operation of the semiconductor memory device according to the first embodiment.

FIGS. 17, 18 and 19 are timing charts for illustrating an example of a more detailed execution timing of a background read in which a plane of the same power supply group is selected in the semiconductor memory device according to the first embodiment.

FIG. 20 is a timing chart for illustrating an example of a more detailed execution timing of a background read in which a plane of the same power supply group is selected in the semiconductor memory device according to the first embodiment.

FIG. 21 is a timing chart for illustrating an example of a more detailed execution timing of a background read in which a plane of the same power supply group is selected in the semiconductor memory device according to the first embodiment.

FIG. 23 is a timing chart for illustrating an example of a more detailed execution timing of a background read in which a plane of the same power supply group is selected in the semiconductor memory device according to the first embodiment.

FIG. 24 is a timing chart for illustrating an example of a more detailed execution timing of a background read in which a plane of the same power supply group is selected in the semiconductor memory device according to the first embodiment.

FIGS. 28, 29, 30 and 31 are timing charts for illustrating an example of a more detailed execution timing of a suspend read in which a same-pair plane is selected in the semiconductor memory device according to the first embodiment.

FIG. 32 is a timing chart for illustrating an example of a more detailed execution timing of a suspend read in which a same-pair plane is selected in the semiconductor memory device according to the first embodiment.

FIG. 34 is a command sequence and a timing chart for illustrating an erase operation and a suspend read according to a comparative example of the first embodiment.

FIG. 36 is a timing chart for illustrating an example of a more detailed execution timing of a background read in which a plane of a same power supply group is selected in the semiconductor memory device according to the second embodiment.

FIG. 38 is a command sequence and a timing chart for illustrating an erase operation and a suspend read in which a same-pair plane is selected in the semiconductor memory device according to the third embodiment.

DETAILED DESCRIPTION

Figure 3:
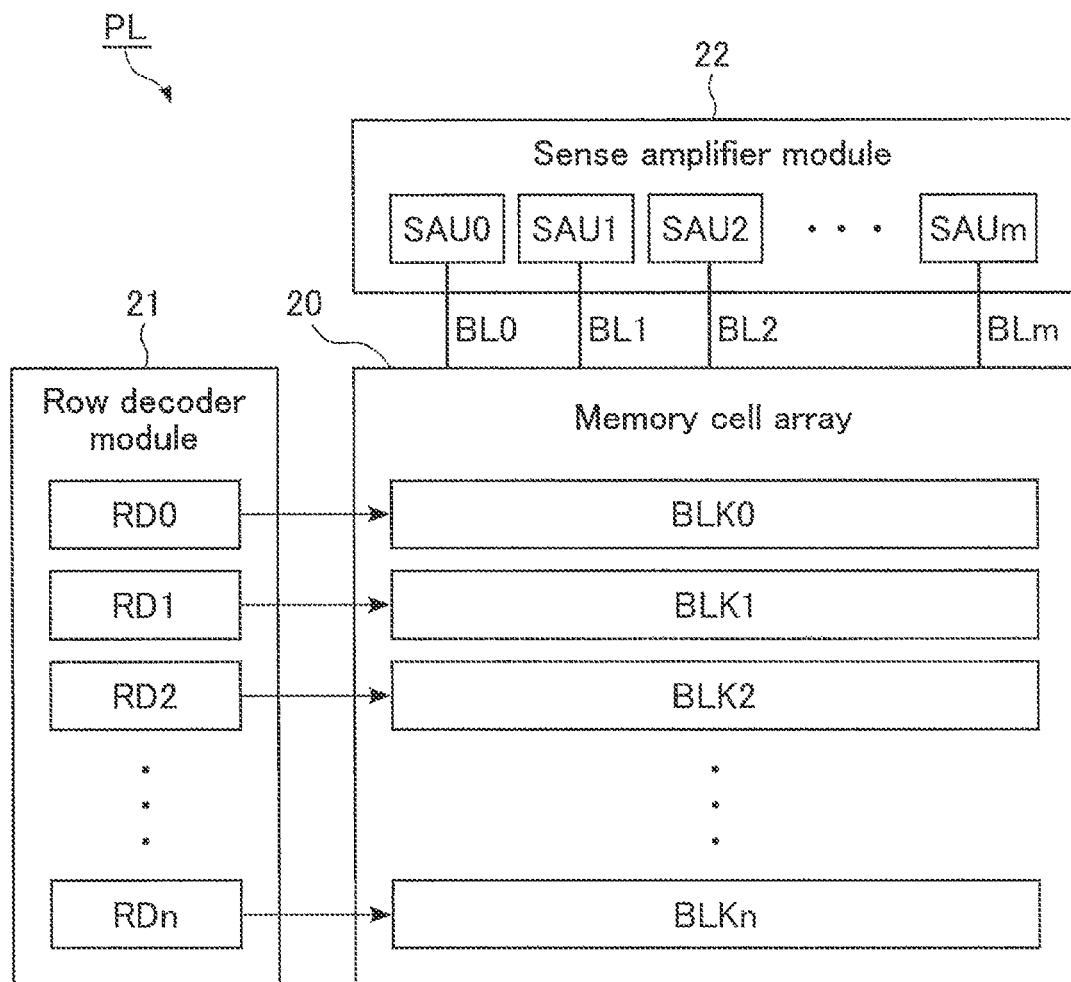
FIG. 3 is a block diagram showing a configuration example of a plane of the semiconductor memory device according to the first embodiment.

In general, according to one embodiment, a semiconductor memory device according to an embodiment includes a plurality of planes including a plurality of blocks each being a set of memory cells, and a sequencer configured to execute a first operation and a second operation shorter than the first operation. Upon receiving a first command set that instructs execution of the first operation, the sequencer is configured to execute the first operation. Upon receiving a second command set that instructs execution of the second operation while the first operation is being executed, the sequencer is configured to suspend the first operation and execute the second operation or execute the second operation in parallel with the first operation, based on an address of a block that is a target of the first operation and an address of a block that is a target of the second operation.

Hereinafter, embodiments will be described with reference to the drawings. Each of the embodiments describes, as an example, a device or method for embodying the technical idea of the invention. The drawings are schematic or conceptual, and the dimensions, ratios, etc. in the drawings are not always the same as the actual ones. The technical idea of the present invention is not specified by the shapes, structures, arrangements, etc. of the components.

In the following description, structural components having substantially the same function and configuration will be denoted by the same reference symbol. A numeral following letters constituting a reference symbol is used to distinguish between components referred to by reference symbols including the same letters and having a similar configuration. If components represented by reference symbols that include the same letters need not be distinguished from one another, such components are assigned reference symbols that include only the same letters.

Herein, an "H" level corresponds to a voltage at which an NMOS transistor is turned on and a PMOS transistor is turned off. An "L" level corresponds to a voltage at which an NMOS transistor is turned off and a PMOS transistor is turned on.

[1] First Embodiment

A semiconductor memory device according to an embodiment to be described below is a NAND flash memory capable of storing data in a non-volatile manner. A semiconductor memory device 10 according to a first embodiment will be described.

[1-1] Configuration

[1-1-1] Overall Configuration of Semiconductor Memory Device 10

FIG. 1 shows a configuration example of a semiconductor memory device 10 according to a first embodiment. As shown in FIG. 1, the semiconductor memory device 10 according to the first embodiment includes, for example, an input/output circuit 11, a register set 12, a logic controller 13, a sequencer 14, a ready/busy controller 15, a voltage generator 16, and plane groups PG1 and PG2.

The input/output circuit 11 transmits and receives, for example, input/output signals I/O1 to I/O8 with an eight-bit width to and from an external memory controller. The input/output signal I/O may include data DAT, status information STS, address information ADD, a command CMD, and the like. The input/output circuit 11 transmits and receives data DAT to and from each plane group PG via a data bus.

The register set 12 includes a status register 12A, an address register 12B, and a command register 12C. The status register 12A, the address register 12B, and the command register 12C store status information STS, address information ADD, and a command CMD, respectively.

The status information STS is updated based on, for example, an operation state of the sequencer 14. The status information STS is transferred from the status register 12A to the input/output circuit 11 based on an instruction from the memory controller, and is output to the memory controller. The address information ADD is transferred from the input/output circuit 11 to the address register 12B, and may include, for example, a block address, a page address, a column address, and the like. The command CMD is transferred from the input/output circuit 11 to the command register 12C, and includes instructions relating to various operations of the semiconductor memory device 10.

The logic controller 13 controls the input/output circuit 11 and the sequencer 14 based on a control signal received from an external memory controller. As such control signals, a chip enable signal CEn, a command latch enable signal CLE, an address latch enable signal ALE, a write enable signal WEn, a read enable signal REn, and a write protect signal WPn, for example, are used.

The chip enable signal CEn is a signal for enabling the semiconductor memory device 10. The command latch enable signal CLE is a signal for notifying the input/output circuit 11 that the received input/output signal I/O is a command CMD. The address latch enable signal ALE is a signal for notifying the input/output circuit 11 that the received input/output signal I/O is address information ADD. The write enable signal WEn is a signal for instructing the input/output circuit 11 to input an input/output signal I/O. The read enable signal REn is a signal for instructing the input/output circuit 11 to output an input/output signal I/O. The write protect signal WPn is a signal for bringing the semiconductor memory device 10 into a protected state when the power is turned on or off.

The sequencer 14 controls the entire operation of the semiconductor memory device 1. Based on the command CMD stored in the command register 12C and the address information ADD stored in the address register 12B, for example, the sequencer 14 executes a read operation, a write operation, an erase operation, and the like. The sequencer 14 includes a determination circuit DC.

The determination circuit DC functions as an address decoder. The determination circuit DC generates a predetermined control signal based on the address information ADD and the command CMD. The control signal is referred to when, for example, the semiconductor memory device 10 receives a command instructing execution of an interrupt process during an erase operation. Details of the determination circuit DC will be described later.

The ready/busy controller 15 generates a ready/busy signal RBn based on the operation state of the sequencer 14. The ready/busy signal RBn is a signal for notifying an external memory controller whether or not the semiconductor memory device 10 is in a ready state or a busy state. Herein, the "ready state" indicates a state in which the semiconductor memory device 10 receives an instruction from the memory controller, and the "busy state" indicates a state in which the semiconductor memory device 10 does not receive an instruction from the memory controller.

The voltage generator 16 generates voltages used in a read operation, a write operation, an erase operation, and the like. The voltage generator 16 includes, for example, driver modules DRM1 and DRM2. The driver module DRM1 supplies a voltage to the plane group PG1, and the driver module DRM2 supplies a voltage to the plane group PG2. That is, the plane groups PG1 and PG2 are coupled to different power sources.

Each plane group PG includes a plurality of planes PL. Each plane PL includes a set of memory cell transistors that store data in a non-volatile manner. Details of the planes PL will be described later. The plane groups PG1 and PG2 may be independently controlled by the sequencer 14.

FIG. 2 shows a configuration example of a plane group PG included in the semiconductor memory device 10 according to the first embodiment. As shown in FIG. 2, for example, the plane group PG1 includes planes PL0 to PL7, and the plane group PG2 includes planes PL8 to PL15.

In the plane group PG1, for example, a set of the planes PL0 and PL1, a set of the planes PL2 and PL3, a set of the planes PL4 and PL5, and a set of the planes PL6 and PL7 respectively constitute plane pairs PP0 to PP3.

In the plane group PG2, for example, a set of the planes PL8 and PL9, a set of the planes PL10 and PL11, a set of the planes PL12 and PL13, and a set of the planes PL14 and PL15 respectively constitute plane pairs PP4 to PP7.

Each of the plane pairs PP can be independently controlled by the sequencer 14. Each of the plane pairs PP is provided with a shared circuit SC. The shared circuit SC is a circuit shared by two planes PL included in the plane pair PP. For example, the shared circuit SC includes a power supply circuit that supplies a voltage to components included in each plane PL.

The number of planes PL and plane pairs PP included in each plane group PG may be designed to be a given number. The shared circuit CS shared by two planes PL constituting a plane pair PP is not limited to a power supply circuit, and may include a circuit with a given function.

FIG. 3 shows a configuration example of a plane PL in the semiconductor memory device 10 according to the first embodiment. As shown in FIG. 3, each plane PL includes, for example, a memory cell array 20, a row decoder module 21, and a sense amplifier module 22.

The memory cell array 20 includes a plurality of blocks BLK0 to BLKn (where n is an integer equal to or greater than 1). The block BLK is a set of memory cell transistors capable of storing data in a non-volatile manner, and is used as, for example, a unit of data erasure. In the memory cell array 20, a plurality of bit lines BL0 to BLm (where m is an integer equal to or greater than 1), a plurality of word lines, a source line, and a well line are provided. Each memory cell is associated with a single bit line and a single word line. A detailed configuration of the memory cell array 20 will be described later.

The row decoder module 21 selects, based on a block address, a block BLK on which various operations are to be executed. The row decoder module 21 transfers the voltage supplied from the voltage generator 16 to various interconnects in the selected block BLK. The row decoder module 21 includes, for example, a plurality of row decoders RD0 to RDn. The row decoders RD0 to RDn are associated with blocks BLK0 to BLKn, respectively. A detailed circuit configuration of the row decoder RD will be described later.

In a read operation, the sense amplifier module 22 reads data from the memory cell array 20, and transfers the read data to the input/output circuit 11. In a write operation, the sense amplifier module 22 applies a desired voltage to the bit line BL based on data received from the input/output circuit 11. The sense amplifier module 22 includes, for example, a plurality of sense amplifier units SAU0 to SAUm. The sense amplifier units SAU0 to SAUm are respectively associated with bit lines BL0 to BLm. A detailed circuit configuration of the sense amplifier unit SAU will be described later.

The above-described plane PL needs to include at least the memory cell array 20. In this case, the row decoder module 21 and the sense amplifier module 22 may be included in the shared circuit SC in each pair of planes PP.

[1-1-2] Circuit Configuration of Memory Cell Array 20

Next, a detailed configuration of the memory cell array 20 in the semiconductor memory device 10 according to the first embodiment will be described.

(Circuit Configuration of Memory Cell Array 20)

Figure 4:
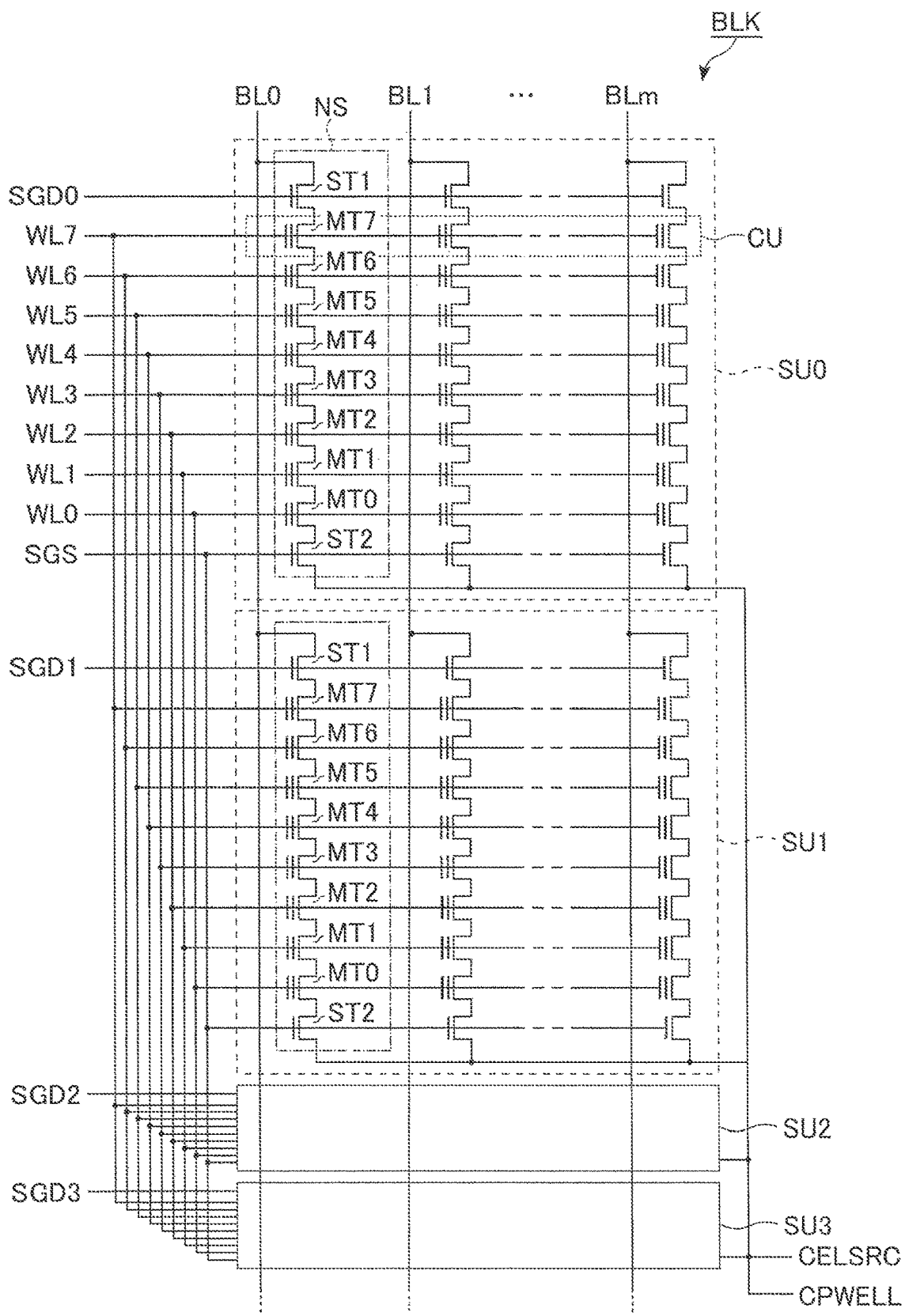
FIG. 4 is a circuit diagram showing an example of a circuit configuration of a memory cell array in the semiconductor memory device according to the first embodiment.

FIG. 4 shows an example of a circuit configuration of the memory cell array 20 in the semiconductor memory device according to the first embodiment, in which a single block BLK is extracted. As shown in FIG. 4, each block BLK includes, for example, four string units SU0 to SU3.

Each string unit SU includes a plurality of NAND strings NS respectively associated with bit lines BL0 to BLm. Each NAND string NS includes, for example, memory cell transistors MT0 to MT7 and select transistors ST1 and ST2.

Each memory cell transistor MT includes a control gate and a charge storage layer, and stores data in a non-volatile manner. Each of the select transistors ST1 and ST2 is used to select a string unit SU in various operations.

In each NAND string NS, memory cell transistors MT0 to MT7 are coupled in series. A select transistor ST1 is coupled between one end of the memory cell transistors MT0 to MT7 coupled in series and a bit line BL associated therewith. A drain of the select transistor ST2 is coupled to the other end of the memory cell transistors MT0 to MT7 coupled in series. A source line CELSRC and a well line CPWELL are coupled to a source of the select transistor ST2.

In the same block BLK, gates of the select transistors ST1 included in the string units SU0 to SU3 are commonly coupled to select gate lines SGD0 to SGD3, respectively. Control gates of the memory cell transistors MT0 to MT7 are commonly coupled to word lines WL0 to WL7, respectively. Gates of the select transistors ST2 are commonly coupled to a select gate line SGS.

The bit lines BL0 to BLm are shared among a plurality of blocks BLK. The same bit line BL is coupled to NAND strings NS corresponding to the same column address. A set of word lines WL0 to WL7 is provided for each block BLK. The source line CELSRC and the well line CPWELL are shared among, for example, a plurality of blocks BLK.

A set of memory cell transistors MT coupled to a common word line WL in a single string unit SU is referred to as, for example, a cell unit CU. For example, the storage capacity of a cell unit CU including memory cell transistors MT, which individually store 1-bit data, is defined as "1-page data". A cell unit CU may have a storage capacity of 2 or more pages of data, according to the number of bits of data stored in the memory cell transistor MT.

The above-described circuit configuration of the memory cell array 20 is merely an example, and the manufacturing process is not limited thereto. The number of string units SU included in each block BLK may be designed to be any number. For example, the numbers of memory cell transistors MT and select transistors ST1 and ST2 included in each NAND string NS may be designed to be any number. The number of the word lines WL and the numbers of the select gate lines SGD and SGS are designed in accordance with the number of memory cell transistors MT and the number of select transistors ST1 and ST2 included in each NAND string NS.

(Cross-Sectional Structure of Memory Cell Array 20)

Figure 5:
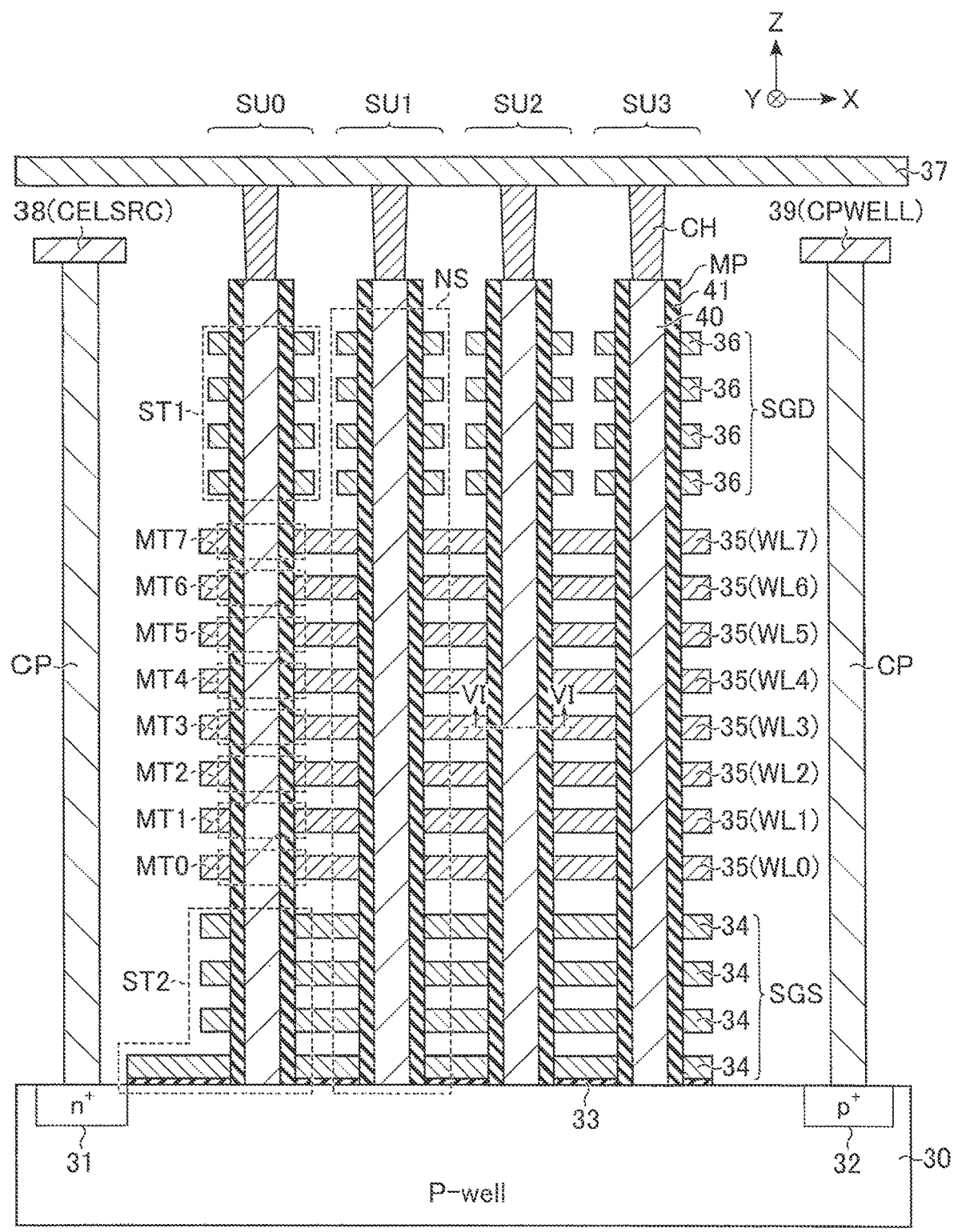
FIG. 5 is a cross-sectional view showing an example of a cross-sectional structure of the memory cell array in the semiconductor memory device according to the first embodiment.

FIG. 5 is an example of a cross-sectional structure of the memory cell array 20 in the semiconductor memory device according to the first embodiment, in which a structure corresponding to a single block BLK is extracted. In the cross-sectional views that will be referred to below, components such as interlayer insulating films, interconnects, and contacts are suitably omitted for ease of reference of the drawings. An X direction corresponds to a direction in which the bit lines BL extend. A Y direction corresponds to a direction in which the word lines WL extend. A Z direction corresponds to a vertical direction with respect to the surface of the semiconductor substrate.

As shown in FIG. 5, the region where the memory cell array 20 is formed includes, for example, a P-type well region 30, an insulating layer 33, four conductive layers 34, eight conductive layers 35, four conductive layers 36, a plurality of memory pillars MP, conductive layers 37, 38, and 39, and a plurality of contacts CP.

The p-type well region 30 is provided in the vicinity of a surface of the semiconductor substrate. The P-type well region 30 includes an $n^+$ impurity diffusion region 31 and a $p^+$ impurity diffusion region 32 that are arranged apart from each other. Both of the $n^+$ impurity diffusion region 31 and the $p^+$ impurity diffusion region 32 are provided in the vicinity of the surface of the P-type well region 30.

An insulating layer 33 is provided on the P-type well region 30. On the insulating layer 33, four conductive layers 34 stacked apart from each other are provided. The lowermost conductive layer 34 and the insulating layer 33 are provided up to the vicinity of the $n^+$ impurity diffusion region 31. Eight conductive layers 35 stacked apart from each other are provided above the uppermost conductive layer 34. Four conductive layers 36 that are stacked apart from each other are provided above the uppermost conductive layer 35. A conductive layer 37 is provided above the uppermost conductive layer 36.

The conductive layers 34 have a structure extending along an XY plane, and are used as select gate lines SGS. The eight conductive layers 35, each of which has a structure extending along the XY plane, are respectively used as word lines WL0 to WL7 in the order beginning from the lower layer. The conductive layers 36, each of which has a structure extending along the Y direction, are separated by the corresponding string unit SU in each interconnect layer. The conductive layers 36 are used as the select gate lines SGD. The conductive layers 37 have a structure extending in the X direction, and are aligned in a Y direction in an unillustrated region. The conductive layers 37 are used as bit lines BL.

The conductive layers 38 and 39 are arranged in, for example, an interconnect layer between the uppermost conductive layer 36 and the conductive layer 37. The conductive layer 38 is used as a source line CELSRC, and the conductive layer 39 is used as a well line CPWELL. A contact CP is provided between the conductive layer 38 and the $n^+$ impurity diffusion region 31 and between the conductive layer 39 and the $p^+$ impurity diffusion region 32. The conductive layers 38 and 39 are electrically coupled to the $n^+$ impurity diffusion region 31 and the $p^+$ impurity diffusion region 32, respectively, via a contact CP.

Each of the memory pillars MP penetrates (passes through) the insulating layer 33, the four conductive layers 34, the eight conductive layers 35, and the four conductive layers 36. Each of the memory pillars MP includes, for example, a semiconductor member 40 and a laminated film 41.

The semiconductor member 40 is formed in a columnar shape extending along the Z direction, for example. A side surface of the semiconductor member 40 is covered with the laminated film 41. A lower portion of the semiconductor member 40 is in contact with the P-type well region 30. An upper portion of the semiconductor member 40 is in contact with, for example, the conductive layer 37 via the contact CH. The semiconductor members 40 in the memory pillars MP corresponding to the same column address are electrically coupled to the same conductive layer 37. The semiconductor member 40 and the conductive layer 37 may be electrically coupled to each other via a contact, an interconnect, or the like.

Figure 6:
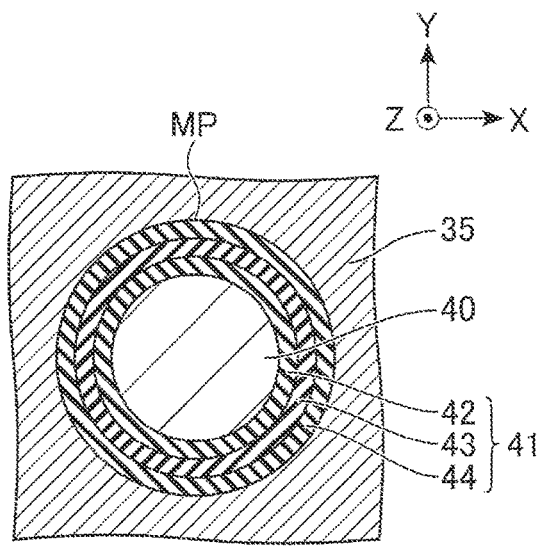
FIG. 6 is a cross-sectional view showing an example of a cross-sectional structure of a memory pillar in the semiconductor memory device according to the first embodiment.

FIG. 6 is a cross-sectional view taken along line VI-VI in FIG. 5, and shows an example of a cross-sectional structure of a memory pillar MP in an interconnect layer including the conductive layer 35. As shown in FIG. 6, the laminated film 41 includes, for example, a tunnel oxide film 42, an insulating film 43, and a block insulating film 44.

The tunnel oxide film 42 surrounds a side surface of the semiconductor member 40. An insulating film 43 is provided on a side surface of the tunnel oxide film 42. A block insulating film 44 is provided on a side surface of the insulating film 43. The conductive layer 35 is in contact with a side surface of the block insulating film 44. An insulator whose side surface is surrounded by the semiconductor member 40 may be provided in a central portion of the memory pillar MP.

In the above-described structure of the memory cell array 20, the portion where the memory pillar MP and the conductive layer 34 intersect each other functions as a select transistor ST2. The portion where the memory pillar MP and the conductive layer 35 intersect each other functions as a memory cell transistor MT. The portion where the memory pillar MP intersects the conductive layer 25 functions as a select transistor ST1.

That is, in this example, each memory pillar MP functions as, for example, a single NAND string NS. Each string unit SU is formed by a set of memory pillars MP arranged in the Y direction. A semiconductor member 40 is used as a current path of a transistor included in the NAND string NS. The NAND string NS and the source line CELSRC are electrically coupled by a channel formed in the vicinity of a surface of the P-type well region 30 when the select transistor ST2 is turned on.

The above-described structure of the memory cell array 20 is merely an example, and may be suitably modified. For example, the number of conductive layers 35 may be designed based on the number of word lines WL. The number of the conductive layers 34 that are used as the select gate line SGS may be designed to be any number. The number of the conductive layers 36 that are used as the select gate line SGD may be designed to be any number.

(Threshold Voltage Distributions of Memory Cell Transistors MT)

Figure 7:
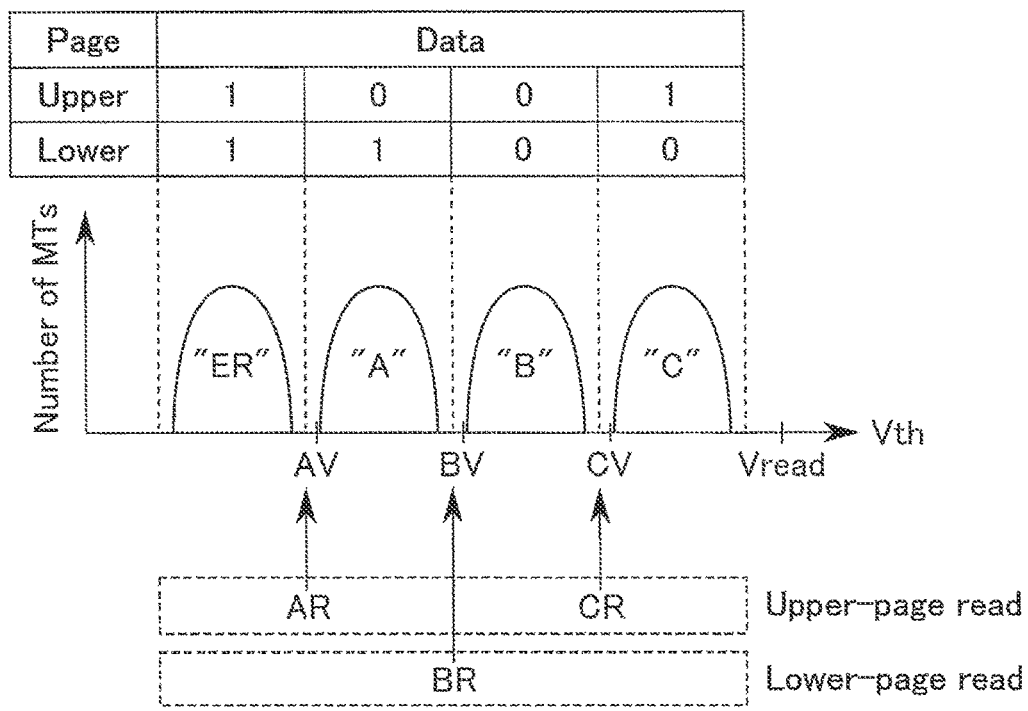
FIG. 7 is a threshold voltage distribution diagram showing an example of distributions of threshold voltages of memory cell transistors in the semiconductor memory device according to the first embodiment.

FIG. 7 shows an example of threshold voltage distributions of the memory cell transistors MT in the semiconductor memory device 10 according to the first embodiment. The vertical axis of the graph shown in FIG. 7 represents the number of memory cell transistors MT, and the horizontal axis represents the threshold voltage of the memory cell transistors MT.

As shown in FIG. 7, in the semiconductor memory device 10 according to the first embodiment, four types of threshold voltage distributions can be formed by threshold voltages of a plurality of memory cell transistors MT included in a single cell unit CU. That is, the memory cell transistors MT in the semiconductor memory device 10 according to the first embodiment are multi-level cells (MLCs) capable of storing 2-bit (4-value) data. The four types of threshold voltage distributions are referred to as an "ER" state, an "A" state, a "B" state, and a "C" state in the order beginning from the lowest threshold voltage, for example. In the above-described example, the memory cell transistors MT are MLCs; however, the memory cell transistors MT may be single-level cells (SLCs) capable of storing 1-bit (binary) data. In this case, the number of latch circuits in the sense amplifier module 22 (to be described later) may be reduced, for example.

A verify voltage to be used in a write operation is set between adjacent threshold voltage distributions. For example, a verify voltage AV corresponding to the "A" state is set in the vicinity of the "A" state between the "ER" state and the "A" state. Similarly, verify voltages BV and CV corresponding to the "B" state and the "C" state, respectively, are set. In a write operation, upon detecting that the threshold voltage of the memory cell transistor MT that stores certain data exceeds a verify voltage corresponding to the data, the sequencer 14 completes the program of the memory cell transistor MT.

A read voltage used in a read operation is also set between adjacent threshold voltage distributions. For example, a read voltage AR is set between the "ER" state and the "A" state. Similarly, a read voltage BR is set between the "A" state and the "B" state, and a read voltage CR is set between the "B" state and the "C" state. The read voltages AR, BR, and CR are set to, for example, voltages lower than the verify voltages AV, BV, and CV, respectively. When a read voltage is applied to a gate of a memory cell transistor MT, the memory cell transistor MT is turned on or off according to data stored therein.

For a voltage higher than the highest threshold voltage distribution, a read pass voltage Vread is set. Specifically, the read pass voltage Vread is set to a voltage higher than the maximum threshold voltage in the "C" state. When a read pass voltage Vread is applied to a gate of a memory cell transistor MT, the memory cell transistor MT is turned on regardless of data stored therein.

Two different bits of data are assigned to each of the four types of threshold voltage distributions described above. An example of data allocation to the threshold voltage distributions is listed below.

"ER" state: "11 (upper bit/lower bit)" data
"A" state: "01" data
"B" state: "00" data
"C" state: "10" data When such data allocation is applied, one page data (lower page data) composed of lower bits is determined by a read process using the read voltage BR. One page data (upper page data) composed of upper bits is determined by a read process using the read voltages AR and CR.

[1-1-3] Circuit Configuration of Row Decoder Module 21

Figure 8:
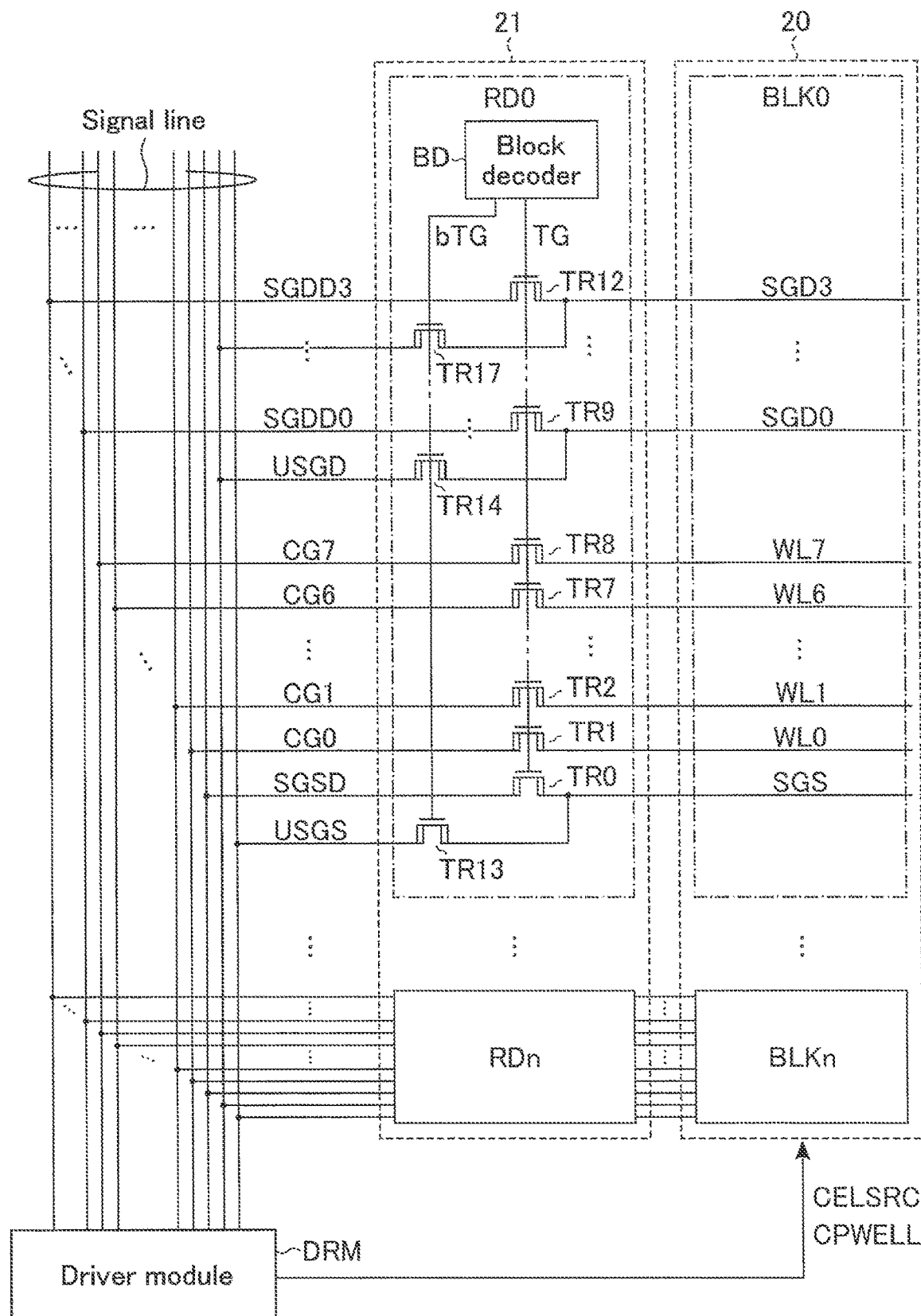
FIG. 8 is a circuit diagram showing an example of a circuit configuration of a row decoder module in the semiconductor memory device according to the first embodiment.

FIG. 8 shows an example of a circuit configuration of the row decoder module 21 in the semiconductor memory device 10 according to the first embodiment, and also shows a relationship between the driver module DRM and the memory cell array 20. As shown in FIG. 8, the row decoder module 21 is coupled to the driver module DRM via a plurality of signal lines.

A detailed circuit configuration of the row decoder RD will be described below, focusing on the row decoder RD0 corresponding to the block BLK0. The row decoder RD includes, for example, a block decoder BD and transistors TR0 to TR17.

The block decoder BD decodes a block address, and applies a predetermined voltage to transfer gate lines TG and bTG based on a result of the decoding. The transfer gate line TG is commonly coupled to gates of the transistors TR0 to TR12. An inverted signal of a transfer gate line TG is input to a transfer gate line bTG, and the transfer gate line bTG is commonly coupled to respective gates of the transistors TR13 to TR17.

The transistors TR0 to TR17 are high-voltage n-channel MOS transistors. Each transistor TR is coupled between a signal line wired from the driver module DRM and an interconnect provided in the corresponding block BLK.

Specifically, a drain of the transistor TR0 is coupled to the signal line SGSD. A source of the transistor TR0 is coupled to the select gate line SGS. Drains of the transistors TR1 to TR8 are respectively coupled to the signal lines CG0 to CG7. Sources of the transistors TR1 to TR8 are respectively coupled to the word lines WL0 to WL7. Drains of the transistors TR9 to TR12 are respectively coupled to the signal lines SGDD0 to SGDD3. Sources of the transistors TR9 to TR12 are respectively coupled to the select gate lines SGD0 to SGD3.

A drain of the transistor TR13 is coupled to the signal line USGS. A source of the transistor TR13 is coupled to the select gate line SGS. Drains of the transistors TR14 to TR17 are coupled in common to the signal line USGD. Sources of the transistors TR14 to TR17 are respectively coupled to the select gate lines SGD0 to SGD3.

The above-described configuration allows the row decoder module 21 to select a block BLK. In various operations, for example, the block decoder BD corresponding to the selected block BLK applies an "H" level voltage and an "L" level voltage to the transfer gate lines TG and bTG, respectively, and the block decoders BD corresponding to the non-selected blocks BLK apply an "L" level voltage and an "H" level voltage to the transfer gate lines TG and bTG, respectively.

The above-described circuit configuration of the row decoder module 21 is merely an example, and may be suitably modified. For example, the number of transistors TR included in the row decoder module 21 may be designed based on the number of interconnects provided in each block BLK. The driver module DRM shown in FIG. 8 is capable of applying a voltage to both of the source line CELSRC and the well line CPWELL provided in the memory cell array 20.

[1-1-4] Circuit Configuration of Sense Amplifier Module 22

Figure 9:
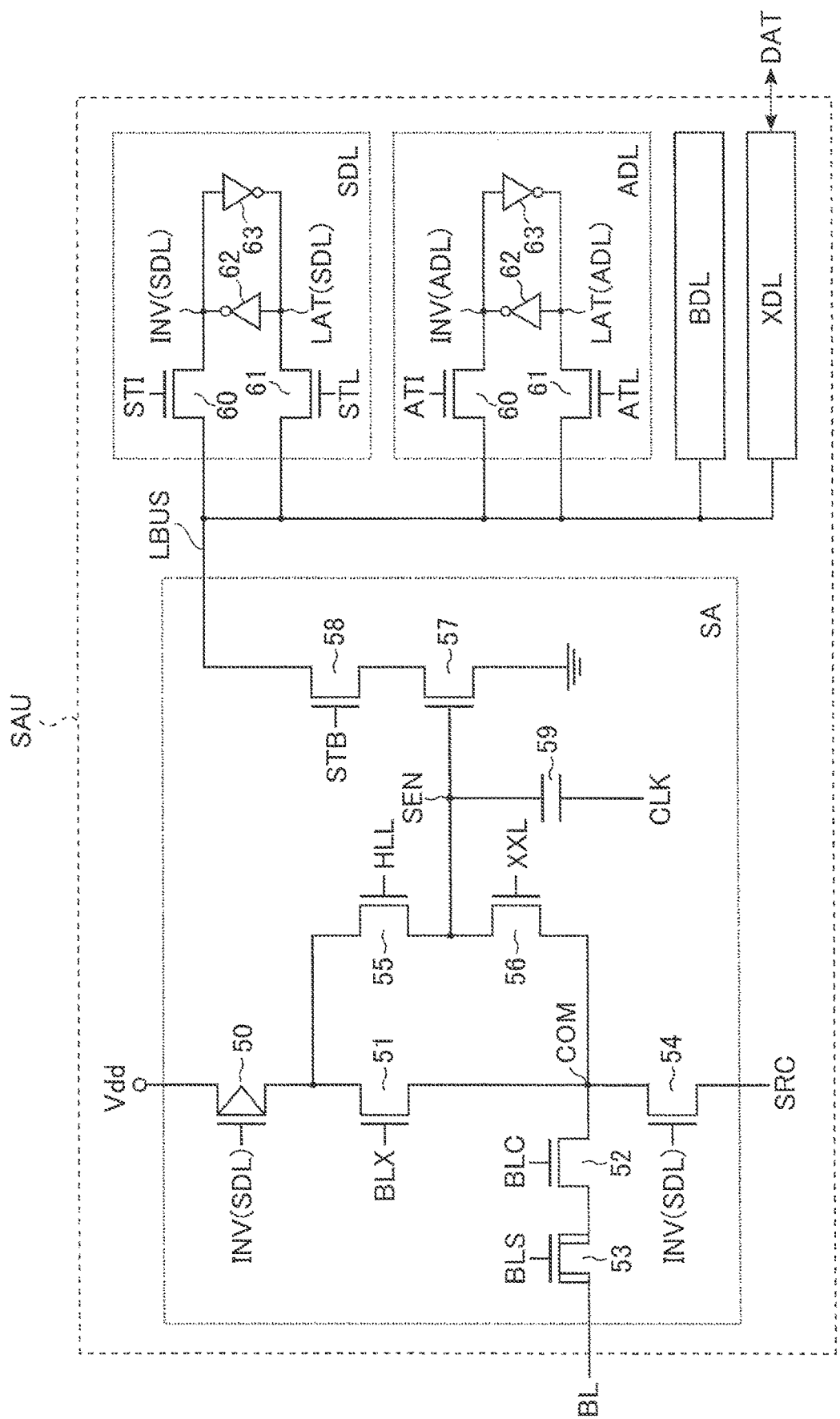
FIG. 9 is a diagram showing an example of a circuit configuration of a sense amplifier module in the semiconductor memory device according to the first embodiment.

FIG. 9 shows an example of a circuit configuration of the sense amplifier module 19 in the semiconductor memory device 10 according to the first embodiment, in which a circuit configuration corresponding to a single sense amplifier unit SAU is extracted. As shown in FIG. 9, the sense amplifier unit SAU includes, for example, a sense amplifier SA and latch circuits SDL, ADL, BDL, and XDL.

In a read operation, for example, the sense amplifier SA determines whether or not read data is "0" or "1", based on the voltage of the corresponding bit line BL. In other words, the sense amplifier SA senses data read in a corresponding bit line BL, and determines data stored in the selected memory cell.

Each of the latch circuits SDL, ADL, BDL, and XDL temporarily stores read data, write data, and the like. The latch circuit XDL may be used for, for example, input and output of data DAT between the sense amplifier unit SAU and the input/output circuit 11. That is, the latch circuit XDL may be used as a cache memory of the semiconductor memory device 10. On the other hand, the latch circuits SDL, ADL, and BDL are arranged in a region closer to the sense amplifier SA than the latch circuit XDL, and can be preferentially used in a read operation, a write operation, and an erase operation. When, for example, the memory cell transistor MT is an SLC, the latch circuits ADL and BDL need not be provided. In this case, a single sense amplifier unit SAU includes only a sense amplifier SA, a latch circuit SDL arranged in the vicinity thereof, and a latch circuit XDL used for input and output of data DAT to and from the input/output circuit 11.

Even when the latch circuits SDL, ADL, and BDL are in use, the semiconductor memory device 10 can be in a ready state if the latch circuit XDL (cache memory) is unoccupied. A ready state that is defined in association with the state of the latch circuit XDL (cache memory) is referred to as "cache ready". In the "cache ready" state, the period of time from the start of an operation through a transition to the busy state to a transition back to the ready state can be decreased, since the condition for bringing the semiconductor memory device 10 to be in a ready state is relaxed as compared with the case where a ready state is defined in association with the operation of an internal circuit other than the latch circuit XDL.

Hereinafter, an example of a detailed circuit configuration of each of the sense amplifier SA and the latch circuits SDL, ADL, BDL, and XDL will be described. For example, the sense amplifier SA includes transistors 50 to 58 and a capacitor 59, and the latch circuit SDL includes transistors 60 and 61 and inverters 62 and 63.

The transistor 50 is a PMOS transistor. Each of the transistors 51, 52, 54 to 58, 60, and 61 is an NMOS transistor. The transistor 53 is a high-voltage NMOS transistor.

One end of the transistor 50 is coupled to a power supply line. A power supply voltage Vdd, for example, is applied to a power supply line coupled to one end of the transistor 50. A gate of the transistor 50 is coupled to a node INV (SDL) of the latch circuit SDL. One end of the transistor 51 is coupled to the other end of the transistor 50. The other end of the transistor 51 is coupled to a node COM. A control signal BLX is input to a gate of the transistor 51. One end of the transistor 52 is coupled to the node COM. A control signal BLC is input to a gate of the transistor 52. One end of the transistor 53 is coupled to the other end of the transistor 52. The other end of the transistor 53 is coupled to a corresponding bit line BL. A control signal BLS is input to a gate of the transistor 53.

One end of the transistor 54 is coupled to the node COM. The other end of the transistor 54 is coupled to a node SRC. A ground voltage Vss, for example, is applied to the node SRC. A gate of the transistor 54 is coupled to a node INV (SDL) of the latch circuit SDL. One end of the transistor 55 is coupled to the other end of the transistor The other end of the transistor 55 is coupled to a node SEN. A control signal HLL is input to a gate of the transistor 55. One end of the transistor 56 is coupled to the node SEN. The other end of the transistor 56 is coupled to the node COM. A control signal XXL is input to a gate of the transistor 56.

One end of the transistor 57 is grounded. A gate of the transistor 57 is coupled to the node SEN. One end of the transistor 58 is coupled to the other end of the transistor 57. The other end of the transistor 58 is coupled to a bus LBUS. A control signal STB is input to the gate of the transistor 58. One end of the capacitor 59 is coupled to the node SEN. A clock CLK is input to the other end of the capacitor 59.

In the latch circuit SDL, one end of each of the transistors 60 and 61 is coupled to the bus LBUS. The other ends of the transistors 60 and 61 are coupled to the nodes INV and LAT, respectively. Control signals STI and STL are input to gates of the transistors 60 and 61, respectively. Both of an input node of the inverter 62 and an output node of the inverter 63 are coupled to a node LAT. Both of an output node of the inverter 62 and an input node of the inverter 63 are coupled to a node INV.

Circuit configurations of the latch circuits ADL, BDL, and XDL are similar to, for example, the circuit configuration of the latch circuit SDL. On the other hand, a control signal different from that of the latch circuit SDL is input to each of the transistors 60 and 61. In the latch circuit ADL, for example, the control signals ATI and ATL are input to the gates of the transistors 60 and 61, respectively. The nodes INV and LAT of the latch circuits SDL, ADL, BDL, and XDL are independently provided.

The control signals BLX, BLC, BLS, HLL, XXL, STB, STI, STL, ATI, and ATL described above are generated by, for example, the sequencer 14. The timing at which the sense amplifier SA determines the data read in the bit line BL is based on the timing at which the sequencer 14 asserts the control signal STB. In the following description, "asserting the control signal STB" corresponds to the sequencer 14 temporarily changing the control signal STB from the "L" level to the "H" level.

The circuit configuration of the sense amplifier module 22 described above is merely an example, and the configuration is not limited thereto. For example, the number of latch circuits included in the sense amplifier unit SAU may be appropriately modified based on the number of bits of data stored in the memory cell transistor MT. Depending on the circuit configuration of the sense amplifier unit SAU, the operation corresponding to "asserting the control signal STB" may correspond to the operation in which the sequencer 14 temporarily changes the control signal STB from the "H" level to the "L" level.

[1-1-5] Circuit Configuration of Determination Circuit DC

Figure 10:
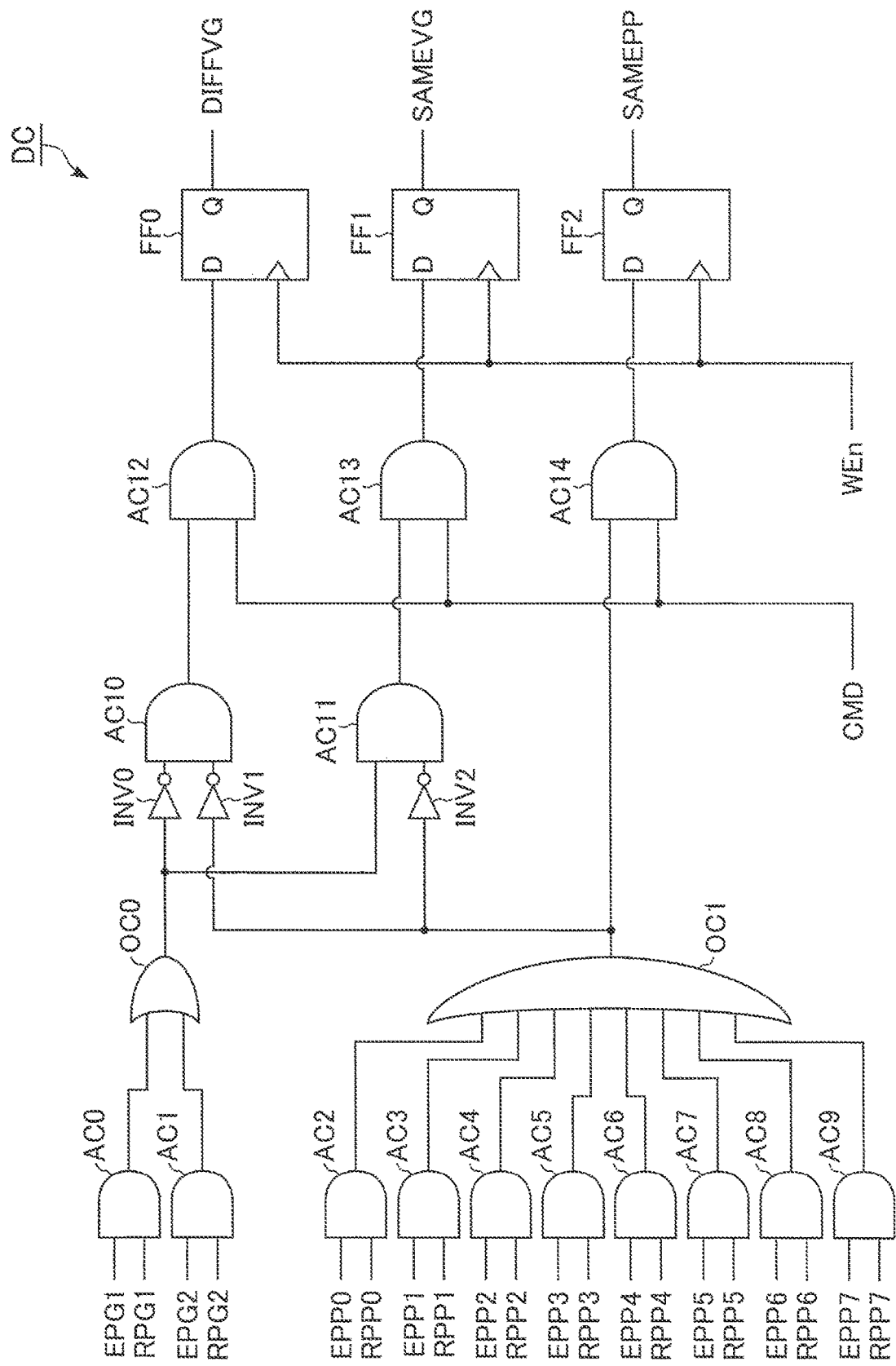
FIG. 10 is a circuit diagram showing an example of a circuit configuration of a determination circuit in the semiconductor memory device according to the first embodiment.

FIG. 10 shows an example of a circuit configuration of a determination circuit DC in the semiconductor memory device 10 according to the first embodiment. As shown in FIG. 10, addresses EPG1 and EPG2, addresses RPG1 and RPG2, addresses EPP0 to EPP7, and addresses RPP0 to RPP7 are input to the determination circuit DC. The determination circuit DC includes AND circuits AC0 to AC14, OR circuits OC0 and OC1, inverters INV0 to INV2, and flip flop circuits FF0 to FF2.

Each of addresses EPG1 and EPG2 is address information indicating a plane group PG on which the semiconductor memory device 10 executes an erase operation in the foreground. The addresses EPG1 and EPG2 correspond to plane groups PG1 and PG2, respectively.

Each of the addresses RPG1 and RPG2 is address information indicating a plane group PG in which the semiconductor memory device 10 executes a read operation as an interrupt process. The addresses RPG1 and RPG2 correspond to plane groups PG1 and PG2, respectively.

Each of the addresses EPG1, EPG2, RPG1, and RPG2 becomes an "H" level signal it corresponds to a selected plane group PG, and becomes an "L" level signal when it corresponds to a non-selected plane group PG, for example.

Each of the addresses EPP0 to EPP7 is address information indicating a plain pair PP on which the semiconductor memory device 10 executes an erase operation in the foreground. The addresses EPP0 to EPP7 correspond to plane pairs PP0 to PP7, respectively.

Each of the addresses RPP0 to RPP7 is address information indicating a plane pair PP on which the semiconductor memory device 10 executes a read operation as an interrupt process. Addresses RPP0 to RPP7 correspond to plane pairs PP0 to PP7, respectively.

Each of the addresses EPP0 to EPP7 and RPP0 to RPP7 becomes, for example, an "H" level signal when it corresponds to the selected plane pair PP, and becomes an "L" level signal when it corresponds to the non-selected plane pair PP.

The addresses EPG1 and RPG1 are input to the AND circuit AC0. The addresses EPG2 and RPG2 are input to the AND circuit AC1. Output signals of the AND circuits AC0 and AC1 are input to the OR circuit OC0.

The addresses EPP0 and RPP0 are input to the AND circuit AC2. The addresses EPP1 and RPP1 are input to the AND circuit AC3. The addresses EPP2 and RPP2 are input to the AND circuit AC4. The addresses EPP3 and RPP3 are input to the AND circuit AC5. The addresses EPP4 and RPP4 are input to the AND circuit AC6. The addresses EPP5 and RPP5 are input to the AND circuit AC7. The addresses EPP6 and RPP6 are input to the AND circuit AC8. The addresses EPP7 and RPP7 are input to the AND circuit AC9. Output signals of the AND circuits AC2 to AC9 are input to the OR circuit OC1.

To the AND circuit AC10, an output signal of the OR circuit OC0 is input via the inverter INV0, and an output signal of the OR circuit OC1 is input via the inverter INV1. To the AND circuit AC11, an output signal of the OR circuit OC0 is input, and an output signal of the OR circuit OC1 is input via the inverter INV2.

An output signal of the AND circuit AC10 is input to the AND circuit AC12. An output signal of the AND circuit AC11 is input to the AND circuit AC13. An output signal of the OR circuit OC1 is input to the AND circuit AC14. A command CMD is input to each of the AND circuits AC12 to AC14. The command CMD becomes an "H" level signal when, for example, a predetermined command is stored in the command register 12C.

An output signal of the AND circuit AC12 is input to an input D of the flip flop circuit FF0. An output signal of the AND circuit AC13 is input to an input D of the flip flop circuit FF1. An output signal of the AND circuit AC14 is input to an input D of the flip flop circuit FF2. A write enable signal WEn, for example, is input to each of the clocks of the flip flop circuits FF0 to FF2.

Each of the flip flop circuits FF0 to FF2 outputs a control signal from an output Q based on the signal input to the input D and the signal input to the clock. Specifically, a control signal DIFFVG is output from an output Q of the flip flop circuit FF0. A control signal SAMEVG is output from an output Q of the flip flop circuit FF1. A control signal SAMEPP is output from an output Q of the flip flop circuit FF2.

A control signal DIFFVG is a control signal indicating that a plane PL in which an erase operation is being executed in the foreground and a plane PL in which a read operation is to be executed as an interrupt process belong to different plane groups PG.

A control signal SAMEVG is a control signal indicating that a plane PL in which an erase operation is being executed in the foreground and a plane PL in which a read operation is to be executed as an interrupt process belong to the same plane group PG, and constitute different plane pairs PP.

The control signal SAMEPP is a control signal indicating that a plane pair PP including a plane PL in which an erase operation is being executed in the foreground is the same as a plane pair PP including a plane PL in which a read operation is to be executed as an interrupt process.

In the circuit configuration of the determination circuit DC described above, when the semiconductor memory device 10 receives an instruction for an interrupt process during an erase operation, one of the control signals DIFFVG, SAMEVG, and SAMEPP is turned to the "H" level based on the address of the plane PL in which an erase operation is being executed in the foreground and an address of the plane PL in which a read operation is to be executed as an interrupt process.

The circuit configuration of the determination circuit DC is not limited thereto, and any circuit configuration may be designed. The determination circuit DC is only required to output information indicating a relationship between a plane PL in which an operation in the foreground is being executed and a plane PL in which an operation is to be executed as an interrupt process, based on at least two types of address information.

[1-2] Operation

Next, a read operation, an erase operation, and an interrupt process during the erase operation in the semiconductor memory device 10 according to the first embodiment will be described in order.

In the following description, the selected block BLK is referred to as a "selected block BLKsel", and the non-selected block BLK is referred to as a "non-selected block BLKusel". The voltage generator 16 applying a voltage to the word line WL corresponds to the voltage generator 16 applying a voltage to the word line WL via the signal line CG and the row decoder module 21.

[1-2-1] Read Operation

Figure 11:
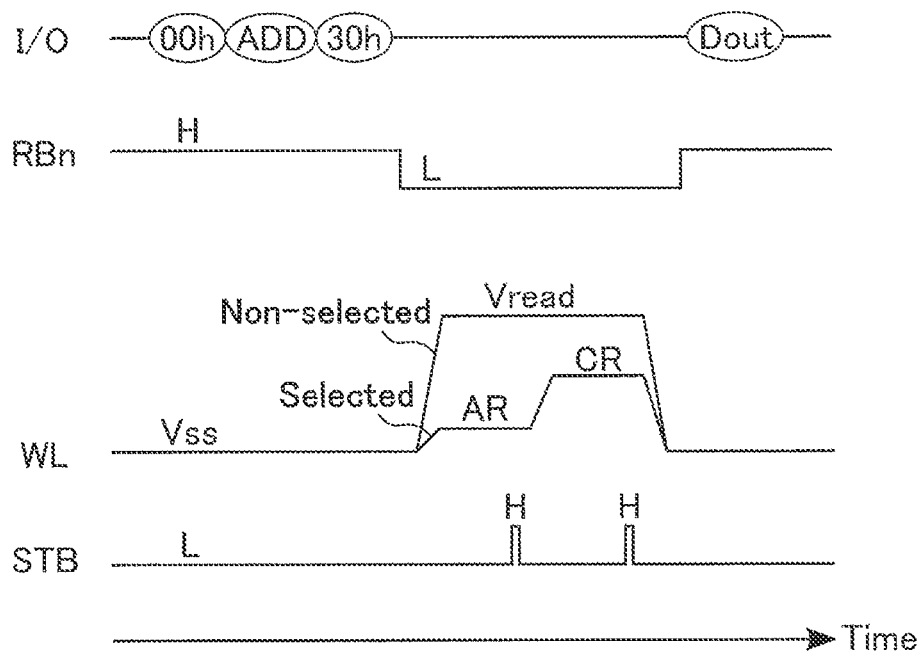
FIG. 11 is a command sequence and a timing chart for illustrating an example of a read operation in the semiconductor memory device according to the first embodiment.

FIG. 11 is a timing chart showing an example of a read operation of an upper page in the semiconductor memory device 10 according to the first embodiment. As shown in FIG. 11, in a read operation of an upper page, an external memory controller sequentially transmits, for example, a command "00h", address information "ADD", and a command "30h" to the semiconductor memory device 10.

The command "00h" is a command for designating a read operation. The command "30h" is a command for instructing execution of the read operation. Upon receiving the command "30h", the sequencer 14 causes the semiconductor memory device 10 to transition from the ready state to the busy state, and starts a read operation based on the received command and address information.

When the read operation is started, the voltage generator 16 applies a read pass voltage Vread to a non-selected word line WL, and sequentially applies read voltages AR and CR to a selected word line WL. The sequencer 14 asserts a control signal STB while the read voltages AR and CR are being applied to the selected word line WLsel.

In each sense amplifier unit SAU, a read result by the read voltage AR is stored in, for example, the latch circuit ADL. Thereafter, read data of the upper page is calculated based on the read result by the read voltage CR and the read result by the read voltage AR stored in the latch circuit ADL, and the calculation result is stored in, for example, the latch circuit XDL.

When the read data of the upper page is determined, the sequencer 14 ends the read operation and causes the semiconductor memory device 10 to transition from the busy state to the ready state. Based on an instruction of the memory controller, the read result stored in the latch circuit XDL of each sense amplifier unit SAU is output to the memory controller ("Dout" in FIG. 11).

The semiconductor memory device 10 is capable of executing a read operation of a lower page in a similar manner to the read operation of the upper page. The type and number of voltages applied in a read operation may be suitably modified based on the number of bits of data stored in the memory cell transistor MT and the allocation of data. The command used in a read operation may be suitably modified.

[1-2-2] Erase Operation

Figure 12:
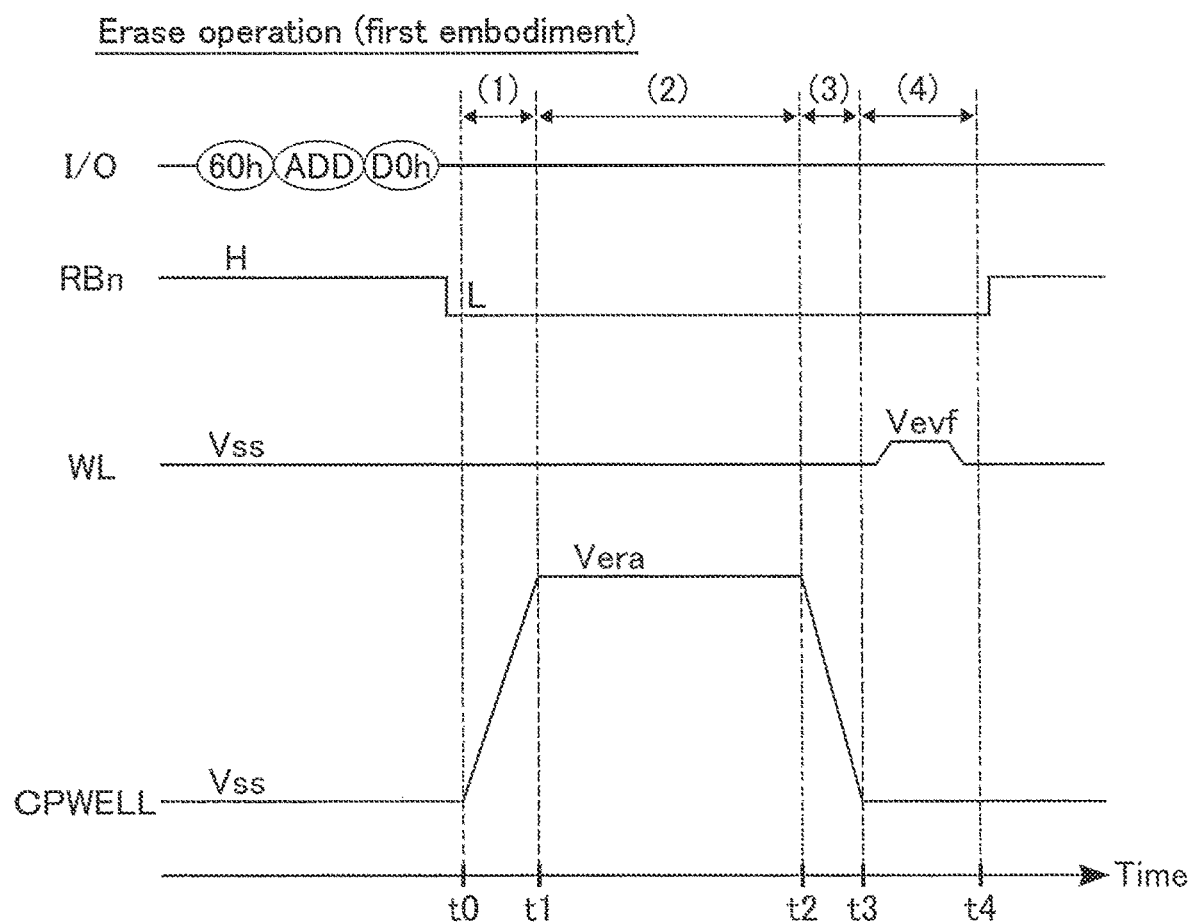
FIG. 12 is a command sequence and a timing chart illustrating an example of an erase operation in the semiconductor memory device according to the first embodiment.

FIG. 12 is a timing chart showing an example of an erase operation in the semiconductor memory device 10 according to the first embodiment. As shown in FIG. 12, in an erase operation, an external memory controller sequentially transmits, for example, a command "60h", address information "ADD", and a command "D0h" to the semiconductor memory device 10.

The command "60h" is a command for designating an erase operation. The command "D0h" is a command for instructing execution of a normal erase operation. Upon receiving the command "D0h", the sequencer 14 causes the semiconductor memory device 10 to transition from the ready state to the busy state, and starts an erase operation based on the received command and address information.

In the erase operation, the voltage generator 16 applies Vss to a word line WL in a selected block BLKsel, and applies Vera to a well line CPWELL. Vera is a high voltage used as an erase voltage. Thereafter, a potential difference is generated between the channel and the control gate in each NAND string NS in the selected block BLKsel, and electrons stored in the charge storage layer are extracted to the channel. As a result, the threshold voltages of the memory cell transistors MT in the selected block BLKsel decrease and are distributed at the "ER" level.

Subsequently, the sequencer 14 executes an erase verify. Specifically, the sequencer 14 drops the voltage of the well line CPWELL from Vera to Vss, and then executes a read operation using Vevf on the selected block BLKsel. Vevf is set to a voltage between the "ER" state and the "A" state. The threshold voltages of the memory cell transistors MT that have passed the erase verify are distributed at the "ER" state. Vevf is applied to, for example, all the word lines WL corresponding to the selected block BLKsel.

When the erase verify is passed, the sequencer 14 ends the erase operation, and causes the semiconductor memory device 10 to transition from the busy state to the ready state. The erase verify may be executed either in units of blocks BLK or in units of string units SU. When the erase verify is failed, the sequencer 14 may execute an erase operation on the same selected block BLK.

The above-described erase operation can be classified into, for example, a voltage rise period, an erase period, a voltage drop period, and an erase verify period. The voltage rise period corresponds to a period between times t0 and t1 ((1) in FIG. 12), and is a period in which the voltage of the well line CPWELL rises from Vss to Vera. The erase period corresponds to a period between times t1 and t2 ((2) in FIG. 12), and is a period during which mainly electrons stored in the charge storage layer are extracted. The voltage drop period corresponds to a period between times t2 and t3 ((3) in FIG. 12), and is a period in which the voltage of the well line CPWELL drops from Vera to Vss. The erase verify period corresponds to a period between times t3 and t4 ((4) in FIG. 12), and is a period in which an erase verify is executed. These periods will be used to describe the execution timing of an interrupt process to be described later.

[1-2-3] Interrupt Process During Erase Operation

Upon receiving an instruction for a read operation from an external memory controller during an erase operation, the semiconductor memory device 10 according to the first embodiment appropriately suspends the erase operation and executes an interrupt process. Regarding the execution timing of the interrupt process, a plurality of types are conceivable based on the relationship between a plane PL in which the erase operation is being executed and a plane PL in which the read operation is to be executed.

In an interrupt process, the planes PL0 to PL15 are classified into, for example, a same power supply group, a different power supply group, and same-pair planes. The same power supply group is a set of planes PL that belong to the same plane group PG as the selected plane PL, and that constitute plane pairs PP different from the selected plane PL. The different power supply group is a set of planes PL that belong to a plane group PG different from the selected plane PL. The same-pair planes are a set of planes PL that belong to the same plane pair PP.

Figure 13:
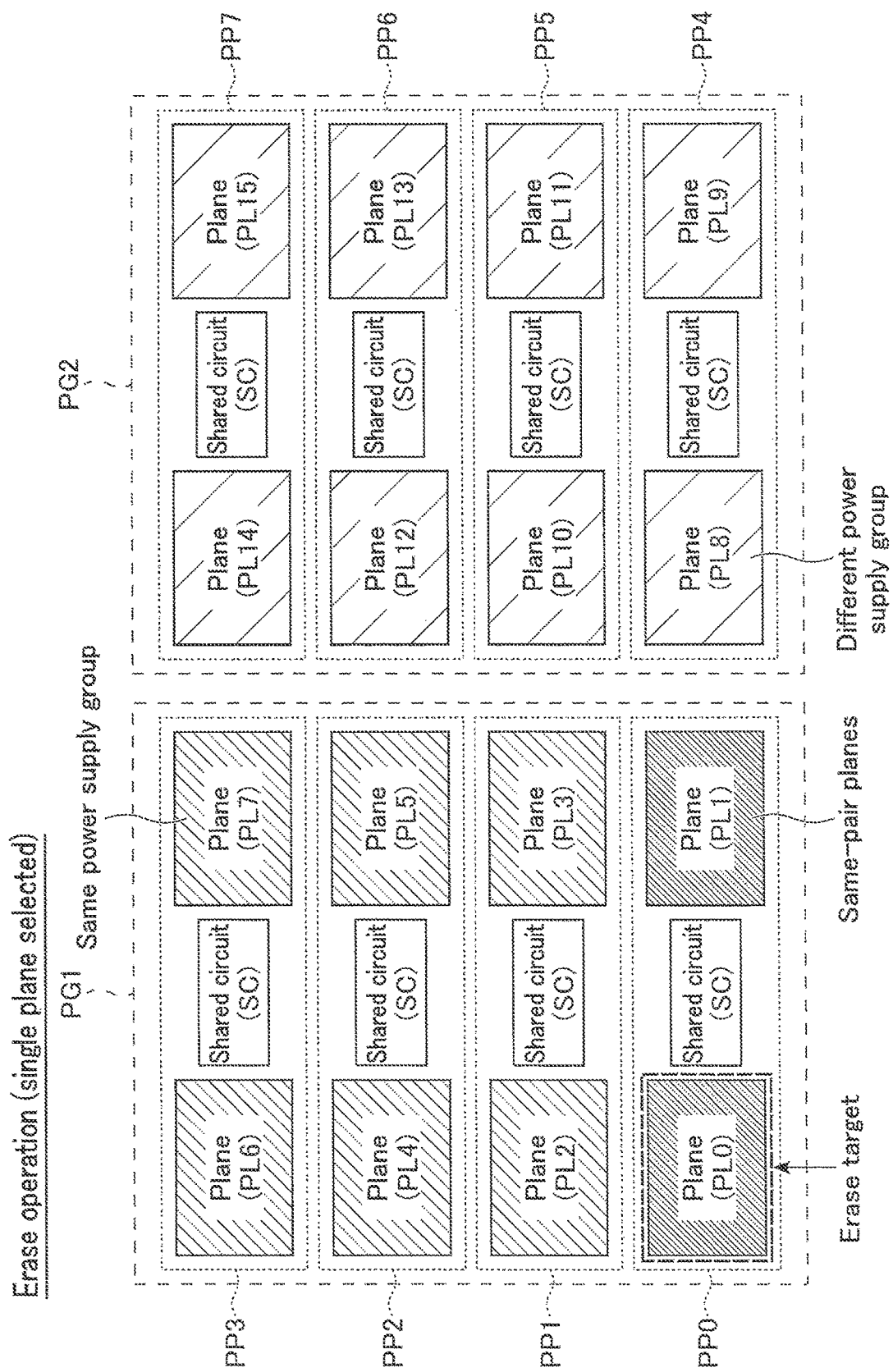
Figure 14:
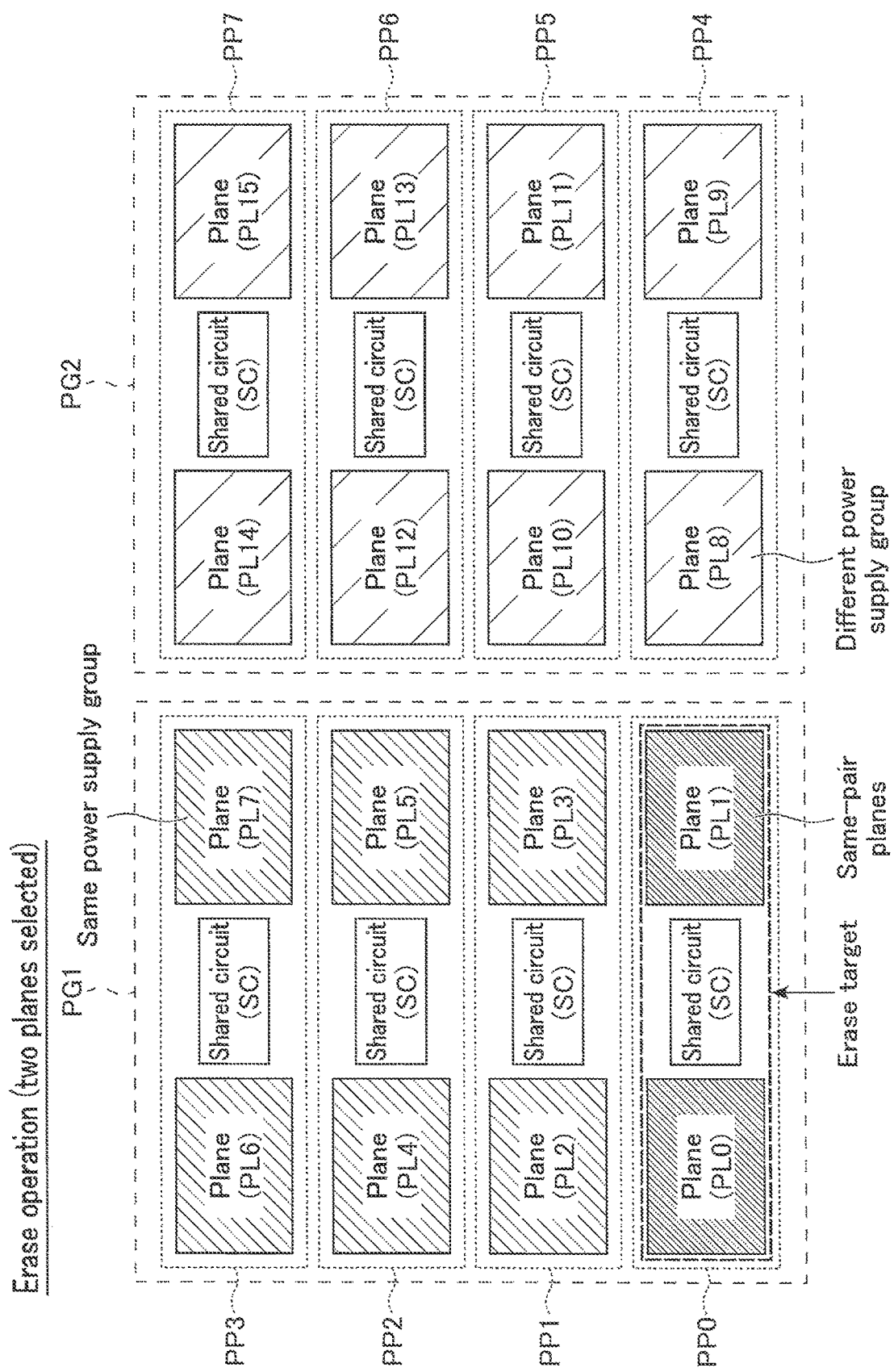

Each of FIGS. 13, 14, and 15 shows an example of a relationship between the selected plane PL and other planes PL in an erase operation of the semiconductor memory device according to the first embodiment. FIGS. 13, 14, and 15 correspond to cases where a single plane PL, two plane PL, and four plane PL are selected, respectively.

In the example shown in FIG. 13, a plane PL0 is selected as an erase target. In this case, the planes PL2 to PL7 belong to the same power supply group. The planes PL8 to PL15 belong to the different power supply group. The planes PL0 and PL1 belong to the same-pair planes.

In the example shown in FIG. 14, planes PL0 and PL1, that is, a plane pair PP0, is selected as an erase target. In this case, the planes PL2 to PL7 belong to the same power supply group. The planes PL8 to PL15 belong to the different power supply group. The planes PL0 and PL1 belong to the same-pair planes.

In the example shown in FIG. 15, planes PL0, PL1, PL8, and PL9, that is, plane pairs PP0 and PP4, are selected as erase targets. In this case, planes PL2 to PL7 and PL10 to PL15 belong to the same power supply group. The planes PL0, PL1, PL8, and PL9 belong to the same-pair planes. In this example, there is no plane PL that belongs to the different power supply group.

In the semiconductor memory device 10 according to the first embodiment, grouping is appropriately performed in accordance with the number and locations of the selected planes PL. The number and combination of the planes PL in which an erase operation is executed are not limited to the combinations described above, and may be set to any number and combination.

The semiconductor memory device 10 according to the first embodiment executes an erase operation using a command different from an erase operation described with reference to FIG. 12, in order to execute an interrupt process at high speed. In this erase operation, after the sequencer 14 starts an erase operation, the semiconductor memory device 10 transitions to the ready state, and the semiconductor memory device 10 proceeds with the erase operation in the ready state. Such an erase operation can shorten the period from the transition to the busy state to the transition back to the ready state, as in the "cache ready" described above, and is referred to as, for example, a cache erase operation. The semiconductor memory device 10 according to the first embodiment appropriately executes an interrupt process based on the above-described grouping and the timing at which the read command is received during a cache erase operation.

Hereinafter, an interrupt process in which the same power supply group is selected, an interrupt process in which the different power supply group is selected, and the interrupt process in which a same-pair plane is selected will be described in order. Hereinafter, a read operation that is executed as an interrupt process in parallel with an erase operation is referred to as a background read, and a read operation that is executed by suspending the erase operation is referred to as a suspend read.

[1-2-3-1] Interrupt Process in which Same Power Supply Group is Selected

Figure 16:
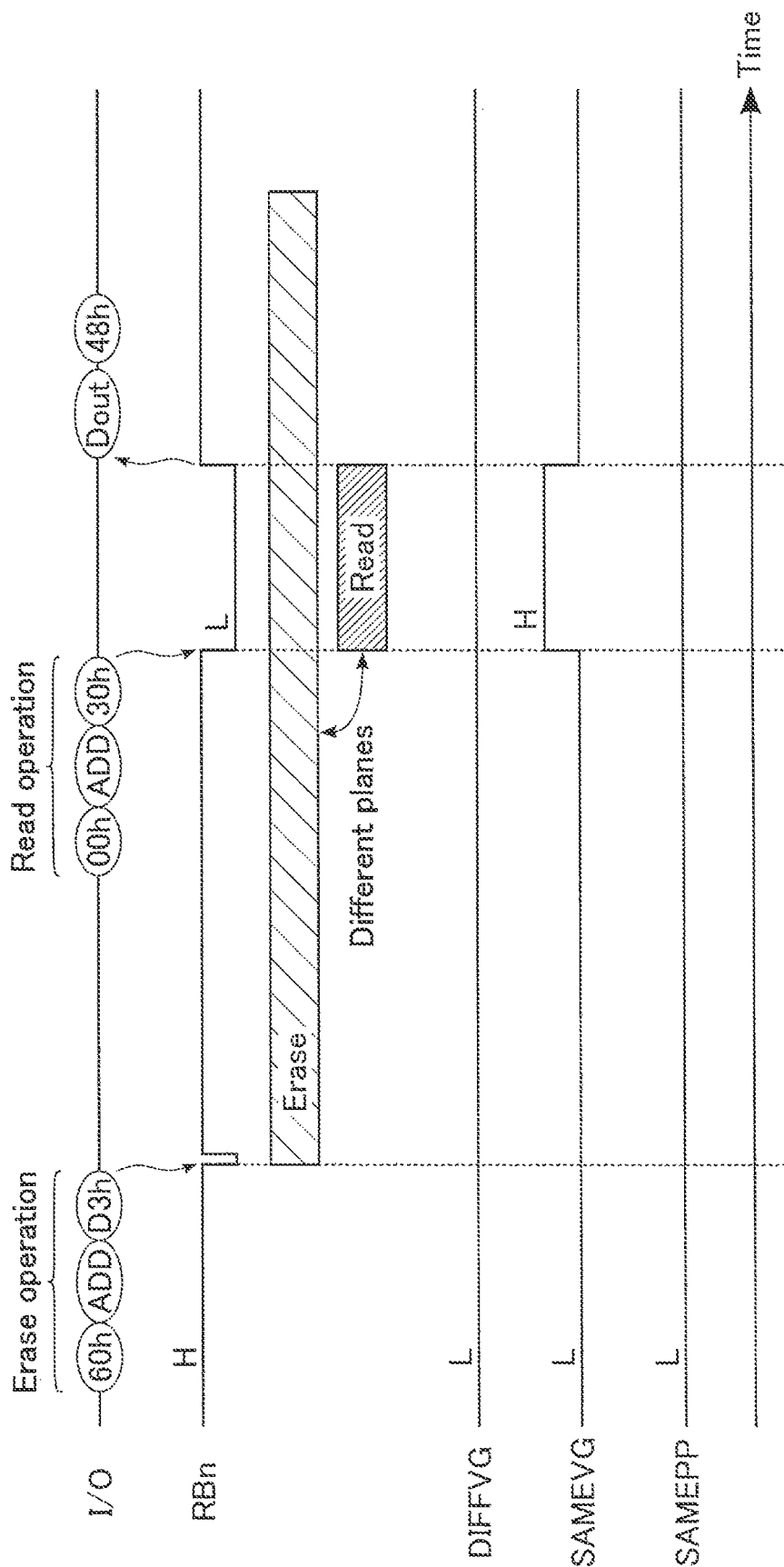
FIG. 16 is a command sequence and a timing chart for illustrating an erase operation and a background read in which a plane of a same power supply group is selected in the semiconductor memory device according to the first embodiment.

FIG. 16 shows an example of a command sequence and a timing chart of a cache erase operation and an interrupt process in which a plane of the same power supply group is selected in the semiconductor memory device 10 according to the first embodiment. Prior to various operations, the control signals DIFFVG, SAMEVG, and SAMEPP are at the "L" level.

As shown in FIG. 16, the memory controller sequentially transmits, for example, a command "60h", address information "ADD", and a command "D3h" to the semiconductor memory device 10. The command "D3h" is a command for instructing execution of a cache erase operation.

Upon receiving the command "D3h", the sequencer 14 causes the semiconductor memory device 10 to transition from the ready state to the busy state. Based on the received command and address information, the sequencer 14 starts an erase operation similar to the operation described with reference to FIG. 12 ("Erase" in FIG. 16).

Upon starting the erase operation, the sequencer 14 causes the semiconductor memory device 10 to transition from the busy state to the ready state. Thereafter, the semiconductor memory device 10 sequentially executes, in the ready state, processes corresponding to the periods (1) to (4) shown in FIG. 12.

When the semiconductor memory device 10 is in the ready state and before the erase operation ends, the memory controller sequentially transmits, for example, a command "00h", address information "ADD", and a command "30h" to the semiconductor memory device 10. This address information "ADD" contains information designating a plane PL that belongs to the same power supply group as a plane PL in which an erase operation is being executed.

Upon receiving the command "30h", the sequencer 14 causes the semiconductor memory device 10 to transition from the ready state to the busy state. Based on the received command and address information and the control signal generated by the determination circuit DC, the sequencer 14 starts a read operation as an interrupt process ("Read" in FIG. 16).

In this example, address information designating a plane PL of the same power supply group is input to the determination circuit DC. Thereby, the control signal SAMEVG turns to the "H" level, and both of the control signals DIFFVG and SAMEPP maintain the "L" level.

That is, the sequencer 14 executes a background read in which a plane PL of the same power supply group is selected, in parallel with an erase operation, based on the control signal SAMEVG turning to the "H" level. A detailed operation of the background read is similar to the read operation described with reference to FIG. 11, for example, and thus the description thereof will be omitted.

When a background read ends, the sequencer 14 causes the semiconductor memory device 10 to transition from the busy state to the ready state. At this time, the control signal SAMEVG output from the determination circuit DC returns to the "L" level, based on, for example, the processing relating to the read operation having completed. Upon detecting that the semiconductor memory device 10 is in the ready state after instructing a read operation, the memory controller causes the semiconductor memory device 10 to output read data ("Dout" in FIG. 16).

After receiving the read data, the memory controller transmits, for example, a command "48h" to the semiconductor memory device 10. The command "48h" is a command for notifying the semiconductor memory device 10 of the end of the interrupt process. Upon receiving the command "48h", the sequencer 14 continues to execute the erase operation.

The semiconductor memory device 10, which executes the erase operation in the ready state, remains in the ready state even after the erase operation has ended. On the other hand, when executing a write operation, an erase operation, etc. on another block BLK, the memory controller executes a status read. In the status read, the memory controller transmits, for example, a command "70h" to the semiconductor memory device 10. Upon receiving the command "70h", the semiconductor memory device 10 outputs status information STS containing information indicating whether or not the erase operation has ended to the memory controller. This allows the memory controller to confirm whether or not the erase operation of the semiconductor memory device 10 has ended.

The timing at which the above-described background read is executed may change based on the progress of the erase operation. Hereinafter, a plurality of types of timings at which the background read is executed in the semiconductor memory device 10 according to the first embodiment will be described as examples.

(In Case of Receiving Read Command During Voltage Rise Period)

Figure 17:
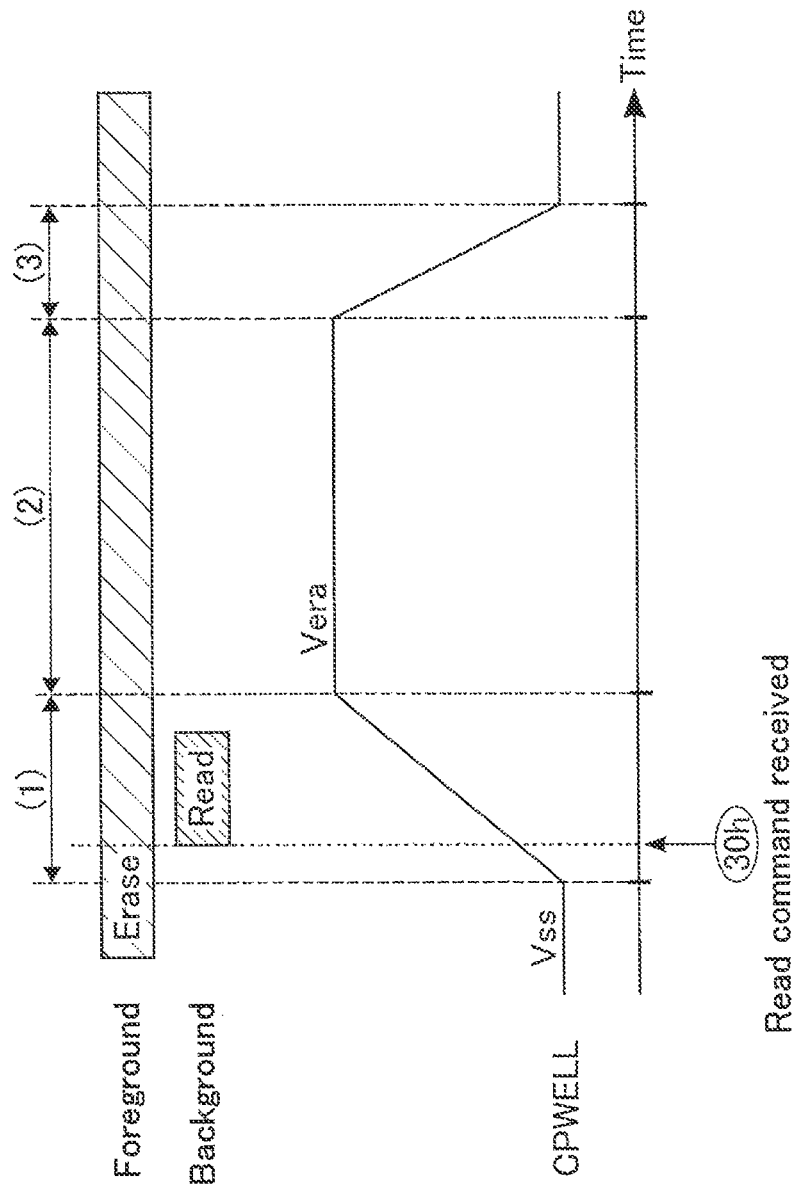
Figure 19:
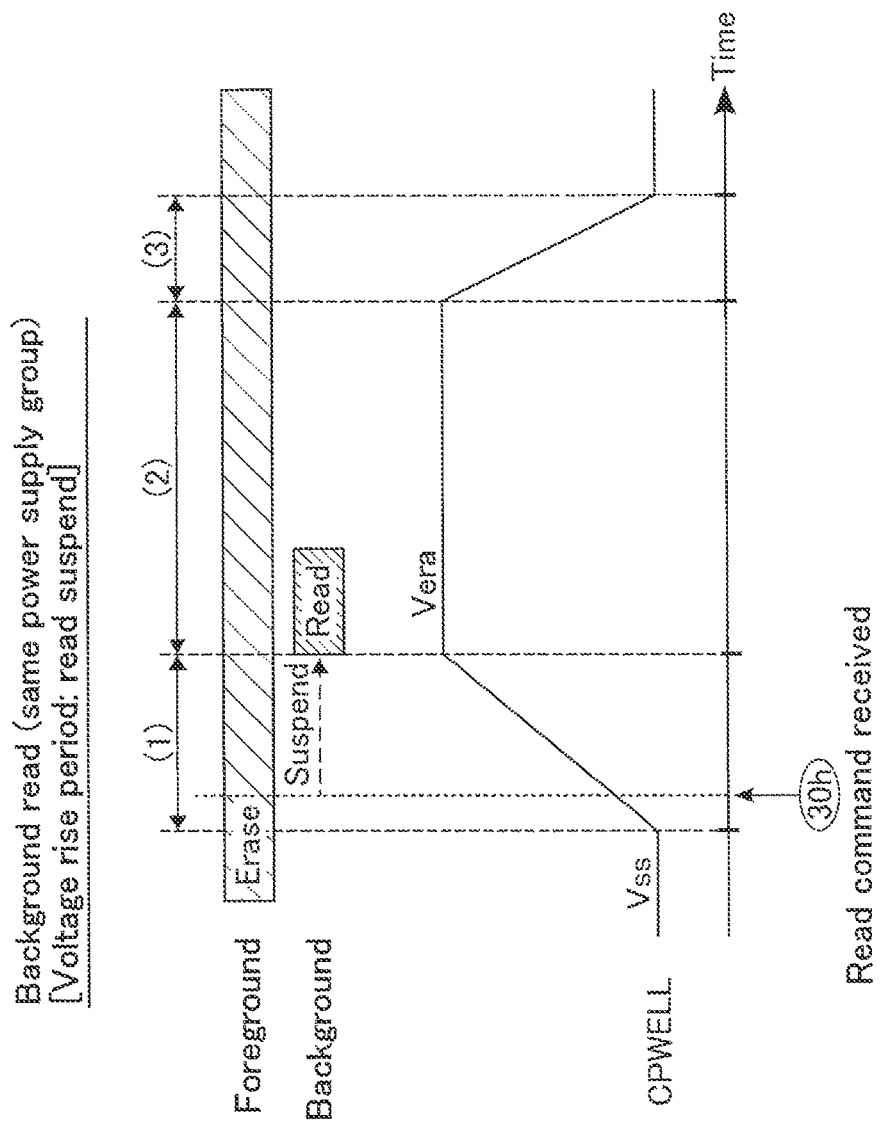

Each of FIGS. 17, 18, and 19 illustrates an example of an execution timing of a background read in which a plane PL of the same power supply group is selected in the semiconductor memory device 10 according to the first embodiment, and corresponds to an operation when the semiconductor memory device 10 has received a read command during a voltage rise period of an erase operation.

In similar drawings to be referred to below, a period of a foreground operation corresponding to an erase operation, a period of a background operation corresponding to a read operation executed as an interrupt process, and an example of voltages applied to a well line CPWELL of a plane PL in which the erase operation is being executed are shown.

In the example shown in FIG. 17, upon receiving a read command (for example, "30h") during a voltage rise period ((1) in FIG. 17), the semiconductor memory device 10 immediately starts a background read. In other words, after receiving a read command, the semiconductor memory device starts a background read without suspending the erase operation. That is, in this example, the process during the voltage rise period in the foreground erase operation and the process of the background read are executed in parallel.

In the example shown in FIG. 18, when the semiconductor memory device 10 receives a read command (for example, "30h") during a voltage rise period ((1) in FIG. 18), raising of the voltage of the well line CPWELL is stopped and a background read is immediately started. During the period in which the background read is being executed, the voltage of the well line CPWELL is maintained in, for example, the state at the point in time when the raising of the voltage has been stopped. When the background read ends, the semiconductor memory device 10 resumes raising the voltage of the well line CPWELL. That is, in this example, the process in the voltage rise period in the foreground erase operation is stopped during the period in which the background read process is being executed, and is resumed based on the background read process having ended.

In the example shown in FIG. 19, upon receiving a read command (for example, "30h") during a voltage rise period ((1) in FIG. 19), the semiconductor memory device 10 waits for the end of the voltage rise period and then starts a background read. In other words, after receiving a read command, the semiconductor memory device 10 suspends the background read during the voltage rise period, and starts the background read after the end of the voltage rise period. That is, in this example, the process of the voltage rise period in the foreground erase operation and the process of the background read are executed so as not to overlap each other.

(In Case of Receiving Read Command During Erase Period)

Each of FIGS. 20 and 21 illustrates an example of an execution timing of a background read in which a plane PL of the same power supply group is selected in the semiconductor memory device 10 according to the first embodiment, and corresponds to an operation when the semiconductor memory device 10 has received a read command during an erase period of an erase operation.

In the example shown in FIG. 20, upon receiving a read command (e.g., "30h") during an erase period ((2) in FIG. 20), the semiconductor memory device 10 immediately starts a background read. In other words, after receiving a read command, the semiconductor memory device 10 starts a background read without suspending the erase operation. That is, in this example, the process of the erase period in the foreground erase operation and the process of the background read are executed in parallel.

In the example shown in FIG. 21, upon receiving a read command (for example, "30h") during an erase period ((2) in FIG. 21), the semiconductor memory device 10 waits for the end of the erase period and then starts a background read. In other words, after receiving a read command, the semiconductor memory device 10 suspends the background read during the erase period, and starts the background read based on the erase period having ended. That is, in this example, the process of the erase period in the foreground erase operation and the process of the background read are executed so as not to overlap each other.

(In Case of Receiving Read Command During Voltage Drop Period)

Figure 22:
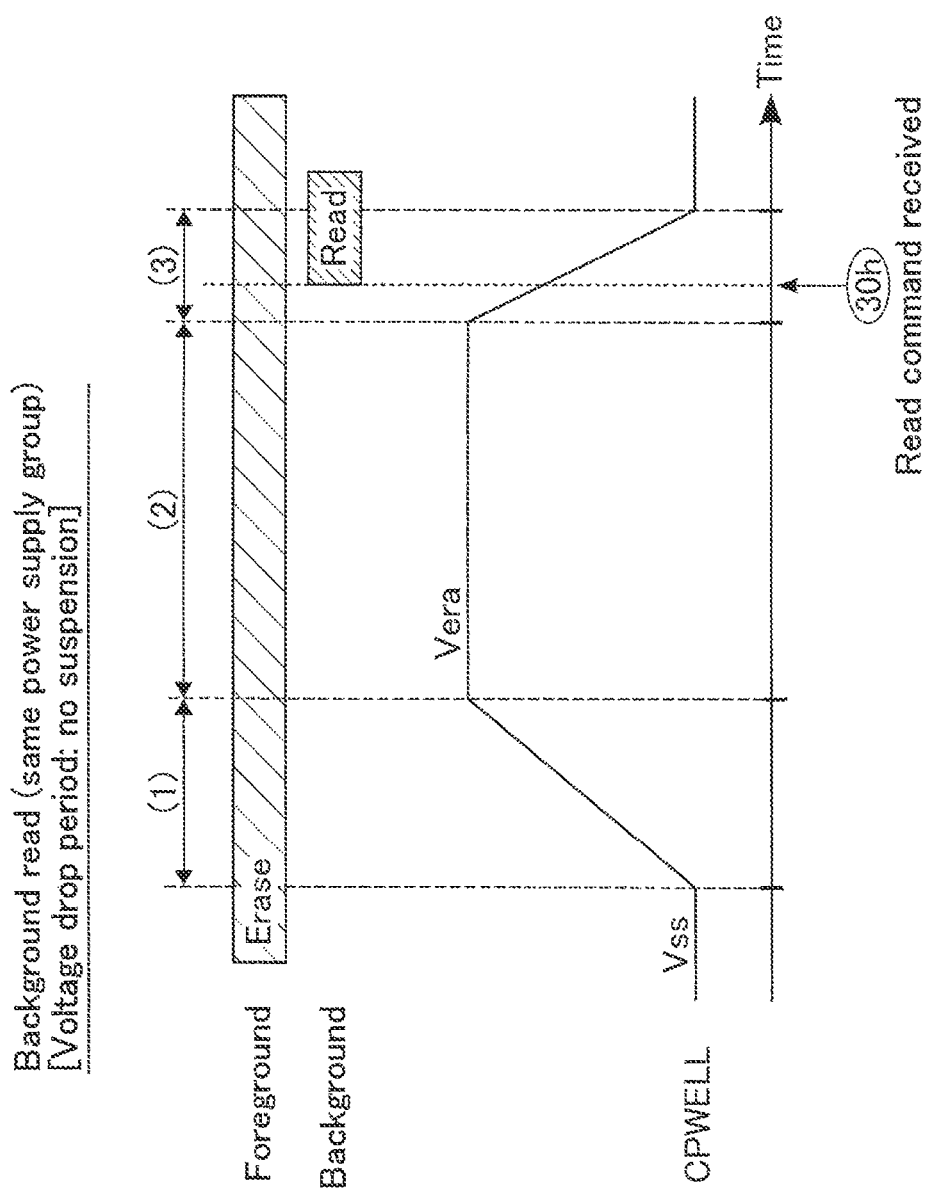
FIG. 22 is a timing chart for illustrating an example of a more detailed execution timing of a background read in which a plane of the same power supply group is selected in the semiconductor memory device according to the first embodiment.

Each of FIGS. 22 and 23 illustrates an example of an execution timing of a background read in which a plane PL of the same power supply group is selected in the semiconductor memory device 10 according to the first embodiment, and corresponds to an operation when the semiconductor memory device 10 has received a read command during a voltage drop period of an erase operation.

In the example shown in FIG. 22, upon receiving a read command (e.g., "30h") during a voltage drop period ((3) in FIG. 22), the semiconductor memory device 10 immediately starts a background read. In other words, after receiving a read command, the semiconductor memory device 10 starts a background read without suspending the erase operation. That is, in this example, the process during the voltage drop period in the foreground erase operation and the process of the background read are executed in parallel.

In the example shown in FIG. 23, upon receiving a read command (e.g., "30h") during a voltage drop period ((3) in FIG. 23), the semiconductor memory device 10 waits for the end of the voltage drop period and then starts a background read. In other words, after receiving a read command, the semiconductor memory device 10 suspends the background read during the voltage drop period, and starts the background read based on the voltage drop period having ended. That is, in this example, the process of the voltage drop period in the foreground erase operation and the process of the background read are executed so as not to overlap each other.

(In Case of Receiving Read Command During Erase Verify Period)

Figure 25:
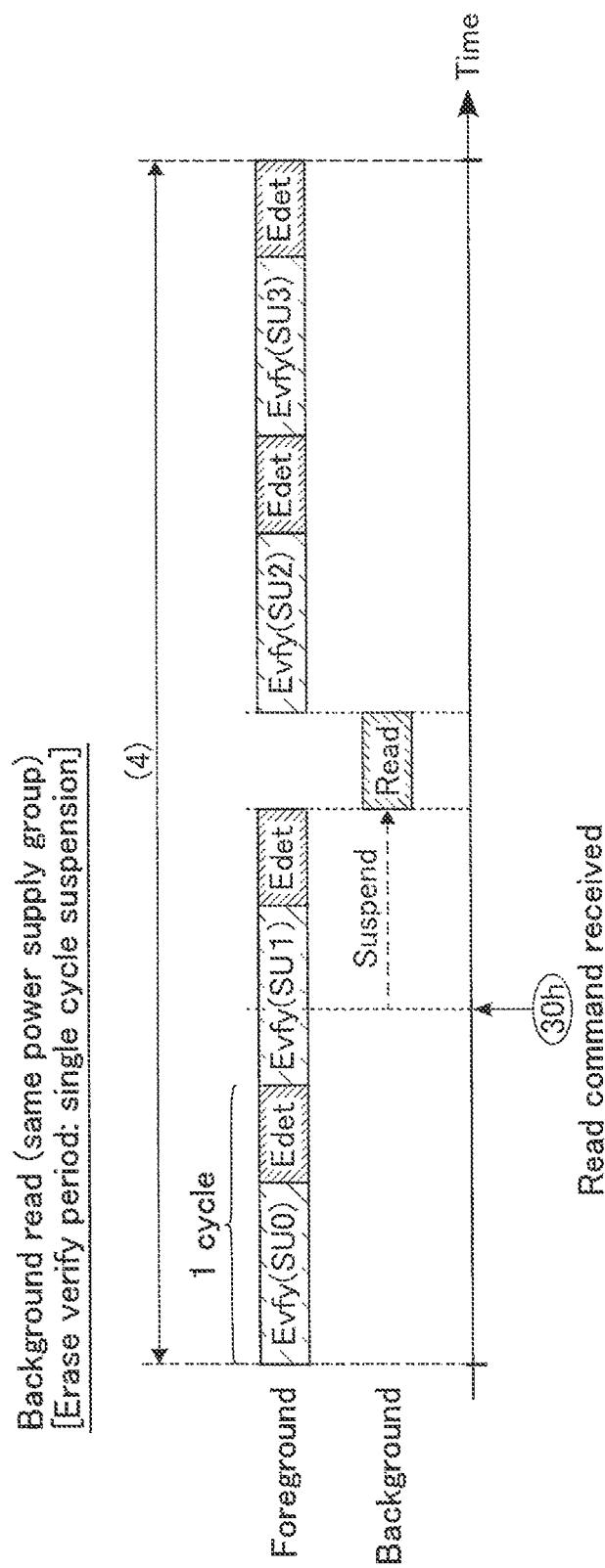
FIG. 25 is a command sequence and a timing chart for illustrating an erase operation and a background read in which a plane of a different power supply group is selected in the semiconductor memory device according to the first embodiment.

Each of FIGS. 24 and 25 illustrates an example of an execution timing of a background read in which a plane PL of the same power supply group is selected in the semiconductor memory device 10 according to the first embodiment, and corresponds to an operation when the semiconductor memory device 10 has received a read command during an erase verify period of an erase operation.

In similar drawings to be referred to below, an operation when an erase verify is executed in units of string units SU in an erase verify period is illustrated. In a block BLK, an erase verify is executed in the order of, for example, the string units SU0 to SU3. A read operation and a detect operation in a single cycle of erase verify is represented as "Evfy" and "Edet", respectively. In the detect operation, it is determined whether or not the erase verify of the string unit SU has been passed based on the result of the read operation in the erase verify executed immediately before.

In the example shown in FIG. 24, upon receiving a read command (e.g., "30h") during an erase verify period ((4) in FIG. 24), the semiconductor memory device 10 immediately starts a background read. In other words, after receiving a read command, the semiconductor memory device 10 starts a background read without suspending the erase operation. That is, in this example, the process of the erase verify period in the foreground erase operation and the process of a background read are executed in parallel.

In the example shown in FIG. 25, upon receiving a read command (for example, "30h") during an erase verify period ((4) in FIG. 25), the semiconductor memory device 10 waits for the end of a single cycle of erase verify and then starts a background read. In other words, the semiconductor memory device 10 suspends a background read during a period in which a single cycle of erase verify is executed at the time of reception of a read command. Based on a single cycle of erase verify having ended, the semiconductor memory device 10 starts a background read. When the background read ends, the semiconductor memory device 10 resumes the erase verify on the next string unit SU.

Specifically, upon receiving, for example, a read command while an erase verify is being executed on a string unit SU1, the semiconductor memory device 10 suspends a background read until the erase verify (i.e., a set of a read operation "Evfy" and a detect operation "Edet") on the string unit SU1 is ended.

Based on the detect operation of the erase verify in the string unit SU1 having ended, the semiconductor memory device 10 starts a background read. Based on the background read having ended, the semiconductor memory device 10 starts an erase verify on a string unit SU2. As described above, in this example, the process of a single cycle of erase verify in the foreground erase operation and the process of a background read are executed so as not to overlap each other.

[1-2-3-2] Interrupt Process in which Different Power Supply Group is Selected

Figure 26:
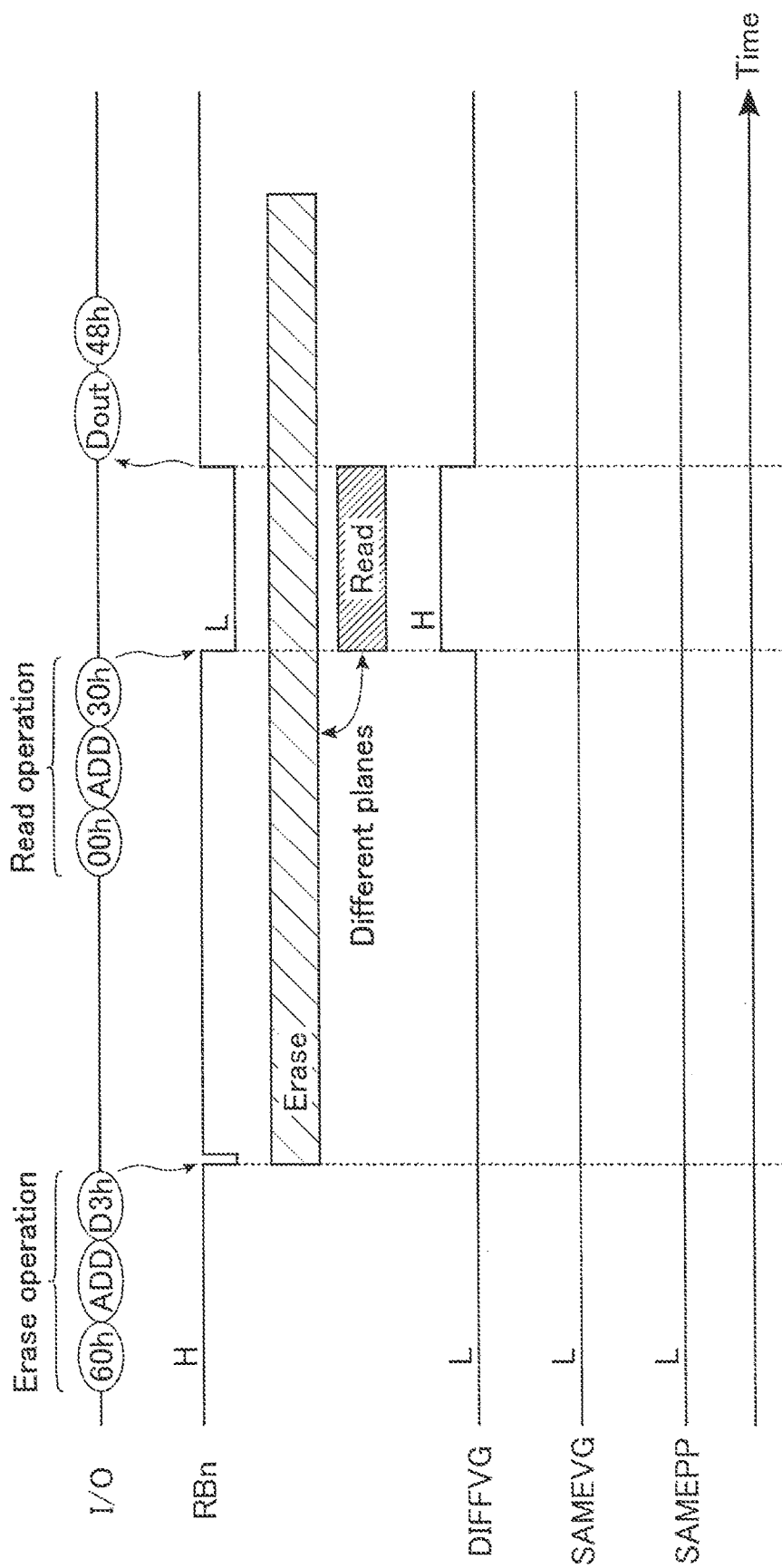
FIG. 26 is a command sequence and a timing chart for illustrating an erase operation and a suspend read in which a same-pair plane is selected in the semiconductor memory device according to the first embodiment.

FIG. 26 shows an example of a command sequence and a timing chart of a cache erase operation and an interrupt process in which a plane of the different power supply group is selected in the semiconductor memory device 10 according to the first embodiment.

As shown in FIG. 26, an operation in an interrupt process in which a plane of the different power supply group is selected is different from an operation in an interrupt process in which a plane of the same power supply group is selected, described with reference to FIG. 16, in terms of the type of the control signal that is turned to the "H" level.

Specifically, in this example, address information that designates a plane PL of the different power supply group is input to the determination circuit DC. Thereby, the control signal DIFFVG turns to the "H" level, and both of the control signals SAMEVG and SAMEPP maintain the "L" level.

Upon receiving a read commend (e.g., "30h") during an erase operation, the sequencer 14 executes a background read in which a plane PL of the different power supply group is selected, in parallel with an erase operation, based on the control signal DIFFVG turning to the "H" level.

When a background read ends, the sequencer 14 causes the semiconductor memory device 10 to transition from the busy state to the ready state. At this time, the control signal DIFFVG output from the determination circuit DC returns to the "L" level, based on, for example, the processing relating to the read operation having completed. The other operations in FIG. 26 are similar to those in the command sequence and the timing chart described with reference to FIG. 16, for example, and the description thereof will be omitted.

The background read in which the different power supply group is selected may be executed without suspension. That is, a background read in which the different power supply group is selected can be immediately executed in any period of the erase operation in the foreground. The configuration is not limited thereto, and a background read in which the different power supply group is selected may be executed at a similar timing to that in the background read in which the same power supply group is selected.

[1-2-3-3] Interrupt Process in which Same-Pair Plane is Selected

Figure 27:
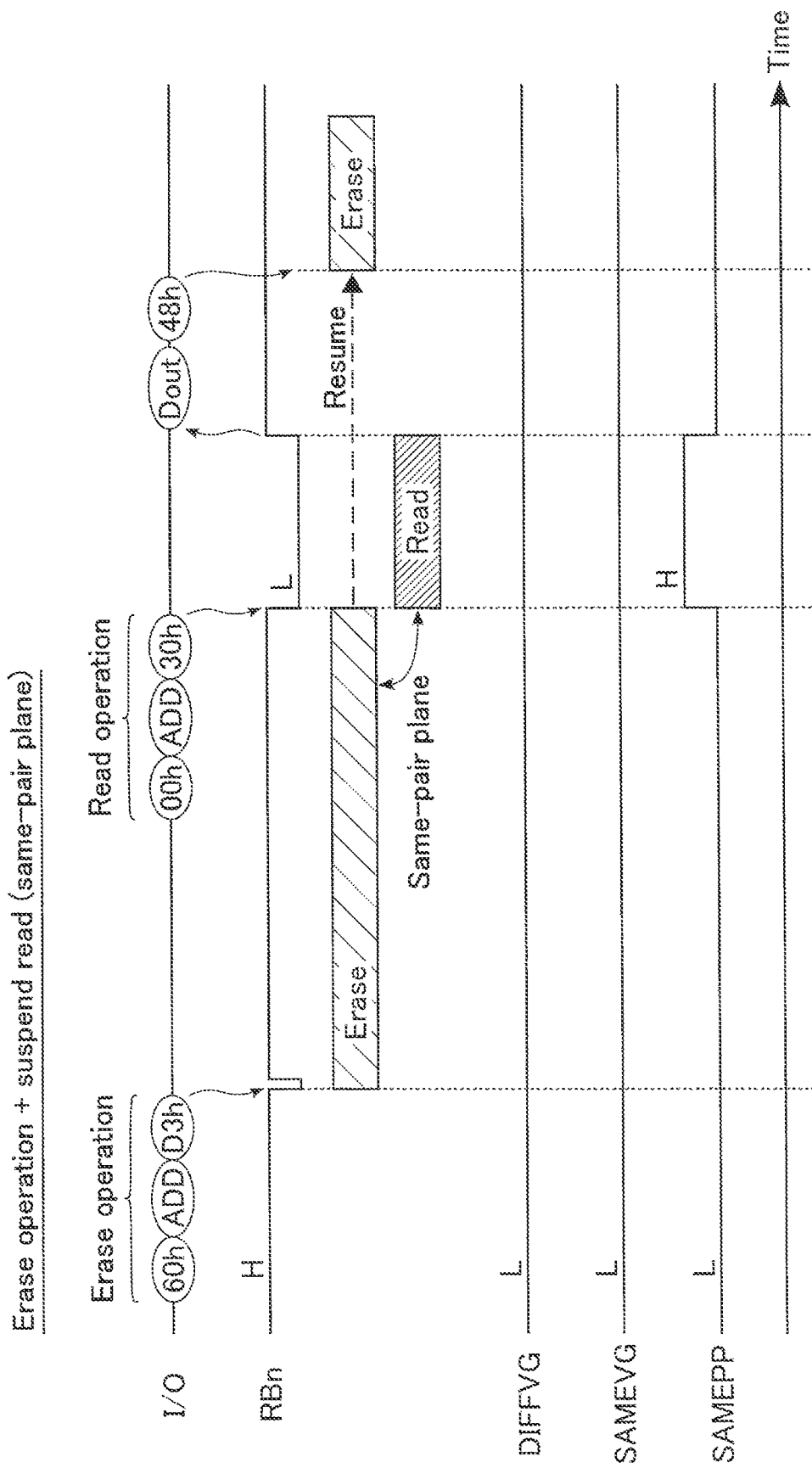
FIG. 27 is a timing chart for illustrating an example of a more detailed execution timing of a suspend read in which a same-pair plane is selected in the semiconductor memory device according to the first embodiment.

FIG. 27 shows an example of a command sequence and a timing chart of a cache erase operation and an interrupt process in which a same-pair plane is selected in the semiconductor memory device 10 according to the first embodiment.

As shown in FIG. 27, an operation in an interrupt process in which a same-pair plane is selected is different from an operation in an interrupt process in which a plane of the same power supply group is selected, described with reference to FIG. 16, in terms of the control signal that is turned to the "H" level and the period during which an erase operation is executed.

Specifically, in this example, address information that designates a same-pair plane is input to the determination circuit DC. Thereby, the control signal SAMEPP turns to the "H" level, and both of the control signals DIFFVG and SAMEVG maintain the "L" level.

Upon receiving a read command (e.g., "30h") during an erase operation, the sequencer 14 suspends an erase operation in the foreground based on the control signal SAMEPP turning to the "H" level, and executes a suspend read in which a same-pair plane is selected. A detailed operation of the suspend read is similar to the read operation described with reference to FIG. 11, for example, and thus the description thereof is omitted.

When the suspend read ends, the sequencer 14 causes the semiconductor memory device 10 to transition from the busy state to the ready state. At this time, the control signal SAMEPP output from the determination circuit DC returns to the "L" level, based on, for example, the processing relating to the read operation having completed. Upon detecting that the semiconductor memory device 10 is in the ready state after instructing a read operation, the memory controller causes the semiconductor memory device 10 to output read data ("Dout" in FIG. 27).

After receiving the read data, the memory controller transmits, for example, a command "48h" to the semiconductor memory device 10. Upon receiving the command "48h", the sequencer 14 resumes the erase operation.

The timing at which the above-described suspend read is executed may change based on the progress of the erase operation. Hereinafter, a plurality of types of timings at which the suspend read is executed in the semiconductor memory device 10 according to the first embodiment will be described as examples.

(In Case of Receiving Read Command During Erase Period)

Each of FIGS. 28, 29, 30 and 31 shows an example of an execution timing of a suspend read in which a plane PL of the same-pair planes is selected in the semiconductor memory device 10 according to the first embodiment, and corresponds to an operation when the semiconductor memory device 10 has received a read command during an erase period of an erase operation.

In each of FIGS. 28, 29, 30, and 31, the number of steps in the erase period is illustrated. In this example, the semiconductor memory device 10 ends the erase period based on the execution of steps "0" to "9" of the erase period. In the examples shown in FIGS. 29, 30, and 31, a single interrupt process is executed in the erase period, and the erase operation is divided into a first period and a second period.

Figure 28:
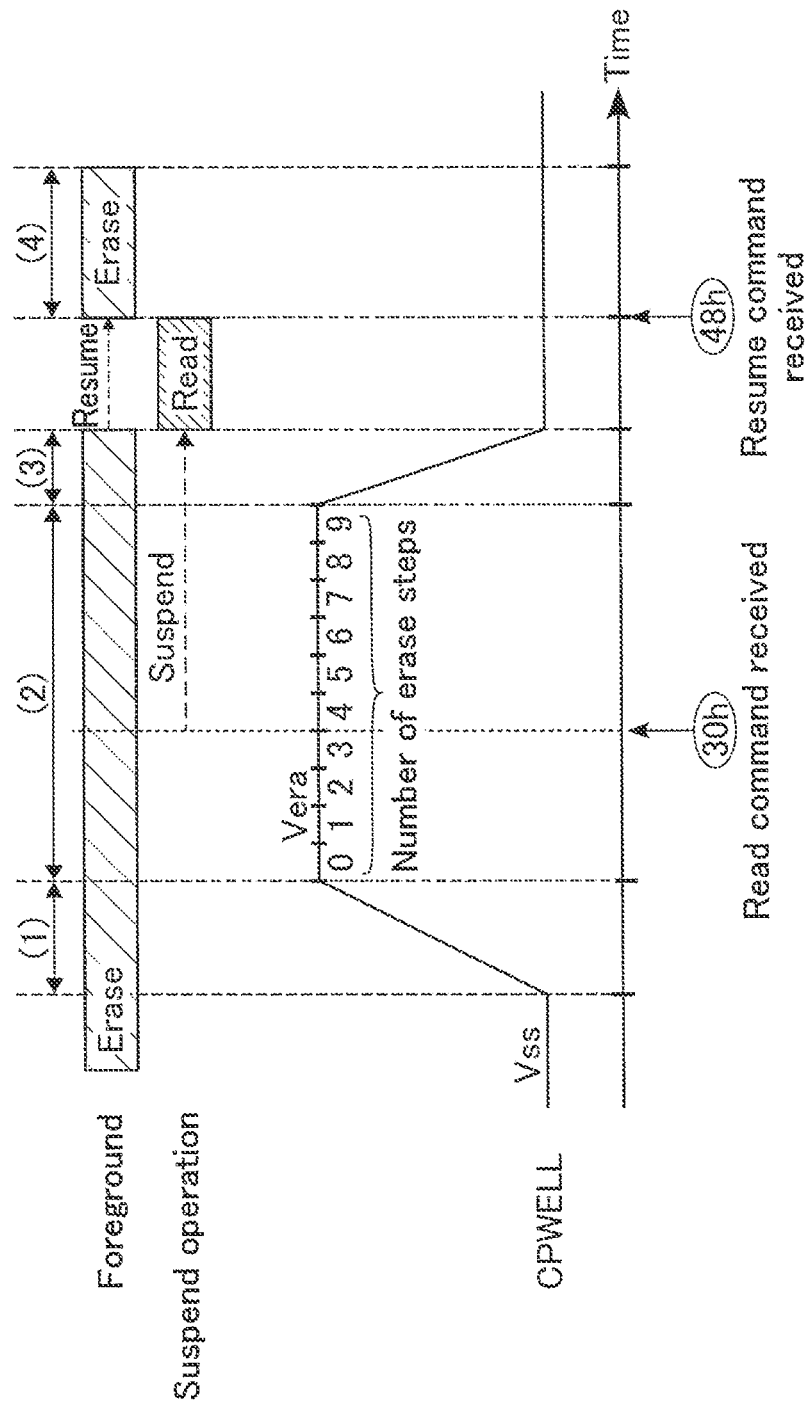

In the example shown in FIG. 28, upon receiving a read command (e.g., "30h") during an erase period (first period (2) in FIG. 28), the semiconductor memory device 10 executes the steps of the erase period up to a predetermined step, and completes the erase process. Based on the drop of the voltage of the well line CPWELL to Vss, the semiconductor memory device 10 starts a suspend read. When the suspend read ends, the memory controller transmits a command "48h". When the semiconductor memory device 10 receives the command "48h", the sequencer 14 resumes the erase operation, and starts the process of an erase verify period. In other words, upon receiving a read command, the semiconductor memory device 10 executes a suspend read after the process of the erase period and the process of the voltage drop period have ended and before the erase verify period.

Figure 29:
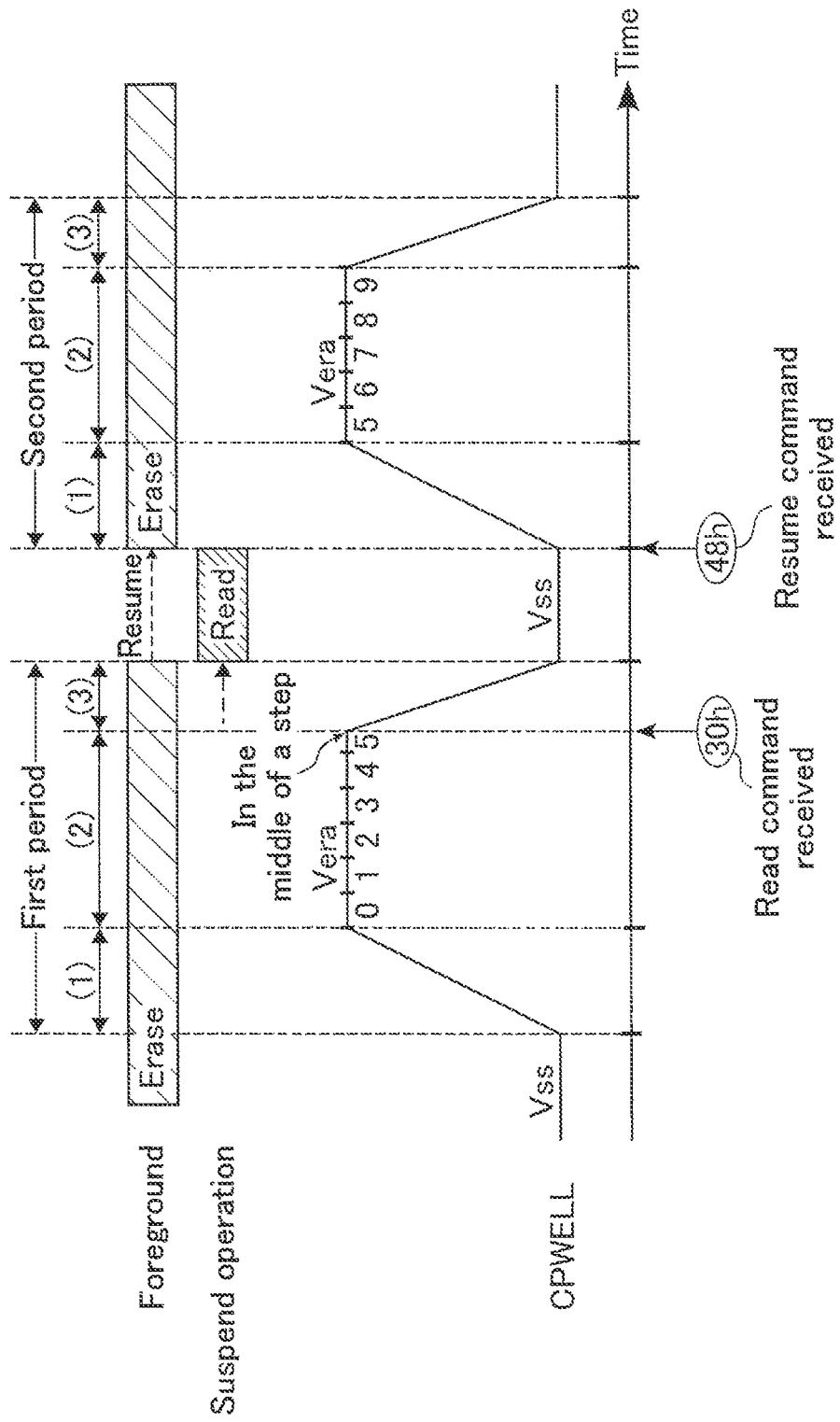

In the example shown in FIG. 29, upon receiving a read command (e.g., "30h") during an erase period (first period (2) in FIG. 29), the semiconductor memory device 10 immediately suspends the erase operation and starts a suspend read. Specifically, upon receiving, for example, a read command in the middle of the process at step "5" of the erase period, the semiconductor memory device 10 immediately drops the voltage of the well line CPWELL (first period (3) in FIG. 29). When the voltage of the well line CPWELL drops to Vss, the semiconductor memory device executes a suspend read on a same-pair plane.

When the suspend read ends, the memory controller transmits a command "48h". When the semiconductor memory device 10 receives the command "48h", the sequencer 14 resumes the erase operation and raises the voltage of the well line CPWELL (second period (1) in FIG. 29). When the voltage of the well line CPWELL rises to Vera, the sequencer 14 resumes counting the erase period from the count at the time of suspension of the erase operation. That is, in this example, the sequencer 14 resumes the process of the erase period from the process at step "5". Based on the process at step "9" in the erase period having completed, the sequencer 14 ends the processing of the erase period, and shifts to the processing of the erase verify period.

Figure 30:
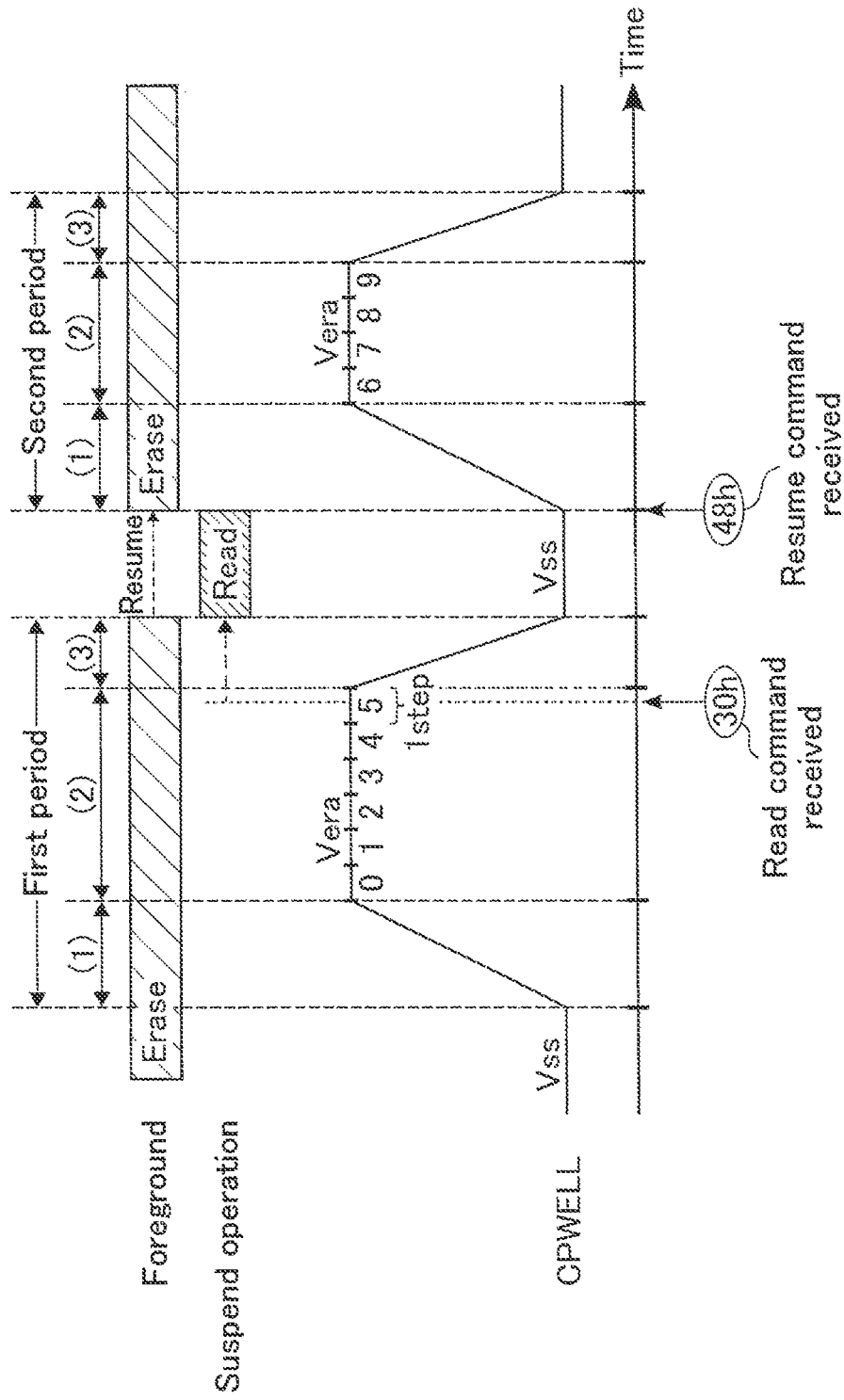

In the example shown in FIG. 30, upon receiving a read command (e.g., "30h") during an erase period (first period (2) in FIG. 30), the semiconductor memory device 10 suspends the erase operation based on the processing of the step at the time of reception of the read command having ended, and starts a background read. In other words, upon receiving a read command, the semiconductor memory device suspends the interrupt process until a single step of processing is ended in the erase period, and then starts a suspend read.

Specifically, upon receiving, for example, a read command in the middle of the process of step "5" in the erase period, the semiconductor memory device 10 continues the processing period until the process at step "5" is completed. After the process at step "5" is completed, the semiconductor memory device 10 drops the voltage of the well line CPWELL (first period (3) in FIG. 30). When the voltage of the well line CPWELL drops to Vss, the semiconductor memory device 10 executes a suspend read on a same-pair plane.

When the suspend read ends, the memory controller transmits a command "48h". When the semiconductor memory device 10 receives the command "48h", the sequencer 14 resumes the erase operation and raises the voltage of the well line CPWELL (second period (1) in FIG. 30). When the voltage of the well line CPWELL rises to Vera, the sequencer 14 resumes the processing of the erase period, starting from the last cycle in the first period. That is, in this example, the sequencer 14 resumes the processing from step "6", subsequent to step "5". Based on the process at step "9" in the erase period having completed, the sequencer 14 ends the processing of the erase period, and shifts to the processing of the erase verify period.

In the example shown in FIG. 31, upon receiving a read command (e.g., "30h") during an erase period (first period (2) in FIG. 31), the semiconductor memory device 10 suspends an erase operation based on the process at the step subsequent to the step at the time of reception of the read command having ended, and starts a background read. In other words, upon receiving a read command, the semiconductor memory device 10 suspends the interrupt process until two steps of processing are ended in the erase period, and then starts a suspend read.

Specifically, upon receiving, for example, a read command in the middle of the process at step "5" in the erase period, the semiconductor memory device 10 continues the processing period until the process at step "6" subsequent to step "5" is completed. After the process at step "6" is completed, the semiconductor memory device 10 drops the voltage of the well line CPWELL (first period (3) in FIG. 31). When the voltage of the well line CPWELL drops to Vss, the semiconductor memory device 10 executes a suspend read on a same-pair plane.

When the suspend read ends, the memory controller transmits a command "48h". When the semiconductor memory device 10 receives the command "48h", the sequencer 14 resumes the erase operation in the foreground and raises the voltage of the well line CPWELL (second period (1) in FIG. 31). When the voltage of the well line CPWELL rises to Vera, the sequencer 14 resumes the processing of the erase period, starting from the last cycle in the first period. That is, in this example, the sequencer 14 resumes the processing from step "7", subsequent to step "6". Based on the counting of step "9" in the erase period, the sequencer 14 ends the processing of the erase period, and shifts to the processing of the erase verify period.

The number of steps from the reception of the read command to the suspension of the erase operation may be set to a given numerical value. The semiconductor memory device may start an interrupt process after processing the erase period to the end, depending on the number of steps until the erase operation is suspended and the timing at which the read command is received.

In the example shown in FIG. 30, for example, upon receiving a read command in the middle of the process at "9" of the cycle, the semiconductor memory device 10 may execute an interrupt process after the process at "9" of the cycle is completed. In the example shown in FIG. 31, upon receiving a read command in the middle of the process at "8" or "9" of the cycle, the semiconductor memory device 10 may execute an interrupt process after the process at "9" of the cycle is completed.

(In Case of Receiving Read Command During Erase Verify Period)

Figure 33:
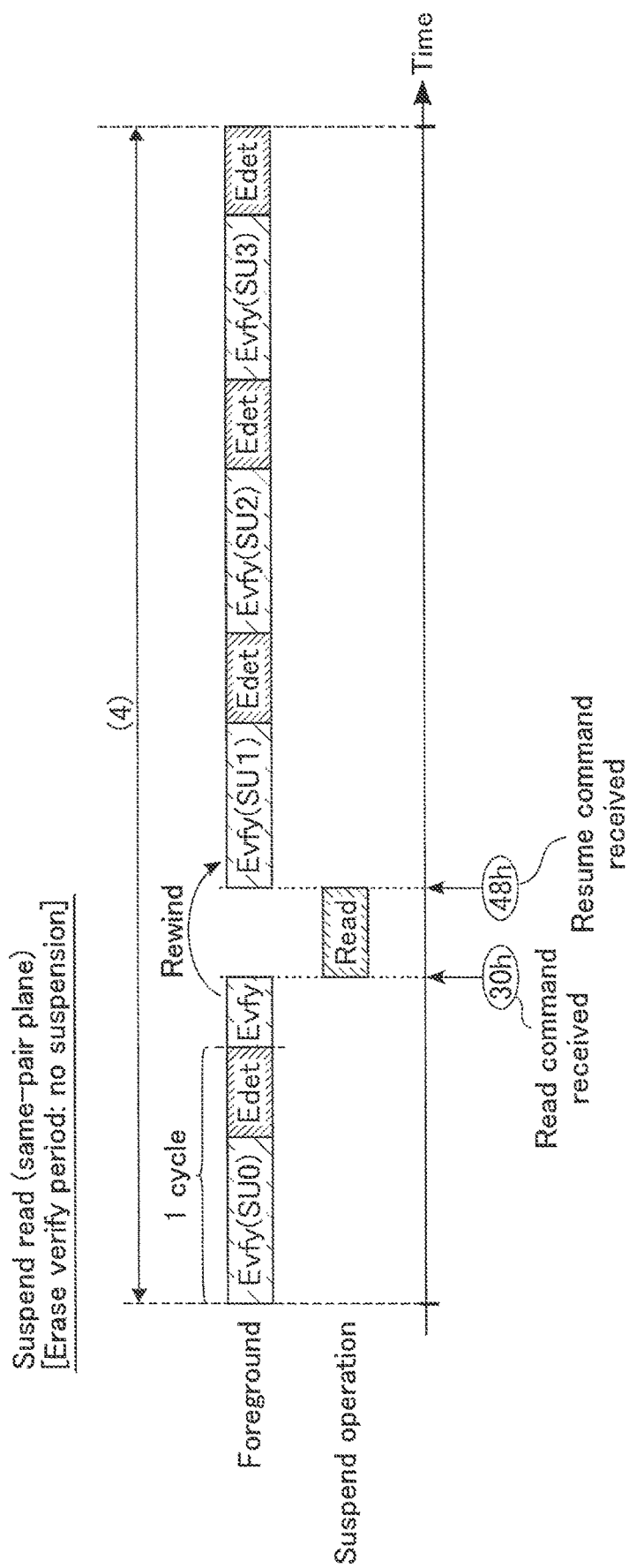
FIG. 33 is a timing chart for illustrating an example of a more detailed execution timing of a suspend read in which a same-pair plane is selected in the semiconductor memory device according to the first embodiment.

Each of FIGS. 32 and 33 illustrates an example of an execution timing of a background read in which a plane PL of the same power supply group is selected in the semiconductor memory device 10 according to the first embodiment, and corresponds to an operation when the semiconductor memory device 10 has received a read command during an erase verify period of an erase operation.

In the example shown in FIG. 32, upon receiving a read command (e.g., "30h") during an erase verify period ((4) in FIG. 32), the semiconductor memory device 10 starts an interrupt process (a read operation) after completing an erase verify on all the string units SU that are the targets of the erase verify. In other words, the semiconductor memory device 10 completes the process of the erase verify period that is being executed at the time of reception of a read command, and then executes a suspend read.

Specifically, upon receiving, for example, a read command while an erase verify is being executed on a string unit SU1, the semiconductor memory device 10 suspends the interrupt process until the erase verify on each of the string units SU1, SU2, and SU3 ends. When a detect operation of the erase verify in the string unit SU3 ends, the semiconductor memory device 10 starts an interrupt process based on reception of the command "48h". In this example, since the erase operation has ended at the start of the interrupt process, the resume process of the erase operation based on the command "48h" described with reference to FIG. 27 may be omitted.

In the example shown in FIG. 33, upon receiving a read command (e.g., "30h") during an erase verify period ((4) in FIG. 33), the semiconductor memory device 10 immediately starts a suspend read. In other words, the semiconductor memory device 10 suspends the process of the erase verify period that is being executed at the time of reception of the read command, and executes a suspend read. When the suspend read ends, the memory controller transmits a command "48h". When the semiconductor memory device 10 receives the command "48h", the suspended cycle of erase verify is rewound and resumed. That is, the semiconductor memory device 10 executes the suspended cycle of erase verify from the start.

Specifically, upon receiving, for example, a read command while an erase verify is being executed on a string unit SU1, the semiconductor memory device 10 immediately executes a suspend read. When the suspend read ends, the semiconductor memory device 10 executes an erase verify on the string unit SU1 again from the start.

The timing at which the semiconductor memory device 10 executes a suspend read in which a same-pair plane is selected is not limited to the above-described example. The semiconductor memory device 10 may execute, for example, a suspend read on the same-pair plane based on a single cycle of erase verify having ended, as described with reference to FIG. 25.

[1-3] Advantageous Effect of First Embodiment

The semiconductor memory device 10 according to the first embodiment described above is capable of improving the latency of the semiconductor memory device 10. Hereinafter, an advantageous effect of the first embodiment will be described in detail using a comparative example.

FIG. 34 shows an example of a command sequence and a timing chart in a suspend read during an erase operation according to a comparative example of the first embodiment. As shown in FIG. 34, in the comparative example of the first embodiment, an erase operation described with reference to FIG. 11 is executed, and the semiconductor memory device 10 transitions to the busy state. Upon receiving an instruction for a read operation from an external host device while the semiconductor memory device 10 is executing an erase operation, the memory controller transmits a command "FFh" to the semiconductor memory device 10. The command "FFh" is a command for instructing the semiconductor memory device 10 to suspend the operation that is being processed.

Upon receiving the command "FFh", the semiconductor memory device 10 suspends the erase operation, and transitions to the ready state after the suspend process is completed. Based on the semiconductor memory device 10 turning to the ready state, the memory controller transmits, for example, a command "ooh", address information "ADD", and a command "30h" to the semiconductor memory device 10.

Upon receiving the command "30h", the semiconductor memory device 10 transitions to the busy state and executes a read operation (suspend read) based on the received command, etc. When the suspend read ends, the semiconductor memory device 10 transitions to the ready state and outputs read data "Dout" to the memory controller based on an instruction from the memory controller.

After reception of the read data is completed, the memory controller continuously transmits, for example, a command "27h" and the same command set as that of the suspended erase operation to the semiconductor memory device 10. The command "27h" is a command for instructing the semiconductor memory device 10 to resume the suspended operation. Upon receiving the command "D0h", the semiconductor memory device 10 transitions to the busy state, and resumes the erase operation.

When a suspend read is executed as in the comparative example of the first embodiment described above, an erase operation does not proceed while a suspend read is being executed. Therefore, in the comparative example of the first embodiment, the progress of the erase operation may be delayed. In addition, in the comparative example of the first embodiment, since the memory controller suspends the semiconductor memory device 10 and then transmits a command for the read operation, the time required for these processes may affect latency reduction.

In contrast, the semiconductor memory device 10 according to the first embodiment uses a command "D3h" in execution of the erase operation, and uses a cache erase operation in which an erase operation is progressed in the ready state. When an instruction to execute a read operation as an interrupt process is received in the middle of an erase operation, the semiconductor memory device 10 according to the first embodiment changes the method of executing an interrupt process based on the relationship between a plane PL in which an erase operation is being executed and a plane PL selected in an interrupt process.

In each of the cases where a plane PL of the same power supply group is selected and a plane PL of the different power supply group is selected in an interrupt process, the semiconductor memory device 10 executes an erase operation in the foreground and a read operation as an interrupt process in parallel. When a same-pair plane is selected in an interrupt process, the semiconductor memory device 10 suspends the erase operation in the foreground and then executes a read operation as an interrupt process.

Furthermore, in the semiconductor memory device 10 according to the first embodiment, an interrupt process is executed by suitably adjusting the execution timing of the interrupt process based on the timing of reception of the read command and the state of progress of the erase operation.

For example, in the case where a plane PL of the same power supply group is selected in the interrupt process, the semiconductor memory device 10 executes an interrupt process without suspending, upon receiving a read command. In this case, the semiconductor memory device 10 can transmit the read data of the interrupt process to the memory controller earliest.

When a plane PL of the same power supply group is selected in an interrupt process, upon receiving a read command, the semiconductor memory device 10 suspends the interrupt process for a predetermined period of time and then executes the interrupt process. In this case, the semiconductor memory device 10 can suppress the influence of the power supply noise of the same power supply group generated by an erase operation that is being executed in the foreground in a read operation executed as the interrupt process.

When a plane PL of the different power supply group is selected in an interrupt process, it is conceivable that the influence of the power supply noise generated by the erase operation will be small. Therefore, the semiconductor memory device 10 is capable of constantly maintaining favorable latency by executing an interrupt process without suspension in response to reception of a read command.

When a same-pair plane is selected in an interrupt process, the semiconductor memory device 10 suspends the erase operation at a predetermined timing in order to execute the interrupt process upon receiving a read command. When it is desired to prioritize the latency, the semiconductor memory device 10 suspends the erase operation and executes an interrupt process immediately after receiving the read command. On the other hand, when it is desired to ensure the progress of the erase operation as well as the latency, the semiconductor memory device 10 suspends the read process for a predetermined period of time upon receiving the read command, thereby suppressing rewinding of the erase operation.

As described above, the semiconductor memory device 10 according to the first embodiment can execute an interrupt process without using the suspend command "FFh" by progressing with an erase operation in the ready state. The semiconductor memory device 10 according to the first embodiment is capable of executing a read operation as an interrupt process without stopping the erase operation wherever possible, and suppressing the influence on the erase operation even when the erase operation is suspended.

As a result, the semiconductor memory device 10 according to the first embodiment is capable of outputting read data to the memory controller earlier than the read operation executed as an interrupt process in the comparative example. That is, the semiconductor memory device 10 according to the first embodiment is capable of improving the latency compared to a read operation executed as an interrupt process in the comparative example.

The interrupt process described in the first embodiment may be executed continuously. In this case, the memory controller instructs the semiconductor memory device 10 to continuously execute a read operation without issuing a command "48h" after receiving read data in the interrupt process. When a series of interrupt processes ends, the memory controller transmits a command "48h" to the semiconductor memory device 10 to resume the erase operation.

The plane PL selected in the continuous interrupt process is not subject to restrictions imposed by the power supply group (e.g., the same power supply group, the different power supply group, or the same-pair planes). When a same-pair plane is selected in a continuous interrupt process, an erase operation of the semiconductor memory device 10 is suspended until a command "48h" is issued after the interrupt process is executed. When an interrupt process in which the same power supply group is selected and an interrupt process in which a same-pair plane is selected are continuously executed, the former process is executed without suspension; however, when a command instructing the latter process is received, an erase operation is suspended at a predetermined timing. Even in such a case, the suspended erase operation can be resumed by transmitting a command "48h" to the semiconductor memory device 10.

[2] Second Embodiment

The configuration of the semiconductor memory device according to the second embodiment is similar to that of the semiconductor memory device 10 according to the first embodiment. The semiconductor memory device 10 according to the second embodiment differs from the first embodiment in terms of the operation in the erase period of the erase operation. Hereinafter, the semiconductor memory device 10 according to the second embodiment will be described, with respect to matters different from the first embodiment.

[2-1] Erase Operation

Figure 35:
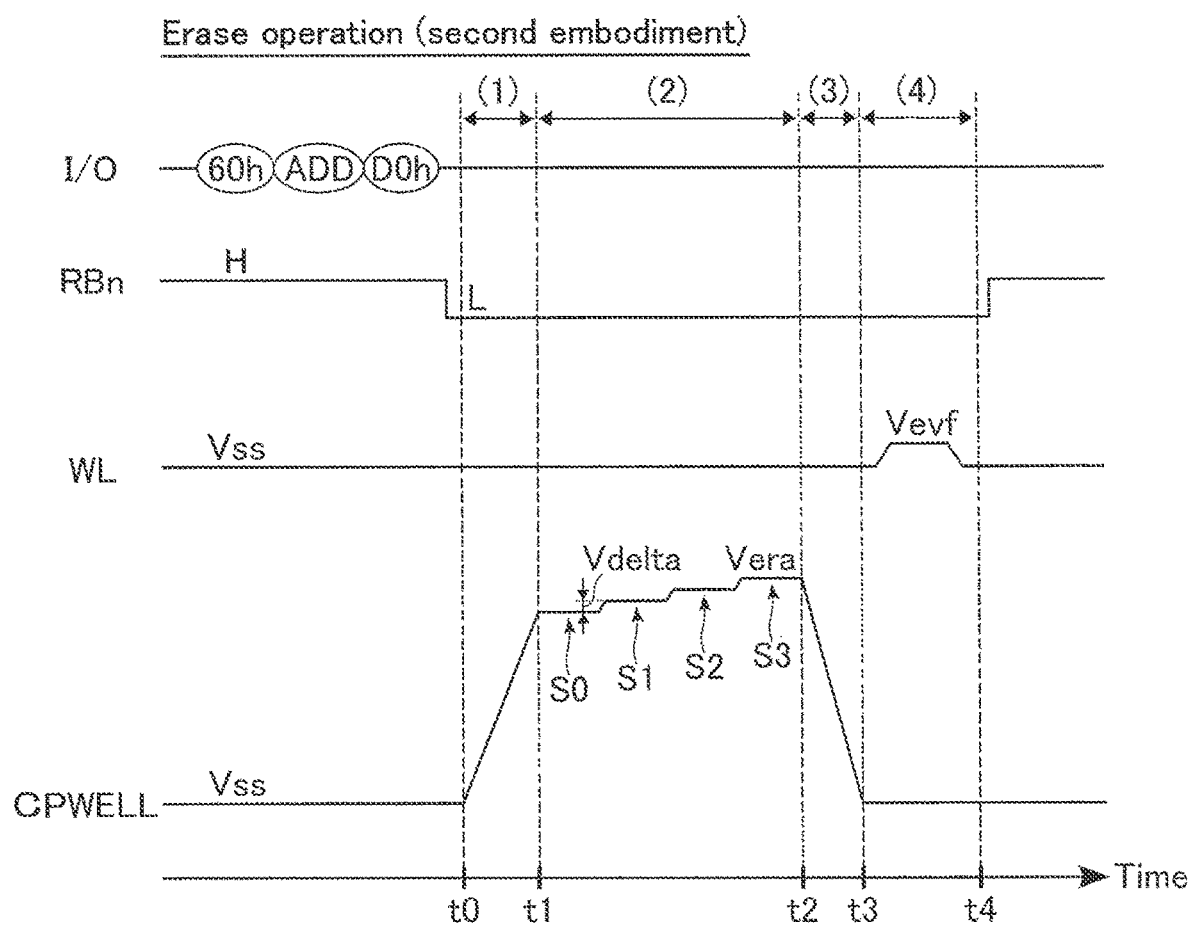
FIG. 35 is a command sequence and a timing chart illustrating an example of an erase operation in a semiconductor memory device according to a second embodiment.

FIG. 35 is a timing chart showing an example of an erase operation in the semiconductor memory device 10 according to the second embodiment. As shown in FIG. 35, the erase operation in the second embodiment is different from the erase operation described with reference to FIG. 12 in the first embodiment in terms of the operation in the erase period.

Specifically, in the erase period, the voltage generation circuit steps up the voltage of the well line CPWELL multiple times to raise it to Vera. In FIG. 35, the amount of step-up of the voltage of the well line CPWELL is indicated as Vdelta, and changes in the voltage of the well line CPWELL in the erase period are indicated as steps S0 to S3.

The voltage of the well line CPWELL at the start time (time t1) of the erase period may be set to a given voltage. The number of step-ups of the voltage of the well line CPWELL in the erase period can be set to a given number of times, and the amount of step-up may be set to a given voltage. The voltage applied to the well line CPWELL during the step-up in the erase period may be referred to as an "erase voltage".

When the command "D0h" is replaced with the command "D3h", the semiconductor memory device 10 according to the second embodiment is capable of executing an erase operation similar to that in FIG. 35 as a cache erase operation. The operations of the erase operation in the second embodiment other than those described above are similar to those of the erase operation in the first embodiment, and thus the description thereof is omitted.

[2-2] Interrupt Process During Erase Operation

The above-described erase operation of the second embodiment is applicable to an erase operation that is executed in the foreground as an interrupt process described in the first embodiment. For the execution timing of the interrupt process executed in this case, any of the execution timings of the interrupt process described in the first embodiment are applicable. When the erase operation in the second embodiment is used, an operation different from that in the first embodiment may be executed as the background read in which a plane PL of the same power supply group is selected.

FIG. 36 illustrates an example of an execution timing of a background read in which a plane PL of the same power supply group is selected in the semiconductor memory device according to the second embodiment, and corresponds to an operation when the semiconductor memory device 10 has received a read command during an erase period of an erase operation.

In the example shown in FIG. 36, upon receiving a read command (for example, "30h") during an erase period ((2) in FIG. 20), the semiconductor memory device 10 immediately starts a background read. During the period in which the background read is being executed, the semiconductor memory device 10 stops stepping up the voltage of the well line CPWELL. That is, the voltage of the well line CPWELL is maintained during the period in which a background read is being executed. When the background read ends, the semiconductor memory device 10 resumes the process of the erase period, and resumes stepping up the voltage of the well line CPWELL.

Specifically, when a read command is received at step S2 of the erase period, the semiconductor memory device 10 immediately starts a background read. While the background read is being executed, the voltage of the well line CPWELL is maintained at the voltage at step S2. When the background read ends, the step-up of the voltage of the well line CPWELL is resumed. The other operations are similar to, for example, those described with reference to FIG. 20, and thus the description thereof will be omitted.

[2-3] Advantageous Effects of Second Embodiment

As described above, the semiconductor memory device 10 according to the second embodiment is capable of executing an interrupt process during an erase operation similarly to the first embodiment, using an erase operation different from that of the first embodiment. Therefore, the semiconductor memory device 10 according to the second embodiment is capable of obtaining the same effects as those of the first embodiment, thus improving the latency.

The erase operation described in the first embodiment and the erase operation described in the second embodiment may be selectively used according to the semiconductor memory device 10. These erase operations may be selectively used according to the block BLK selected in the erase operation, or may be selected according to other circumstances. These erase operations may be selectively used according to a command issued by the memory controller, or may be selectively used by the semiconductor memory device 10 based on a predetermined condition.

[3] Third Embodiment

The configuration of the semiconductor memory device according to the third embodiment is similar to that of the semiconductor memory device 10 according to the first embodiment. The semiconductor memory device 10 according to the third embodiment uses a special command to selectively use different timings for executing an interrupt process in which a same-pair plane is selected in the first embodiment. Hereinafter, the semiconductor memory device 10 according to the third embodiment will be described, with respect to the matters different from those of the first and second embodiments.

[3-1] Interrupt Process During Erase Operation

Figure 37:
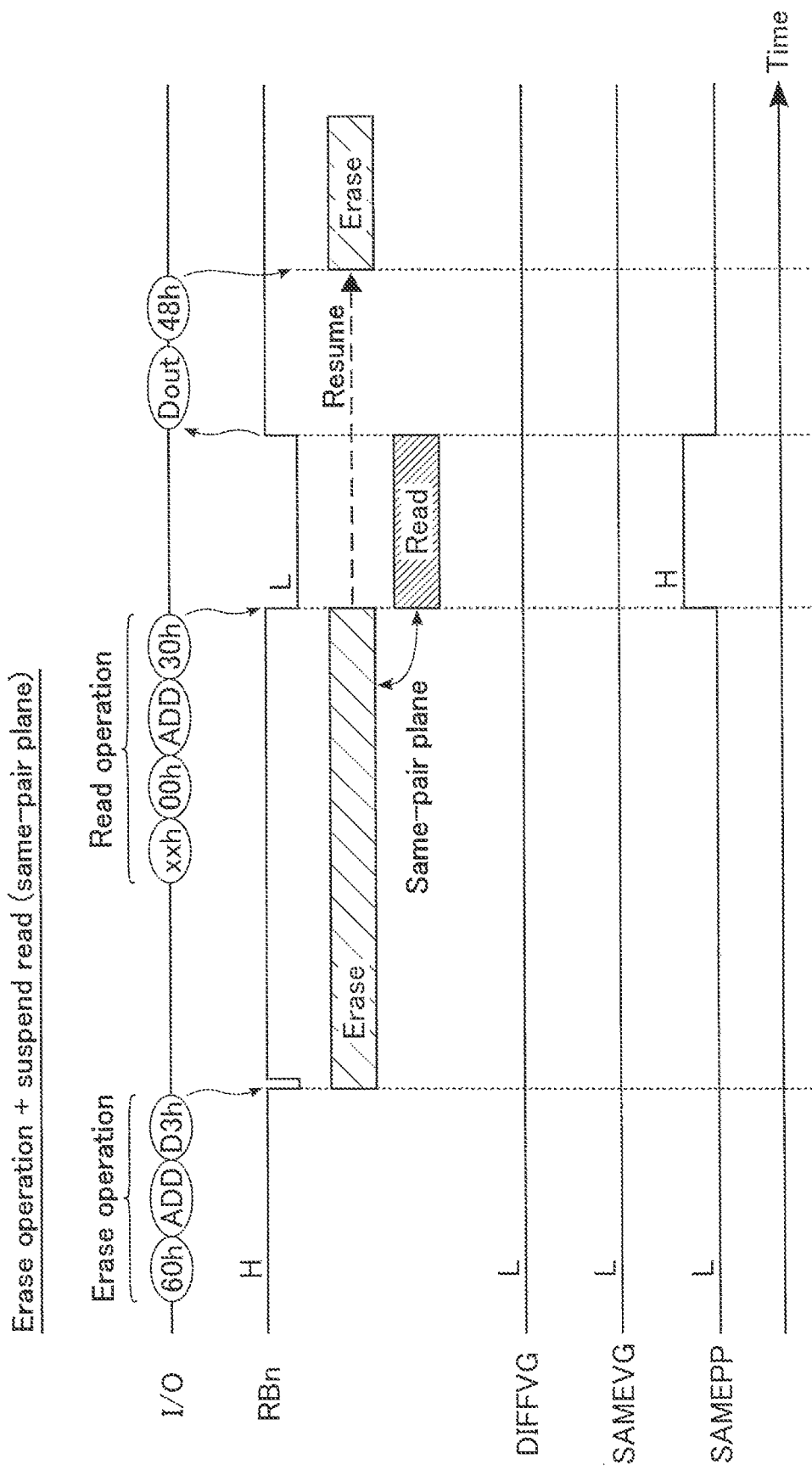
FIG. 37 is a command sequence and a timing chart for illustrating an erase operation and a suspend read in which a same-pair plane is selected in a semiconductor memory device according to a third embodiment.

Each of FIGS. 37 and 38 shows an example of a command sequence and a timing chart of a cache erase operation and an interrupt process in which a same-pair plane is selected in the semiconductor memory device 10 according to the third embodiment. As shown in FIGS. 37 and 38, the operation in the third embodiment differs from the operation described with reference to FIG. 27 in the first embodiment in terms of the command sequence and the timing at which an erase operation is resumed after an interrupt process (suspend read).

In the example shown in FIG. 37, the memory controller sequentially transmits a command "xxh", a command "ooh", address information "ADD", and a command "30h" to the semiconductor memory device 10 in response to a read operation of an interrupt process. The command "xxh" is a command for instructing the semiconductor memory device 10 to execute an interrupt process under a first condition. Upon receiving the command "30h", the semiconductor memory device 10 suspends the erase operation at the timing described in the first embodiment and starts a read operation as an interrupt process. The subsequent operations in FIG. 37 are similar to those described with reference to FIG. 27.

On the other hand, in the example shown in FIG. 38, the memory controller sequentially transmits a command "yyh", a command "ooh", address information "ADD", and a command "30h" to the semiconductor memory device 10 in response to a read operation of an interrupt process. The command "yyh" is a command for instructing the semiconductor memory device 10 to execute an interrupt process under a second condition different from the first condition. Upon receiving the command "30h", the semiconductor memory device 10 completes the erase operation, and then executes an interrupt process (suspend read). At this time, the semiconductor memory device 10 is maintained in the busy state, continuing from the erase operation, and when the suspend read ends, the semiconductor memory device 10 transitions from the busy state to the ready state.

[3-2] Advantageous Effects of Third Embodiment

As described above, the semiconductor memory device 10 according to the third embodiment is capable of changing the timing of outputting read data in an interrupt process by selectively using different commands. For example, the memory controller uses a command sequence under a first condition when it is desired to obtain data immediately, and uses a command sequence under a second condition when there is plenty of time to obtain required data.

That is, the semiconductor memory device 10 according to the third embodiment is capable of executing an interrupt process with different latencies by selectively using different commands. As a result, the semiconductor memory device 10 according to the third embodiment is capable of suppressing degradation in performance of the erase operation caused by the interrupt process as necessary.

[4] Modifications, etc.

The semiconductor memory device <e.g., FIGS. 1 and 10> of the embodiment includes a plurality of planes <e.g., FIG. 2, PL> and a sequencer <e.g., FIGS. 1 and 14>. Each of the planes includes a plurality of blocks each of which is a set of memory cells. The sequencer executes a first operation and a second operation that is shorter than the first operation. Upon receiving a first command set that instructs execution of the first operation, the sequencer executes the first operation. Upon receiving a second command set that instructs execution of the second operation while executing the first operation, the sequencer suspends the first operation and executes the second operation <e.g., FIGS. 16 and 26> or executes the second operation in parallel with the first operation <e.g., FIG. 27>, based on an address of a block that is a target of the first operation and an address of a block that is a target of the second operation. It is thereby possible to improve the latency of the semiconductor memory device.

Figure 39:
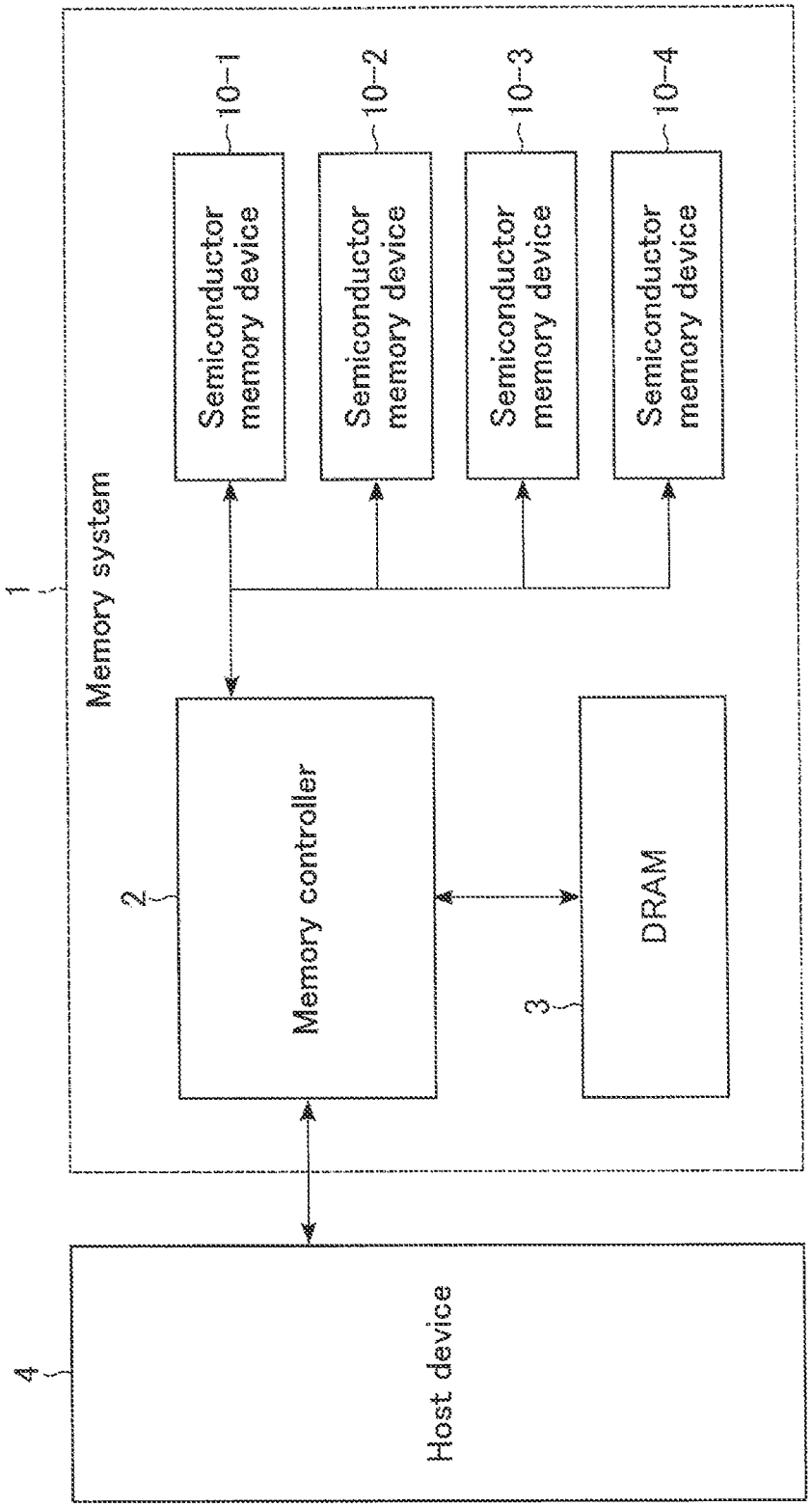
FIG. 39 is a block diagram showing an example of a configuration of a memory system including the semiconductor memory device according to the first embodiment.

The semiconductor memory device 10 described in the above embodiment may be used as, for example, a memory system combined with a memory controller. FIG. 39 is a block diagram showing an example of a configuration of a memory system 1 including the semiconductor memory device according to the first embodiment. As shown in FIG. 39, the memory system 1 includes, for example, semiconductor memory devices 10-1 to 10-4, a memory controller 2, and a dynamic random access memory (DRAM) 3.

Each of the semiconductor memory devices 10-1 to 10-4 has a configuration similar to that of the semiconductor memory device 10. The memory controller 2 is coupled to each of the semiconductor memory devices 10-1 to 10-4, and is capable of operating in a similar manner to the external memory controller used in the description of the operation of the above embodiment. The memory controller 2 operates based on an instruction from an external host device 4. The DRAM 3 is coupled to the memory controller 2 and is used as, for example, an external storage area of the memory controller 2. The number of semiconductor memory devices 10 included in the memory system 1 may be freely designed. The DRAMS may be built in the memory controller 2. The operation described in the above embodiment can be executed by the memory system 1.

In the above embodiment, the case where the semiconductor memory device 10 executes a read operation as an interrupt process while executing the erase operation has been exemplified; however, the configuration is not limited thereto. For example, the semiconductor memory device 10 may execute an interrupt process while executing a write operation or a read operation, as described in the above embodiment. In addition, an operation executed in an interrupt process is not limited to the read operation, and an erase operation or a write operation may be executed. In this case, the addresses EPG and EPP input to the determination circuit DC correspond to address information in the foreground operation, and the addresses RPG and RPP input to the determination circuit DC correspond to address information in the operation executed as the interrupt process.

In the above embodiment, a case has been described where an erase operation is resumed using a command "48h" when an interrupt process is executed while the semiconductor memory device 10 is executing an erase operation; however, the configuration is not limited thereto. For example, the semiconductor memory device 10 may spontaneously resume an erase operation after outputting read data obtained by a read operation of an interrupt process to the memory controller. In other words, the semiconductor memory device 10 may be configured to resume an erase operation without depending on an instruction from the memory controller.

In the above embodiment, a case has been described where a plane group PG includes plane pairs PP; however, the plane group PG need not include plane pairs PP. In this case, the plane group PG is configured of a plurality of independent planes PL. Even in such a case, the semiconductor memory device 10 may execute the operation described in the above embodiment, and obtain the same effect as the above embodiment.

The operation timing in the interrupt process described in the above embodiment can be selected by a user. The semiconductor memory device 10 may store parameters relating to such operation timing, and the operation timing may be changed based on the parameters. The operation timing in the interrupt process may be automatically switched in the semiconductor memory device 10 according to the relationship between the address corresponding to an operation in the foreground and the address corresponding to an operation executed as an interrupt process, the combination of an operation in the foreground and an operation executed as an interrupt process, or the like.

In the above embodiment, a case has been described where a single memory cell transistor MT stores 2-bit data; however, a single memory cell transistor MT may store 1-bit data, or may store 3 or more bits of data. The allocation of data to the distributions of the threshold voltages of the memory cell transistors MT may be freely set. Even in such a case, the semiconductor memory device 10 is capable of executing the operation of the above-described embodiment, and obtaining similar effects.

In the above embodiment, each of the commands "xxh" and "yyh" used in the description can be replaced with a given command. In addition, commands other than these can be replaced with other commands as appropriate. In addition, although the case where the command relating to the read operation starts with the command "00h" has been described as an example, a command for designating a bit of a page to be read may be added before the command "ooh".

The memory cell array 20 in the above-described embodiment may have a configuration different from the above-described one. The other configurations of the memory cell array 20 are described in, for example, U.S. patent application Ser. No. 12/407,403 filed on Mar. 19, 2009, entitled "THREE DIMENSIONAL STACKED NONVOLATILE SEMICONDUCTOR MEMORY", U.S. patent application Ser. No. 12/406,524 filed on Mar. 18, 2009, entitled "THREE DIMENSIONAL STACKED NONVOLATILE SEMICONDUCTOR MEMORY", U.S. patent application Ser. No. 12/679,991 filed on Mar. 25, 2010, entitled "NONVOLATILE SEMICONDUCTOR STORAGE DEVICE AND METHOD OF MANUFACTURING THE SAME", and U.S. patent application Ser. No. 12/532,030 filed on Mar. 23, 2009, entitled "SEMICONDUCTOR MEMORY AND METHOD FOR MANUFACTURING SAME". The entire contents of these patent applications are incorporated herein by reference.

In the above embodiments, a case where the memory cell transistors MT provided in the memory cell array 20 are three-dimensionally stacked has been described as an example; however, the configuration is not limited thereto. The configuration of the memory cell array 20 may be, for example, a planar NAND flash memory in which memory cell transistors MT are two-dimensionally arranged. Even in such a case, the above embodiments can be realized, and the same effect can be obtained.

In the above embodiments, the unit of erasure need not be the block BLK. The other erase operations are described in U.S. patent application Ser. No. 13/235,389 filed on Sep. 18, 2011, entitled "NONVOLATILE SEMICONDUCTOR MEMORY DEVICE", and U.S. patent application Ser. No. 12/694,690 filed on Jan. 27, 2010, entitled "NON-VOLATILE SEMICONDUCTOR STORAGE DEVICE". The entire contents of these patent applications are incorporated herein by reference.

Herein, a "command set" refers to a group of commands and address information corresponding to a certain operation. Upon receiving a command set from the memory controller, the semiconductor memory device 10 starts an operation based on the command set.

Herein, the term "connection" indicates electrical connection and does not exclude, for example, the interposition of another element. Herein, an "off state" means that a voltage lower than the threshold voltage of a corresponding transistor is applied to a gate of the corresponding transistor, and does not exclude, for example, the flow of a minute current such as a leakage current of the transistor.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A semiconductor memory device comprising:
a first plane including a plurality of first blocks, each of the first blocks including a first memory cell:
a second plane including a plurality of second blocks, each of the second blocks including a second memory cell;
a voltage generator which includes a first driver configured to supply power to the first plane and a second driver configured to supply power to the second plane;
an input/output circuit configured to receive a command set from an external memory controller; and a sequencer configured to execute an operation in response to the command set, wherein:

upon receiving a first command set that instructs execution of a first operation to the first memory cell of one of the first blocks, the sequencer executes the first operation, the first operation causing a change of a threshold voltage of the first memory cell of the one of the first blocks, upon receiving a second command set that instructs execution of a second operation to the second memory cell of one of the second blocks during execution of the first operation, the sequencer executes the second operation in parallel with the first operation, and upon receiving a third command set that instructs execution of a third operation to the first memory cell of another one of the first blocks during execution of the first operation, the sequencer suspends the first operation, executes the third operation, and resumes the first operation upon completion of the third operation.

2. The semiconductor memory device of claim 1, wherein:

the second operation does not cause a change of a threshold voltage of the second memory cell of the one of the second blocks, and the third operation does not cause a change of a threshold voltage of the first memory cell of the another one of the first blocks.

3. The semiconductor memory device of claim 1, wherein:

in each of the first blocks, a plurality of the first memory cells are connected in series to form a first NAND string, in each of the second blocks, a plurality of the second memory cells are connected in series to form a second NAND string, the first operation causes a change of the threshold voltages of the first memory cells belonging to the first NAND string of the one of the first blocks, the second operation accesses one of the second memory cells belonging to the second NAND string of the one of the second blocks, and the third operation accesses one of the first memory cells belonging to the first NAND string of the another one of the first blocks.

4. The semiconductor memory device of claim 3, wherein:

the first operation is an erase operation, and each of the second operation and the third operation is a read operation.

5. The semiconductor memory device of claim 4, wherein a timing at which the sequencer executes the second operation upon receiving the second command set during the execution of the first operation changes based on a timing at which the second command set is received.

6. The semiconductor memory device of claim 4, wherein the first operation is resumed regardless of an instruction from the external memory controller after data read by the second operation has been output.

7. The semiconductor memory device of claim 4, wherein the first operation is resumed based on an external command that has been received after data read by the second operation has been output.

8. The semiconductor memory device of claim 3, further comprising:

a first bit line connected to first ends of the first NAND strings of the first blocks; and a second bit line connected to first ends of the second NAND strings of the second blocks.

9. The semiconductor memory device of claim 8, further comprising:

a first source line connected to second ends of the first NAND strings of the first blocks; and a second source line connected to second ends of the second NAND strings of the second blocks.

10. The semiconductor memory device of claim 1, further comprising:

a third plane including a plurality of third blocks, each of the third blocks including a third memory cell; and a fourth plane including a plurality of fourth blocks, each of the fourth blocks including a fourth memory cell, wherein:

the first driver is configured to supply power to the first plane and the third plane, and the second driver is configured to supply power to the second plane and the fourth plane.

11. The semiconductor memory device of claim 10, wherein:

in each of the first blocks, a plurality of the first memory cells are connected in series to form a first NAND string, in each of the second blocks, a plurality of the second memory cells are connected in series to form a second NAND string, in each of the third blocks, a plurality of the third memory cells are connected in series to form a third NAND string, and in each of the fourth blocks, a plurality of the fourth memory cells are connected in series to form a fourth NAND string.

12. The semiconductor memory device of claim 11, further comprising:

a first bit line connected to first ends of the first NAND strings of the first blocks;

a second bit line connected to first ends of the second NAND strings of the second blocks;

a third bit line connected to first ends of the third NAND strings of the third blocks;

a fourth bit line connected to first ends of the fourth NAND strings of the fourth blocks;

a first source line connected to second ends of the first NAND strings of the first blocks;

a second source line connected to second ends of the second NAND strings of the second blocks;

a third source line connected to second ends of the third NAND strings of the third blocks; and a fourth source line connected to the second ends of the fourth NAND strings of the fourth blocks.

13. The semiconductor memory device of claim 12, wherein:

during the first operation, the first driver applies an erase voltage to the first source line, and upon receiving the second command set during the execution of the first operation, the sequencer executes the second operation in parallel with the first operation without discharging the first source line.

14. The semiconductor memory device of claim 13, wherein upon receiving the third command set during the execution of the first operation, the sequencer suspends the first operation while discharging the first source line, executes the third operation, and resumes the first operation upon completion of the third operation.

15. The semiconductor memory device of claim 14, wherein:
- during the first operation, the first driver applies an erase voltage to the first source line, and
- upon receiving a fourth command set that instructs execution of a fourth operation to one of the third memory cells of the third NAND string of one of the third blocks during execution of the first operation, the sequencer suspends the first operation without discharging the first source line, executes the fourth operation, and resumes the first operation upon completion of the third operation.

* * * * *